(12) United States Patent
Feng et al.

(10) Patent No.: US 12,386,101 B2
(45) Date of Patent: Aug. 12, 2025

(54) TEXTURED REGION OF A SUBSTRATE TO REDUCE SPECULAR REFLECTANCE INCORPORATING SURFACE FEATURES WITH AN ELLIPTICAL PERIMETER OR SEGMENTS THEREOF, AND METHOD OF MAKING THE SAME

(71) Applicant: Corning Incorporated, Corning, NY (US)

(72) Inventors: Jiangwei Feng, Painted Post, NY (US); Corinne Elizabeth Isaac, Horseheads, NY (US); Karl William Koch, III, Elmira, NY (US); Shenping Li, Painted Post, NY (US); Wageesha Senaratne, Horseheads, NY (US); William Allen Wood, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 910 days.

(21) Appl. No.: 17/369,315

(22) Filed: Jul. 7, 2021

(65) Prior Publication Data

US 2022/0011478 A1    Jan. 13, 2022

Related U.S. Application Data

(60) Provisional application No. 63/049,843, filed on Jul. 9, 2020.

(51) Int. Cl.
*G02B 5/02* (2006.01)
*C03C 15/00* (2006.01)
(Continued)

(52) U.S. Cl.
CPC ............... *G02B 1/11* (2013.01); *C03C 15/00* (2013.01); *C23C 14/021* (2013.01);
(Continued)

(58) Field of Classification Search
CPC .. G02B 1/11; G02B 1/118; G02B 1/14; G02B 5/0221; G02B 5/0268;
(Continued)

(56) References Cited

U.S. PATENT DOCUMENTS 3,067,021 A    12/1962  Pelley et al.
3,150,032 A     9/1964  Rubenstein
(Continued)

FOREIGN PATENT DOCUMENTS

AU         199540318          8/1996
AU      2015252116 A1       11/2015
(Continued)

OTHER PUBLICATIONS

International Search Report and Written Opinion of the International Searching Authority; PCT/US2021/040773; dated Oct. 26, 2021; 14 pages; European Patent Office.
(Continued)

*Primary Examiner* — Wyatt A Stoffa
*Assistant Examiner* — John Curtis Sipes

(57) ABSTRACT

A substrate for a display article includes: a primary surface; a textured region on at least a portion of the primary surface, the textured region comprising surface features that reflect a random distribution, each of the surface features comprising a perimeter that is parallel to a base-plane extending through a thickness of the substrate below the textured region, wherein the perimeter is elliptical. The textured region can further include (i) one or more higher surfaces residing at a higher mean elevation from the base-plane and (ii) one or more lower surfaces residing at a lower mean elevation from the base-plane that is closer to the base-plane than the higher mean elevation. The higher mean elevation can differ from the lower mean elevation by a distance within a range of 0.05 μm to 0.70 μm.

31 Claims, 32 Drawing Sheets

(51) Int. Cl.
*C23C 14/02* (2006.01)
*C23C 14/04* (2006.01)
*C23C 16/02* (2006.01)
*C23C 16/04* (2006.01)
*G02B 1/11* (2015.01)
*G02B 1/118* (2015.01)
*G02B 1/14* (2015.01)
*G02B 27/42* (2006.01)

(52) U.S. Cl.
CPC ........ *C23C 14/042* (2013.01); *C23C 16/0227* (2013.01); *C23C 16/042* (2013.01); *G02B 1/118* (2013.01); *G02B 1/14* (2015.01); *G02B 5/0221* (2013.01); *G02B 5/0268* (2013.01); *G02B 27/4205* (2013.01); *G02B 27/4272* (2013.01); *G02B 2207/101* (2013.01)

(58) Field of Classification Search
CPC ............ G02B 27/4205; G02B 27/4272; G02B 2207/101; C03C 15/00; C03C 17/3435; C03C 3/076; C03C 3/083; C03C 2204/08; C03C 2218/34; C03C 21/002; C23C 14/021; C23C 14/042; C23C 16/0227; C23C 16/042
See application file for complete search history.

(56) References Cited

U.S. PATENT DOCUMENTS

| | | |
|---|---|---|
| 3,413,058 A | 11/1968 | Fang et al. |
| 4,579,765 A | 4/1986 | Schachtner |
| 4,687,707 A | 8/1987 | Matsuo et al. |
| 4,797,316 A | 1/1989 | Hecq et al. |
| 4,946,923 A | 8/1990 | Nagata et al. |
| 5,470,606 A | 11/1995 | De Boer |
| 5,618,619 A | 4/1997 | Petrmichl et al. |
| 5,681,636 A * | 10/1997 | Marshall ............ G11B 5/73919 |
| 5,737,472 A | 4/1998 | Bernasson et al. |
| 5,855,717 A * | 1/1999 | Beer ........................ B44F 1/00 264/293 |
| 6,046,855 A | 4/2000 | Goto |
| 6,208,389 B1 | 3/2001 | Aben et al. |
| 6,219,121 B1 | 4/2001 | Sahouani et al. |
| RE37,183 E | 5/2001 | Kawamura et al. |
| 6,254,913 B1 | 7/2001 | Wadsworth et al. |
| 6,286,965 B1 | 9/2001 | Caskey et al. |
| 6,340,404 B1 | 1/2002 | Oka et al. |
| 6,521,677 B2 | 2/2003 | Yashiro et al. |
| 6,723,423 B1 | 4/2004 | Kaneko et al. |
| 6,824,709 B2 | 11/2004 | Shundo |
| 6,846,599 B2 | 1/2005 | Ide |
| 6,862,139 B2 | 3/2005 | Chang et al. |
| 7,037,573 B2 | 5/2006 | Miyatake et al. |
| 7,122,253 B2 | 10/2006 | Yamaguchi et al. |
| 7,128,428 B2 | 10/2006 | Takahashi et al. |
| 7,149,032 B2 | 12/2006 | Ohishi et al. |
| 7,171,676 B2 | 1/2007 | Takeda et al. |
| 7,253,861 B2 | 8/2007 | Niiyama et al. |
| 7,264,866 B2 | 9/2007 | Hashimoto et al. |
| 7,332,213 B2 | 2/2008 | Mimura et al. |
| 7,371,439 B2 | 5/2008 | Matsunaga et al. |
| 7,371,786 B2 | 5/2008 | Yoshihara et al. |
| 7,390,099 B2 | 6/2008 | Takao et al. |
| 7,410,686 B2 | 8/2008 | Osada et al. |
| 7,542,207 B2 | 6/2009 | Matsunaga |
| 7,604,358 B2 | 10/2009 | Ninomiya et al. |
| 7,629,400 B2 | 12/2009 | Hyman |
| 7,645,502 B2 | 1/2010 | Mikami et al. |
| 7,737,633 B2 | 6/2010 | Zheng |
| 7,796,123 B1 | 9/2010 | Irvin et al. |
| 7,799,732 B2 | 9/2010 | Tanaka et al. |
| 7,903,340 B2 | 3/2011 | Nagahama et al. |
| 7,973,892 B2 | 7/2011 | Lim |
| 8,026,021 B2 | 9/2011 | Stumpe et al. |
| 8,062,731 B2 | 11/2011 | Takada et al. |
| 8,110,278 B2 | 2/2012 | Hsu et al. |
| 8,124,215 B2 | 2/2012 | Takao et al. |
| 8,304,055 B2 | 11/2012 | Haga et al. |
| 8,312,739 B2 | 11/2012 | Lee et al. |
| 8,325,418 B2 | 12/2012 | Nagahama et al. |
| 8,514,351 B2 | 8/2013 | Sasaki et al. |
| 8,561,429 B2 | 10/2013 | Allan et al. |
| 8,628,896 B2 | 1/2014 | Ikeda et al. |
| 8,845,172 B2 | 9/2014 | Jang et al. |
| 8,854,623 B2 | 10/2014 | Fontaine et al. |
| 8,888,965 B2 | 11/2014 | Kuppuswamy et al. |
| 9,023,457 B2 | 5/2015 | Carrilero et al. |
| 9,051,404 B2 | 6/2015 | Jiang et al. |
| 9,051,423 B2 | 6/2015 | Qiu |
| 9,079,802 B2 | 7/2015 | Bellman et al. |
| 9,102,131 B2 | 8/2015 | Derks et al. |
| 9,158,044 B2 | 10/2015 | Akiyama et al. |
| 9,263,202 B2 | 2/2016 | Lee et al. |
| 9,316,885 B2 | 4/2016 | Lo et al. |
| 9,335,444 B2 | 5/2016 | Hart et al. |
| 9,359,261 B2 | 6/2016 | Bellman et al. |
| 9,366,784 B2 | 6/2016 | Bellman et al. |
| 9,400,420 B2 | 7/2016 | Pudleiner et al. |
| 9,411,180 B2 | 8/2016 | Gollier et al. |
| 9,418,193 B2 | 8/2016 | Dowski et al. |
| 9,535,280 B2 | 1/2017 | Borrelli et al. |
| 9,550,161 B2 | 1/2017 | Arfsten et al. |
| 9,573,842 B2 | 2/2017 | Gollier et al. |
| 9,581,731 B2 | 2/2017 | Bookbinder et al. |
| 9,588,263 B2 | 3/2017 | Gollier et al. |
| 9,651,720 B2 | 5/2017 | Lander et al. |
| 9,701,248 B2 | 7/2017 | Neuman et al. |
| 9,701,579 B2 | 7/2017 | Gollier et al. |
| 9,703,011 B2 | 7/2017 | Adib et al. |
| 9,718,249 B2 | 8/2017 | Kwong |
| 9,726,786 B2 | 8/2017 | Hart et al. |
| 9,766,376 B2 | 9/2017 | Ho et al. |
| 9,786,194 B2 | 10/2017 | Hyman |
| 9,823,209 B2 | 11/2017 | Yu et al. |
| 9,880,328 B2 | 1/2018 | Gollier et al. |
| 9,896,596 B2 | 2/2018 | Jung et al. |
| 9,939,557 B2 | 4/2018 | David et al. |
| 9,964,773 B2 | 5/2018 | Wang |
| 9,987,820 B2 | 6/2018 | Mehlmann et al. |
| 10,183,889 B2 | 1/2019 | Gollier et al. |
| 10,613,340 B2 | 4/2020 | Borrelli et al. |
| 10,698,151 B2 | 6/2020 | Hamilton et al. |
| 10,725,230 B1 * | 7/2020 | Jalava .................. G02B 6/0068 |
| 10,899,661 B2 | 1/2021 | Gollier et al. |
| 10,921,492 B2 | 2/2021 | Gregorski et al. |
| 10,948,629 B2 | 3/2021 | Hart et al. |
| 2002/0085284 A1 | 7/2002 | Nakamura et al. |
| 2002/0090507 A1 | 7/2002 | Barth et al. |
| 2002/0167629 A1 | 11/2002 | Blanchard |
| 2003/0234460 A1 | 12/2003 | Hayashi et al. |
| 2004/0005482 A1 | 1/2004 | Kobayashi et al. |
| 2004/0184765 A1 | 9/2004 | Difrancesco et al. |
| 2004/0188874 A1 | 9/2004 | Hikita et al. |
| 2004/0195960 A1 | 10/2004 | Czeremuszkin et al. |
| 2004/0233174 A1 | 11/2004 | Robrecht et al. |
| 2005/0007019 A1 | 1/2005 | Kim et al. |
| 2005/0074591 A1 | 4/2005 | Zagdoun |
| 2005/0287309 A1 | 12/2005 | Veerasamy |
| 2006/0152801 A1 | 7/2006 | Matsunaga |
| 2006/0153979 A1 | 7/2006 | Asakura et al. |
| 2006/0240266 A1 | 10/2006 | Schicht et al. |
| 2006/0274047 A1 | 12/2006 | Spath et al. |
| 2006/0274048 A1 | 12/2006 | Spath et al. |
| 2006/0286465 A1 | 12/2006 | Kim |
| 2007/0014981 A1 | 1/2007 | Chiang et al. |
| 2007/0141357 A1 | 6/2007 | Bekiarian et al. |
| 2007/0152985 A1 | 7/2007 | Ostergaard et al. |
| 2007/0166536 A1 | 7/2007 | Dollase et al. |
| 2007/0240804 A1 | 10/2007 | Arai et al. |
| 2007/0249789 A1 | 10/2007 | Buehler et al. |
| 2007/0266896 A1 | 11/2007 | Suwa et al. |
| 2008/0138606 A1 | 6/2008 | Yoshihara et al. |

(56) References Cited

U.S. PATENT DOCUMENTS

| | | |
|---|---|---|
| 2008/0191463 A1 | 8/2008 | Vermeulen et al. |
| 2009/0004462 A1 | 1/2009 | Zhang et al. |
| 2009/0017314 A1 | 1/2009 | Nadaud et al. |
| 2009/0051668 A1 | 2/2009 | Cheng |
| 2009/0104385 A1 | 4/2009 | Reymond et al. |
| 2009/0135492 A1 | 5/2009 | Kusuda et al. |
| 2009/0178704 A1 | 7/2009 | Kalejs et al. |
| 2009/0268299 A1 | 10/2009 | Furui et al. |
| 2010/0009154 A1 | 1/2010 | Allan et al. |
| 2010/0027383 A1 | 2/2010 | Suzuki et al. |
| 2010/0062217 A1 | 3/2010 | Kurematsu |
| 2010/0130348 A1 | 5/2010 | Kang et al. |
| 2010/0149483 A1 | 6/2010 | Chiavetta, III |
| 2010/0167019 A1 | 7/2010 | Ohyanagi et al. |
| 2010/0177398 A1* | 7/2010 | Watanabe ............ G02B 5/0221 216/11 |
| 2010/0182551 A1 | 7/2010 | Tochigi et al. |
| 2010/0195311 A1 | 8/2010 | Furui et al. |
| 2010/0196650 A1 | 8/2010 | Okawa et al. |
| 2010/0196685 A1 | 8/2010 | Murata et al. |
| 2010/0238384 A1 | 9/2010 | Tochigi et al. |
| 2010/0258752 A1 | 10/2010 | Mochizuki et al. |
| 2010/0272990 A1 | 10/2010 | Bondesan et al. |
| 2010/0316861 A1 | 12/2010 | Kubler et al. |
| 2011/0064943 A1 | 3/2011 | Wang |
| 2011/0100424 A1 | 5/2011 | Roche et al. |
| 2011/0128664 A1 | 6/2011 | Coue et al. |
| 2012/0013983 A1 | 1/2012 | Chang et al. |
| 2012/0070603 A1 | 3/2012 | Hsu |
| 2012/0113043 A1 | 5/2012 | Liu et al. |
| 2012/0250135 A1 | 10/2012 | Yeh et al. |
| 2012/0270041 A1 | 10/2012 | Matsumoto et al. |
| 2012/0291840 A1* | 11/2012 | Kohnke ................ C03C 19/00 428/141 |
| 2012/0300307 A1* | 11/2012 | Borrelli ............... G02B 5/0278 359/609 |
| 2013/0107370 A1* | 5/2013 | Lander ................ C03C 3/087 359/609 |
| 2013/0127202 A1 | 5/2013 | Hart |
| 2013/0183489 A1 | 7/2013 | Cremer et al. |
| 2014/0090864 A1 | 4/2014 | Paulson |
| 2014/0093711 A1 | 4/2014 | Paulson |
| 2014/0106141 A1 | 4/2014 | Bellman et al. |
| 2014/0113083 A1 | 4/2014 | Lee et al. |
| 2014/0131091 A1 | 5/2014 | Smith |
| 2014/0154661 A1 | 6/2014 | Bookbinder et al. |
| 2014/0268349 A1* | 9/2014 | Kalyankar ........... G02B 5/0294 427/164 |
| 2014/0313441 A1 | 10/2014 | Lim |
| 2014/0320422 A1 | 10/2014 | Williams et al. |
| 2014/0376094 A1 | 12/2014 | Bellman et al. |
| 2015/0079368 A1 | 3/2015 | Koike et al. |
| 2015/0111725 A1 | 4/2015 | Van et al. |
| 2015/0160376 A1 | 6/2015 | Kohli et al. |
| 2015/0174625 A1 | 6/2015 | Hart et al. |
| 2015/0177778 A1 | 6/2015 | Chen et al. |
| 2015/0185554 A1 | 7/2015 | Zhao et al. |
| 2015/0192897 A1* | 7/2015 | Schilling ............. B42D 25/355 359/2 |
| 2015/0250237 A1 | 9/2015 | Shoham et al. |
| 2015/0253467 A1 | 9/2015 | Sano |
| 2015/0309628 A1 | 10/2015 | Chen et al. |
| 2015/0316442 A1 | 11/2015 | Tamada et al. |
| 2015/0322270 A1 | 11/2015 | Amin et al. |
| 2015/0323705 A1 | 11/2015 | Hart et al. |
| 2015/0323812 A1 | 11/2015 | Ishak et al. |
| 2015/0355382 A1 | 12/2015 | Henn et al. |
| 2016/0002498 A1 | 1/2016 | Maghsoodi et al. |
| 2016/0016845 A1 | 1/2016 | Cho et al. |
| 2016/0041308 A1 | 2/2016 | Kramer et al. |
| 2016/0083835 A1 | 3/2016 | Adib et al. |
| 2016/0137548 A1 | 5/2016 | Cabral et al. |
| 2016/0137873 A1 | 5/2016 | Kostromine et al. |
| 2016/0146978 A1 | 5/2016 | Lee et al. |
| 2016/0236974 A1 | 8/2016 | Sinapi et al. |
| 2016/0246154 A1 | 8/2016 | O'Keeffe |
| 2016/0306046 A1 | 10/2016 | Axelsson et al. |
| 2016/0362583 A1 | 12/2016 | Naik et al. |
| 2017/0003420 A1 | 1/2017 | Berit-Debat et al. |
| 2017/0015584 A1 | 1/2017 | Krzyzak et al. |
| 2017/0018408 A1* | 1/2017 | Xu ......................... C04B 37/005 |
| 2017/0050349 A1 | 2/2017 | Hara et al. |
| 2017/0129806 A1 | 5/2017 | Fujii et al. |
| 2017/0183255 A1 | 6/2017 | Walther et al. |
| 2017/0199307 A1 | 7/2017 | Hart et al. |
| 2017/0210666 A1 | 7/2017 | Chang et al. |
| 2017/0235418 A1 | 8/2017 | Inamoto et al. |
| 2017/0245962 A1* | 8/2017 | Skamser .............. G02B 5/0221 |
| 2017/0260620 A1 | 9/2017 | Cheah et al. |
| 2017/0276838 A1 | 9/2017 | Oishi et al. |
| 2017/0285227 A1 | 10/2017 | Chen et al. |
| 2017/0307790 A1 | 10/2017 | Bellman et al. |
| 2018/0095303 A1 | 4/2018 | Cho et al. |
| 2018/0128957 A1 | 5/2018 | Davis et al. |
| 2018/0162091 A1 | 6/2018 | Takeda et al. |
| 2018/0203163 A1 | 7/2018 | Thakkar et al. |
| 2018/0251398 A1 | 9/2018 | Ikegami et al. |
| 2018/0352668 A1 | 12/2018 | Amin et al. |
| 2018/0372919 A1 | 12/2018 | Suzuki et al. |
| 2019/0039935 A1 | 2/2019 | Couillard et al. |
| 2019/0039946 A1 | 2/2019 | Bayne et al. |
| 2019/0045038 A1 | 2/2019 | Zhou et al. |
| 2019/0062200 A1 | 2/2019 | He et al. |
| 2019/0219739 A1 | 7/2019 | Gregorski et al. |
| 2020/0057177 A1 | 2/2020 | Hart et al. |
| 2020/0133012 A1* | 4/2020 | Sales .................... G02B 5/0215 |
| 2020/0158917 A1 | 5/2020 | Hart et al. |
| 2020/0158922 A1 | 5/2020 | Hayashi et al. |
| 2020/0377409 A1 | 12/2020 | Jin et al. |
| 2020/0379143 A1 | 12/2020 | Gu et al. |
| 2020/0389991 A1* | 12/2020 | Shannon ............... H04M 1/0264 |
| 2021/0017068 A1 | 1/2021 | Torfs et al. |
| 2021/0181382 A1 | 6/2021 | Gregorski et al. |
| 2022/0011467 A1 | 1/2022 | Feng et al. |

FOREIGN PATENT DOCUMENTS

| | | |
|---|---|---|
| CA | 2629555 A1 | 11/2009 |
| CN | 1312450 A | 9/2001 |
| CN | 1318722 A | 10/2001 |
| CN | 1653880 A | 8/2005 |
| CN | 1869736 A | 11/2006 |
| CN | 2859579 Y | 1/2007 |
| CN | 1936623 A | 3/2007 |
| CN | 1940601 A | 4/2007 |
| CN | 201165502 Y | 12/2008 |
| CN | 201483977 U | 5/2010 |
| CN | 201707457 U | 1/2011 |
| CN | 102109630 A | 6/2011 |
| CN | 201945707 U | 8/2011 |
| CN | 201984393 U | 9/2011 |
| CN | 202171708 U | 3/2012 |
| CN | 202177751 U | 3/2012 |
| CN | 202177765 U | 3/2012 |
| CN | 202182978 U | 4/2012 |
| CN | 102627407 A | 8/2012 |
| CN | 202615053 U | 12/2012 |
| CN | 102923969 A | 2/2013 |
| CN | 103013196 A | 4/2013 |
| CN | 103013219 A | 4/2013 |
| CN | 202904161 U | 4/2013 |
| CN | 103099529 A | 5/2013 |
| CN | 202924088 U | 5/2013 |
| CN | 202924096 U | 5/2013 |
| CN | 103171230 A | 6/2013 |
| CN | 203025361 U | 6/2013 |
| CN | 103254670 A | 8/2013 |
| CN | 103302934 A | 9/2013 |
| CN | 103305816 A | 9/2013 |
| CN | 203260587 U | 10/2013 |
| CN | 203535376 U | 4/2014 |
| CN | 203567294 U | 4/2014 |
| CN | 203620645 U | 6/2014 |

(56) References Cited

FOREIGN PATENT DOCUMENTS

| | | |
|---|---|---|
| CN | 103921487 A | 7/2014 |
| CN | 103934756 A | 7/2014 |
| CN | 203689480 U | 7/2014 |
| CN | 103964705 A | 8/2014 |
| CN | 104418511 A | 3/2015 |
| CN | 104559625 A | 4/2015 |
| CN | 104845544 A | 8/2015 |
| CN | 204727835 U | 10/2015 |
| CN | 204894681 U | 12/2015 |
| CN | 105446558 A | 3/2016 |
| CN | 105737103 A | 7/2016 |
| CN | 205368144 U | 7/2016 |
| CN | 105843452 A | 8/2016 |
| CN | 105859148 A | 8/2016 |
| CN | 106113837 A | 11/2016 |
| CN | 205687804 U | 11/2016 |
| CN | 106199812 A | 12/2016 |
| CN | 205818592 U | 12/2016 |
| CN | 106338783 A | 1/2017 |
| CN | 106378880 A | 2/2017 |
| CN | 106431004 A | 2/2017 |
| CN | 106941545 A | 7/2017 |
| CN | 107042642 A | 8/2017 |
| CN | 107076878 A | 8/2017 |
| CN | 107174867 A | 9/2017 |
| CN | 107310209 A | 11/2017 |
| CN | 215365506 U | 12/2021 |
| CN | 112919819 B | 5/2022 |
| EP | 0698798 A2 | 2/1996 |
| EP | 1069088 A1 | 1/2001 |
| EP | 1275623 A1 | 1/2003 |
| EP | 1432874 A1 | 6/2004 |
| EP | 2149540 A1 | 2/2010 |
| EP | 3178796 A1 | 6/2017 |
| EP | 3822234 A1 | 5/2021 |
| FR | 2966934 A3 | 5/2012 |
| GB | 2485522 A | 5/2012 |
| ID | 11085 | 3/2011 |
| IN | 201201777 | 10/2015 |
| JP | 58-127463 A | 7/1983 |
| JP | 61-019888 A | 1/1986 |
| JP | 02-077434 A | 3/1990 |
| JP | 02-156448 A | 6/1990 |
| JP | 07-290652 A | 11/1995 |
| JP | 07-331115 A | 12/1995 |
| JP | 2000-121806 A | 4/2000 |
| JP | 2000-275404 A | 10/2000 |
| JP | 2001-281402 A | 10/2001 |
| JP | 2001-281406 A | 10/2001 |
| JP | 2001-311806 A | 11/2001 |
| JP | 2002-082207 A | 3/2002 |
| JP | 2002-210906 A | 7/2002 |
| JP | 2002-212317 A | 7/2002 |
| JP | 2003-026826 A | 1/2003 |
| JP | 2003-082127 A | 3/2003 |
| JP | 2004-069878 A | 3/2004 |
| JP | 2004-244594 A | 9/2004 |
| JP | 2004-291303 A | 10/2004 |
| JP | 2004-333901 A | 11/2004 |
| JP | 2005-042072 A | 2/2005 |
| JP | 2005-070724 A | 3/2005 |
| JP | 2005-187639 A | 7/2005 |
| JP | 2005-187640 A | 7/2005 |
| JP | 2005-227415 A | 8/2005 |
| JP | 2005-246296 A | 9/2005 |
| JP | 2005-300576 A | 10/2005 |
| JP | 2006-047504 A | 2/2006 |
| JP | 2006-110754 A | 4/2006 |
| JP | 2006-317957 A | 11/2006 |
| JP | 2006-352105 A | 12/2006 |
| JP | 2007-055064 A | 3/2007 |
| JP | 2007-072372 A | 3/2007 |
| JP | 2007-086521 A | 4/2007 |
| JP | 2007-114377 A | 5/2007 |
| JP | 2007-156205 A | 6/2007 |
| JP | 2007-240707 A | 9/2007 |
| JP | 2007-271953 A | 10/2007 |
| JP | 2007-298667 A | 11/2007 |
| JP | 2008-003425 A | 1/2008 |
| JP | 2008-116596 A | 5/2008 |
| JP | 2008-158156 A | 7/2008 |
| JP | 2009-025384 A | 2/2009 |
| JP | 2009-149468 A | 7/2009 |
| JP | 2009-175725 A | 8/2009 |
| JP | 2010-061044 A | 3/2010 |
| JP | 2010-125719 A | 6/2010 |
| JP | 2010-167410 A | 8/2010 |
| JP | 2011-246365 A | 12/2011 |
| JP | 2012-132022 A | 7/2012 |
| JP | 2012-228811 A | 11/2012 |
| JP | 2012-242837 A | 12/2012 |
| JP | 2013-070093 A | 4/2013 |
| JP | 2013-226666 A | 11/2013 |
| JP | 2013-234571 A | 11/2013 |
| JP | 2015-006650 A | 1/2015 |
| JP | 5650347 B1 | 1/2015 |
| JP | 5736214 B2 | 6/2015 |
| JP | 2015-167470 A | 9/2015 |
| JP | 2015-171770 A | 10/2015 |
| JP | 2016-009172 A | 1/2016 |
| JP | 2016-201236 A | 12/2016 |
| KR | 10-2005-0043647 A | 5/2005 |
| KR | 10-2006-0024545 A | 3/2006 |
| KR | 10-2006-0060171 A | 6/2006 |
| KR | 10-2006-0065724 A | 6/2006 |
| KR | 10-0709879 B1 | 4/2007 |
| KR | 10-2007-0054850 A | 5/2007 |
| KR | 10-2007-0063134 A | 6/2007 |
| KR | 10-2008-0048578 A | 6/2008 |
| KR | 10-2008-0057443 A | 6/2008 |
| KR | 10-2009-0098975 A | 9/2009 |
| KR | 10-2009-0119968 A | 11/2009 |
| KR | 10-2010-0013836 A | 2/2010 |
| KR | 10-2010-0123624 A | 11/2010 |
| KR | 2011-0047596 A | 5/2011 |
| KR | 10-2011-0078682 A | 7/2011 |
| KR | 10-1121207 B1 | 3/2012 |
| KR | 2013-0031689 | 3/2013 |
| KR | 10-2014-0061842 A | 5/2014 |
| KR | 10-1517051 B1 | 5/2015 |
| KR | 10-2015-0116802 A | 10/2015 |
| KR | 10-2017-0028190 A | 3/2017 |
| KR | 10-2017-0043566 A | 4/2017 |
| WO | 02/00772 A1 | 1/2002 |
| WO | 03/09767 A1 | 2/2003 |
| WO | 03/27397 A1 | 4/2003 |
| WO | 2007/049589 A1 | 5/2007 |
| WO | 2008/062605 A1 | 5/2008 |
| WO | 2009/008240 A1 | 1/2009 |
| WO | 2009/037886 A1 | 3/2009 |
| WO | 2009/065490 A2 | 5/2009 |
| WO | 2009/107536 A1 | 9/2009 |
| WO | 2010/114135 A1 | 10/2010 |
| WO | 2013/023359 A1 | 2/2013 |
| WO | 2014/061614 A1 | 4/2014 |
| WO | 2014/085414 A1 | 6/2014 |
| WO | 2014/117333 A1 | 8/2014 |
| WO | 2015/015338 A2 | 2/2015 |
| WO | 2015/030118 A1 | 3/2015 |
| WO | 2015/084253 A1 | 6/2015 |
| WO | 2015/095288 A2 | 6/2015 |
| WO | 2015/108266 A1 | 7/2015 |
| WO | 2015/115154 A1 | 8/2015 |
| WO | 2015/137196 A1 | 9/2015 |
| WO | 2015/174625 A1 | 11/2015 |
| WO | 2015/190374 A1 | 12/2015 |
| WO | 2016/069113 A1 | 5/2016 |
| WO | 2016/204009 A1 | 12/2016 |
| WO | 2016/205317 A1 | 12/2016 |
| WO | 2017/041307 A1 | 3/2017 |
| WO | 2018/043253 A1 | 3/2018 |
| WO | 2018/125676 A1 | 7/2018 |
| WO | 2019/055745 A1 | 3/2019 |
| WO | 2020/013012 A1 | 1/2020 |

(56) References Cited

FOREIGN PATENT DOCUMENTS

| WO | 2020/123367 A1 | 6/2020 |
| WO | 2022/011070 A1 | 1/2022 |
| WO | 2022/011071 A1 | 1/2022 |
| WO | 2022/125846 A1 | 6/2022 |

OTHER PUBLICATIONS

"Cieluv", Available at: https://en.wikipedia.org/wiki/CIELUV, 1976, 5 pages.
"Heron's formula", Available at: https://en.wikipedia.org/wiki/Heron%27s_formula, 8 pages.
"High-precision, fast array spectroradiometer—for demanding measurements", Available at: https://www.instrumentsystems.com/en/products/spectrometers/cas-140d, 4 pages.
"Illuminance Meters", Available at: https://sensing.konicaminolta.us/us/technologies/illuminance-meters/, 2 pages.
"Welcome to Display—Metrology & Systems", Available at: www.display-messtechnik.de/en/measurement, 2014, 1 page.
Al-Dahoudi, N. et al., "Transparent conducting, anti-static and anti-static-anti-glare coatings on plastic substrates," Thin Solid Films 2001, 392, pp. 299-304.
ASTM C770-16(2020), "Standard Test Method for Measurement of Glass Stress-Optical Coefficient," ASTM International, West Conshohocken, PA, 2020, www.astm.org.
ASTM D1003-21, "Standard Test Method for Haze and Luminous Transmittance of Transparent Plastics," ASTM International, West Conshohocken, PA, 2021, www.astm.org.
ASTM D523-14(2018), "Standard Test Method for Specular Gloss," ASTM International, West Conshohocken, PA, 2018, www.astm.org.
ASTM E2001-13, "Standard Guide for Resonant Ultrasound Spectroscopy for Defect Detection in Both Metallic and Non-metallic Parts," ASTM International, West Conshohocken, PA, 2013, www.astm.org.
Cecala, C. et al., "Fourier Optics Modeling of Display Sparkle from Anti-Glare Cover Glass: Comparison to Experimental Data," Imaging and Applied Optics Congress, OSA Technical Digest (Optical Society of America, 2020), paper JW5B.8, 2 pages.
Chou, S.Y. et al., "Imprint of Sub-25 nm Vias and Trenches in Polymers," Appl. Phys. Lett. 67, 3114, 1995, 3 pages.
Cook, R. L., "Stochastic sampling in computer graphics," Computer Graphics (Proceedings of ACM SIGGRAPH 86) 5, 1 (1986), pp. 51-72.
Kelley, E., "Proposed Diffuse Ambient Contrast Measurement Methods for Flat Panel Displays," 2001, NISTIR 6738, National Institute of Standards and Technology, Gaithersburg, Maryland, 7 pages.
Kittel, C., Introduction to Solid State Physics, seventh edition, John Wiley & Sons, Inc., NY, 1996, pp. 611-627.
Liu, B.T. et al., "Strength of the interactions between light-scattering particles and resins affects the haze of anti-glare films," Colloids Surf. a Physicochem. Eng. Aspects 2011, 389, pp. 138-143.
Modified ASTM D5767-18 test protocol, "Standard Test Method for Instrumental Measurement of Distinctness-of-Image (DOI) Gloss of Coated Surfaces using a Rhopoint IQ Gloss Haze & DOI Meter," Rhopoint Instruments Ltd.
Schlömer, T. et al., "Farthest-points optimized point sets with maximized minimum distance," Proc. ACM SIGGRAPH Symposium on high performance graphics: HPG 2011 pp. 135-142.
Shackelford, J.F., Introduction to Materials Science for Engineers, Sixth Edition, Pearson Prentice Hall, New Jersey, 2005, pp. 404-418.
Simonsen, et al., "Haze of random systems: an approximate analytic approach," Phys Rev A 79 063813 (2009), 23 pages.
Smart and Moore, Solid State Chemistry, an introduction, Chapman & Hall University and Professional Division, London, 1992, pp. 136-151.
Stillwell, A. et al., "Perception of Sparkle in Anti-Glare Display Screens," JSID 22(2), 129-136 (2014).
Boerner et al; "Holographic Antiglare and Antireflection Films for Flat Panel Displays" SID 03 DIGEST, 7.3, p. 68, 2003.
International Search Report and Written Opinion of the International Searching Authority; PCT/US2019/012807; Mailed Mar. 29, 2019; 12 Pages; European Patent Office.
Oliver et al; "An Improved Technique for Determining Hardness and Elastic Modulus Using Load and Displacement Sensing Indentation Experiments"; J. Mater. Res., vol. 7,No. 6, 1992, pp. 1564-1583.
Oliver et al; "Measurement of Hardness and Elastic Modulus by Instrument Indentation: Advances in Understanding and Refinements to Methodology";. J. Mater. Res., vol. 19, No. 1, 2004, pp. 3-20.
Taguchi et al; "Ultra-Low-Reflective 60-In. LCD With Uniform Moth-Eye Surface for Digital Signage," SID 10 DIGEST, 80.3, p. 1196, 2010.
International Search Report and Written Opinion of the International Searching Authority; PCT/US2021/040772; dated Nov. 10, 2021; 10 pages; European Patent Office.
ASTM Standard Test Method for Haze and Luminous Transmittance of Transparent Plastics; Designation D 1003-07, Nov. 2007.
International Search Report and Written Opinion of the International Searching Authority; PCT/US2022/034624; dated Oct. 25, 2022; 11 pages; European Patent Office.
International Search Report and Written Opinion of the International Searching Authority; PCT/US2022/034812; dated Oct. 24, 2022; 12 pages; European Patent Office.
Radhakrishnan et al., "Order parameters in molecular simulations", Handbook of Materials Modeling, Chapter 6, 2005, pp. 1613-1626.
Chinese Patent Application No. 202180059815.5, Office Action dated Mar. 29, 2025, 4 pages (English Translation only), Chinese Patent Office.

* cited by examiner

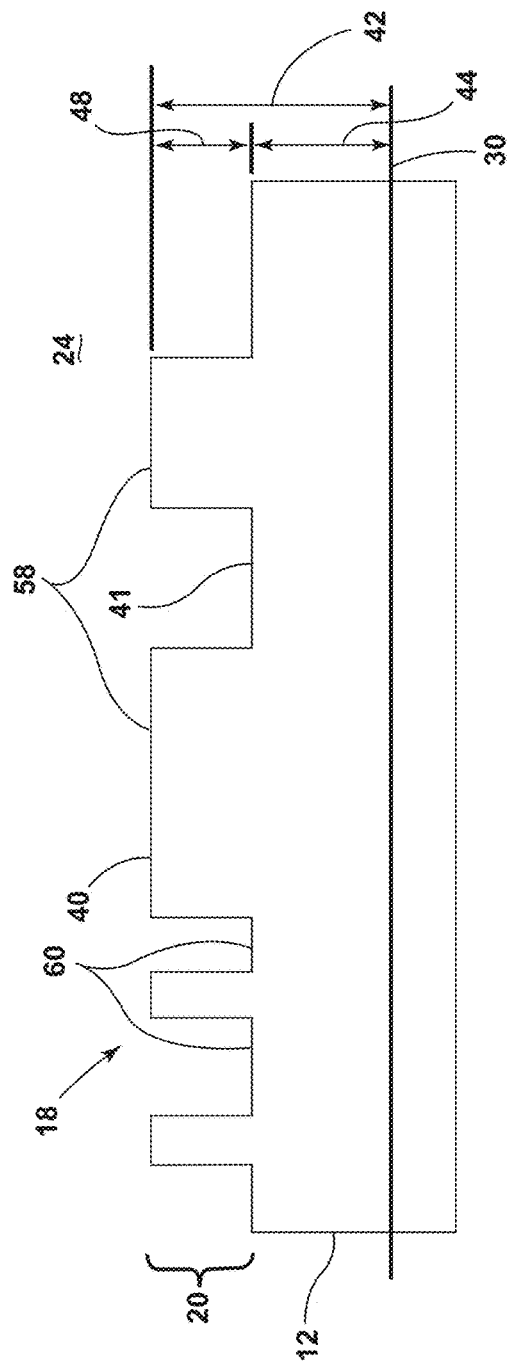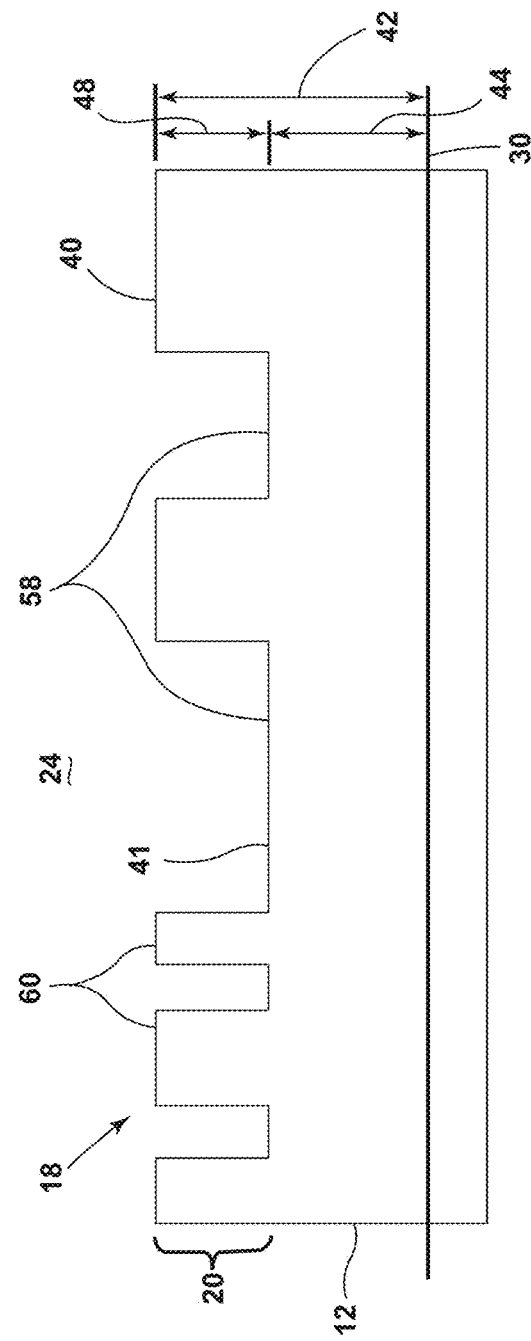
FIG. 10C
FIG. 10D

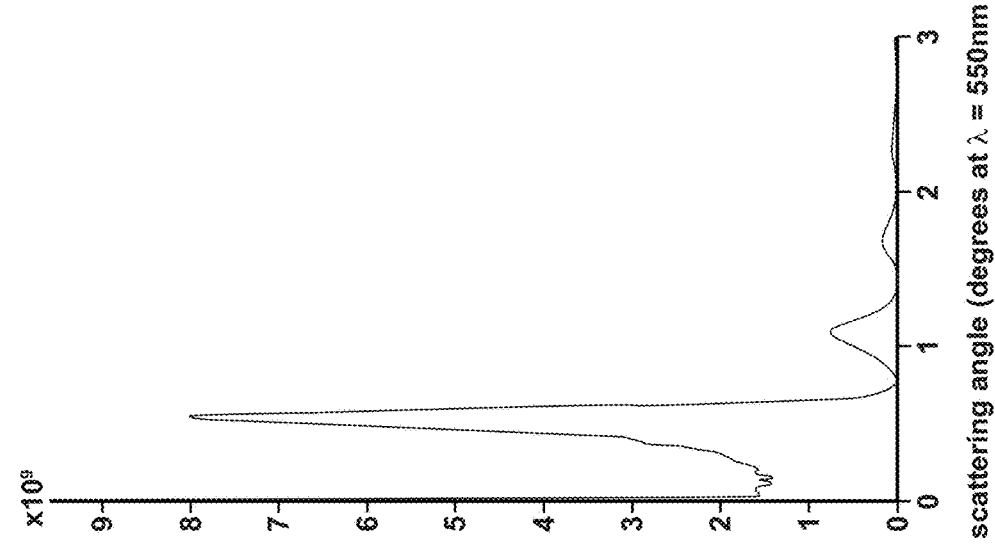
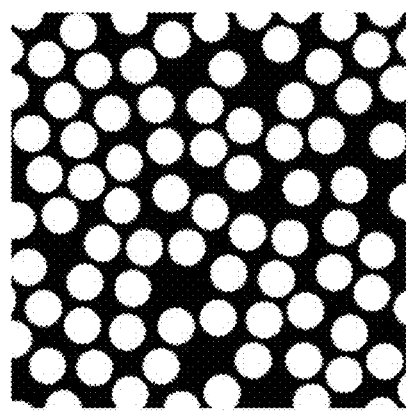
FIG. 15A
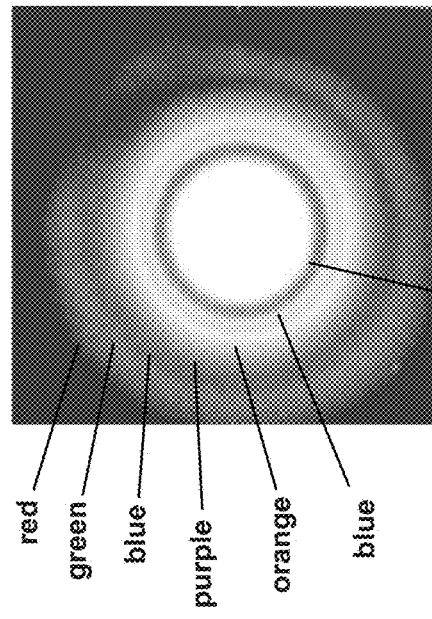
FIG. 15B
FIG. 15C

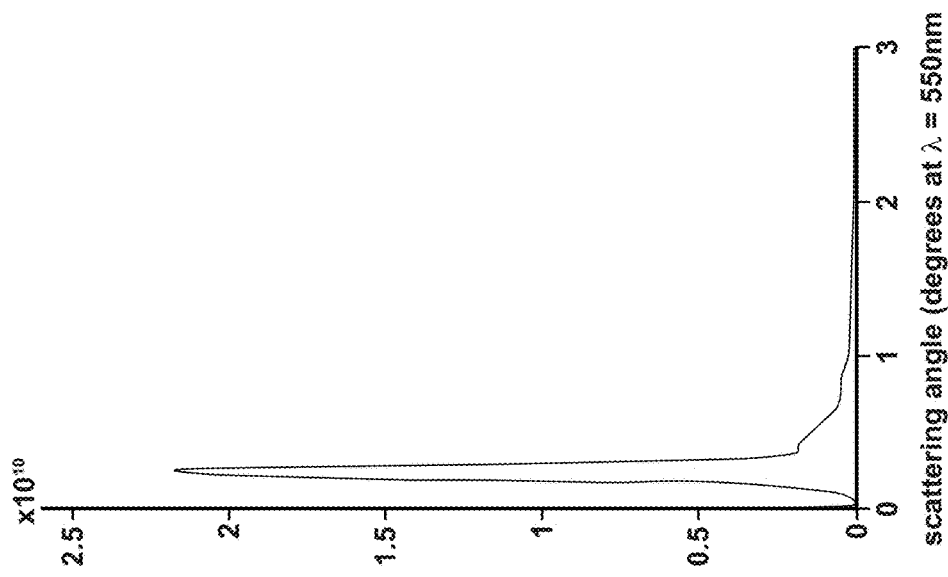
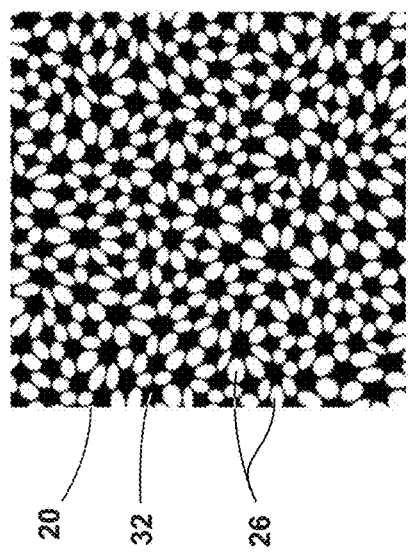
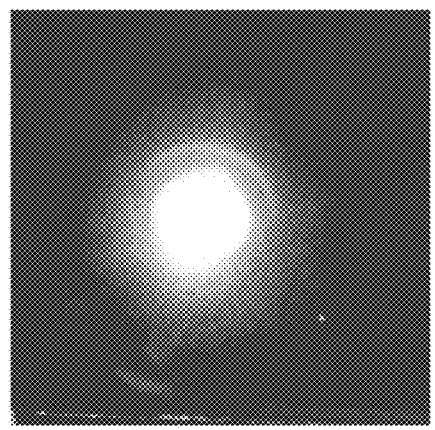
FIG. 16A
FIG. 16B
FIG. 16C

TEXTURED REGION OF A SUBSTRATE TO REDUCE SPECULAR REFLECTANCE INCORPORATING SURFACE FEATURES WITH AN ELLIPTICAL PERIMETER OR SEGMENTS THEREOF, AND METHOD OF MAKING THE SAME

CLAIM OF PRIORITY

This patent application claims priority under 35 U.S.C. § 119(e) to U.S. Provisional Patent Application No. 63/049,843, entitled "DISPLAY ARTICLES WITH DIFFRACTIVE, ANTIGLARE SURFACES AND METHODS OF MAKING THE SAME," filed Jul. 9, 2020, the entire disclosure of which is incorporated herein by reference.

CROSS-REFERENCE TO RELATED APPLICATIONS

The present application relates to, but does not claim priority to, commonly owned and assigned U.S. Pat. No. 12,147,009, entitled "TEXTURED REGION TO REDUCE SPECULAR REFLECTANCE INCLUDING A LOW REFRACTIVE INDEX SUBSTRATE WITH HIGHER ELEVATED SURFACES AND LOWER ELEVATED SURFACES AND A HIGH REFRACTIVE INDEX MATERIAL DISPOSED ON THE LOWER ELEVATED SURFACES" and filed on Jul. 7, 2021; U.S. patent application Ser. No. 17/369,301, entitled "ANTI-GLARE SUBSTRATE FOR A DISPLAY ARTICLE INCLUDING A TEXTURED REGION WITH PRIMARY SURFACE FEATURES AND SECONDARY SURFACE FEATURES IMPARTING A SURFACE ROUGHNESS THAT INCREASES SURFACE SCATTERING" and filed on Jul. 7, 2021; U.S. Pat. No. 11,977,206, entitled "DISPLAY ARTICLES WITH DIFFRACTIVE, ANTIGLARE SURFACES AND THIN, DURABLE ANTIREFLECTION COATINGS" and filed on Jul. 8, 2021; and U.S. Pat. No. 11,971,519, entitled "DISPLAY ARTICLES WITH ANTIGLARE SURFACES AND THIN, DURABLE ANTIREFLECTION COATINGS" and filed on Jul. 8, 2021. The entire disclosures of each of the foregoing U.S. patent applications, publications and patent documents are incorporated herein by reference.

BACKGROUND

Substrates transparent to visible light are utilized to cover displays of display articles. Such display articles include smart phones, tablets, televisions, computer monitors, and the like. The displays are often liquid crystal displays, organic light emitting diodes, among others. The substrate protects the display, while the transparency of the substrate allows the user of the device to view the display.

The substrate reflecting ambient light, especially specular reflection, reduces the ability of the user to view the display through the substrate. Specular reflection in this context is the mirror-like reflection of ambient light off the substrate. For example, the substrate may reflect visible light reflecting off or emitted by an object in the environment around the device. The visible light reflecting off the substrate reduces the contrast of the light from the display transmitting to the eyes of the user through the substrate. At some viewing angles, instead of seeing the visible light that the display emits, the user sees a specularly reflected image. Thus, attempts have been made to reduce specular reflection of visible ambient light off the substrate.

Attempts have been made to reduce specular reflection off the substrate by texturing the reflecting surface of the substrate. The resulting surface is sometimes referred to as an "antiglare surface." For examples, sandblasting and liquid etching the surface of the substrate can texture the surface, which generally causes the surface to reflect ambient light diffusely rather than specularly. Diffuse reflection generally means that the surface still reflects the same intensity of ambient light but the texture of the reflecting surface scatters the light upon reflection. The more diffuse reflection interferes less with the ability of the user to see the visible light that the display emits.

Such methods of texturing (i.e., sandblasting and liquid etching) generate features on the surface with imprecise and unrepeatable geometry (the features provide the texture). The geometry of the textured surface of one substrate formed via sandblasting or liquid etching can never be exactly the same as the geometry of the textured surface of another substrate formed via sandblasting or liquid etching. Commonly, only a quantification of the surface roughness (i.e., Ra) of the textured surface of the substrate is a repeatable target of the texturing.

There are a variety of metrics by which the quality of the "antiglare" surface is judged. Those metrics include (1) the distinctness-of-image, (2) pixel power deviation, (3) apparent Moiré interference fringes, (4) transmission haze, and (5) reflection color artifacts. Distinctness-of-image, which more aptly might be referred to as distinctness-of-reflected-image, is a measure of how distinct an image reflecting off the surface appears. The lower the distinctness-of-image, the more the textured surface is diffusely reflecting rather than specularly reflecting. Surface features can magnify various pixels of the display, which distorts the image that the user views. Pixel power deviation, also referred to as "sparkle," is a quantification of such an effect. The lower the pixel power deviation the better. Moiré interference fringes are large scale interference patterns, which, if visible, distort the image that the user sees. Preferably, the textured surface produces no apparent Moiré interference fringes. Transmission haze is a measure of how much the textured surface is diffusing the visible light that the display emitted upon transmitting through the substrate. The greater the transmission haze, the less sharp the display appears (i.e., lowered apparent resolution). Reflection color artifacts are a sort of chromatic aberration where the textured surface diffracts light upon reflection as a function of wavelength—meaning that the reflected light, although relatively diffuse, appears segmented by color. The less reflected color artifacts that the textured surface produces the better. All of these attributes are discussed in greater detail below.

Targeting a specific surface roughness cannot optimize all of those metrics simultaneously. A relatively high surface roughness that sandblasting or liquid etching produces might adequately transform specular reflection into diffuse reflection. However, the high surface roughness can additionally generate high transmission haze and pixel power deviation. A relatively low surface roughness, while decreasing transmission haze, might fail to sufficiently transform specular reflection into diffuse reflection—defeating the "antiglare" purpose of the texturing.

Accordingly, a new approach to providing a textured region of the substrate is needed—one that causes the textured surface to reflect ambient light sufficiently diffusely rather than specularly so as to be "antiglare" (e.g., a low distinctness-of-image) but simultaneously also delivers low pixel power deviation, low transmission haze, and low reflection color artifacts.

SUMMARY

The present disclosure addresses that need with a textured region of a substrate that incorporates randomly distributed and oriented elliptical surface features or segments thereof. The surface features having such an elliptical or partially elliptical shape, when randomly distributed and oriented, provide low specular reflection with minimal transmission haze and pixel power deviation and with minimal or unperceivable reflected color artifacts. Although the surface features are randomly distributed and oriented, the surface features are specifically placed by design. Thus, the textured region can be reproduced from substrate to substrate.

According to a first aspect of the present disclosure, a substrate for a display article, the substrate comprising: (i) a primary surface; and (ii) a textured region on at least a portion of the primary surface, the textured region comprising surface features that reflect a random distribution, each of the surface features comprising a perimeter that is parallel to a base-plane extending through a thickness of the substrate below the textured region, wherein the perimeter is elliptical.

According to a second aspect of the present disclosure, the substrate of the first aspect, wherein the textured region further comprises (i) one or more higher surfaces residing at a higher mean elevation from the base-plane and (ii) one or more lower surfaces residing at a lower mean elevation from the base-plane that is closer to the base-plane than the higher mean elevation.

According to a third aspect of the present disclosure, the substrate of the second aspect, wherein (a) the textured region further comprises a surrounding portion, into which the surface features are set, or from which the surface features project; (b) the surrounding portion provides either (i) the one or more higher surfaces or (ii) the one or more lower surfaces; and (c) the surface features provide the other of (i) the one or more higher surfaces and (ii) the one or more lower surfaces, whichever the surrounding portion does not provide.

According to a fourth aspect of the present disclosure, the substrate of any one of the second through third aspects, wherein the higher mean elevation differs from the lower mean elevation by a distance within a range of 0.05 μm to 0.70 μm.

According to a fifth aspect of the present disclosure, the substrate of any one of the first through fourth aspects, wherein (i) the perimeter of each of the surface features comprises a longest dimension parallel to the base-plane; and (ii) the longest dimensions of the perimeters of the surface features are not all parallel to each other.

According to a sixth aspect of the present disclosure, the substrate of the fifth aspect, wherein the longest dimension of the perimeter of each of the surface features is within a range of 5 μm to 150 μm.

According to a seventh aspect of the present disclosure, the substrate of any one of the first through sixth aspects, wherein the surface features comprise a fill-fraction that is within a range of 40% to 60%.

According to an eighth aspect of the present disclosure, the substrate of the first aspect, wherein (i) the surface features comprise larger surface features and smaller surface features; (ii) the perimeters of the larger surface features comprise a range of longest dimensions parallel to the base-plane; (iii) the perimeters of the smaller surface features comprise another range of longest dimensions parallel to the base-plane; and (iv) the longest dimensions of the range of longest dimensions of the larger surface features are longer than the longest dimensions of the range of longest dimensions of the smaller surface features.

According to a ninth aspect of the present disclosure, the substrate of the eighth aspect, wherein (i) the perimeters of the larger surface features totally surround the perimeters of some of the smaller surface features; and (ii) the perimeters of some the smaller surface features reside entirely outside of the perimeters.

According to a tenth aspect of the present disclosure, the substrate of the eighth aspect, wherein the perimeter of at least one of the smaller surface features partially overlaps with the perimeter of one of the larger surface features, such that (i) part of the perimeter of the smaller surface features is inside the perimeter of the larger surface feature and (ii) part of the perimeter of the smaller surface features is outside the perimeter of the larger surface feature.

According to an eleventh aspect of the present disclosure, the substrate of any one of the eighth through tenth aspects, wherein the textured region further comprises (i) one or more higher surfaces residing at a higher mean elevation from the base-plane, (ii) one or more lower surfaces residing at a lower mean elevation from the base-plane that is closer to the base-plane than the higher mean elevation, and (iii) a surrounding portion, into which the larger surface features are set, or from which the larger surface features project.

According to a twelfth aspect of the present disclosure, the substrate of the eleventh aspect, wherein (i) the larger surface features project from the surrounding portion, some of the smaller surface features project from the surrounding portion, and the remaining smaller surface features, those that do not project from the surrounding portion, are set into the larger surface features; (ii) the larger surface features and smaller surface features that project from the surrounding portion provide the one or more higher surfaces residing at the higher mean elevation; and the surrounding portion and the smaller surface features that are set into larger surface features provide the one or more lower surfaces residing at the lower mean elevation.

According to a thirteenth aspect of the present disclosure, the substrate of the eleventh aspect, wherein (i) the larger surface features are set into the surrounding portion, some of the smaller surface features are set into the surrounding portion, and the remaining smaller surface features, those that are not set into the surrounding portion, project from the larger surface features; (ii) the larger surface features and the smaller surface features that are set into the surrounding portion provide the one or more lower surfaces residing at the lower mean elevation; and (iii) the surrounding portion and the smaller surface features that project from the larger surface features provide the one or more higher surfaces residing at the higher mean elevation.

According to a fourteenth aspect of the present disclosure, the substrate of the eighth aspect, wherein the textured region further comprises (i) one or more higher surfaces residing at a higher mean elevation from the base-plane, (ii) one or more lower surfaces residing at a lower mean elevation from the base-plane that is closer to the base-plane than the higher mean elevation, (iii) one or more intermediate surfaces residing at one or two intermediate mean elevations from the base-plane, wherein the one or two intermediate mean elevations are disposed between the higher mean elevation and the lower mean elevation, and (iv) a surrounding portion, into which the larger surface features are set, or from which the larger surface features project.

According to a fifteenth aspect of the present disclosure, the substrate of the fourteenth aspect, wherein the larger surface features provide at least a portion of the one or more higher surfaces residing at the higher mean elevation.

According to a sixteenth aspect of the present disclosure, the substrate of the fourteenth aspect, wherein the larger surface features provide at least a portion of the one or more lower surfaces disposed at the lower mean elevation.

According to a seventeenth aspect of the present disclosure, the substrate of any one of the first through sixteenth aspects, wherein the textured region further comprises one or more sections comprising secondary surface features imparting a surface roughness ($R_a$) within a range of 5 nm to 100 nm.

According to a eighteenth aspect of the present disclosure, the substrate of any one of the first through seventeenth aspects, wherein (i) the textured region exhibits a transmission haze within a range of 0.5% to 5.0%; (ii) the textured region exhibits a pixel power deviation within a range of 1.0% to 3.0%; (iii) the textured region exhibits a distinctness-of-image within a range of 5% to 70%; (iv) the textured region exhibits a specular reflectance within a range of 4 GU to 40 GU; and (v) the textured region exhibits corrected color shifts $\Delta C_{x\_corrected}$ and $\Delta C_{y\_corrected}$ that are each respectively within a range of 0.03 to 0.6.

According to a nineteenth aspect of the present disclosure, the substrate of any one of the first through eighteenth aspects, wherein the substrate comprises a glass or glass-ceramic.

According to a twentieth aspect of the present disclosure, a substrate for a display article, the substrate comprising: (a) a primary surface; (b) a base-plane extending through the substrate below the primary surface; and (c) a textured region at the primary surface, the textured region comprising (i) one or more higher surfaces residing at a higher mean elevation from the base-plane, (ii) one or more lower surfaces residing at a lower mean elevation from the base-plane, (iii) a first portion providing either the one or more higher surfaces or the one or more lower surfaces, and (iv) a second portion providing the other of the one or more higher surfaces and the one or more higher surfaces, whichever the first portion is not providing; wherein, elliptical perimeters which lie in planes parallel to the base-plane and reflect a random distribution, define the first portion except for overlapping portions of the elliptical perimeters, where the overlapping portions define in part the second portion.

According to a twenty-first aspect of the present disclosure, the substrate of the twentieth aspect, wherein in addition to the overlapping portions of the elliptical perimeters, the second portion of the textured region further comprises any part of the textured region that is not the first portion.

According to a twenty-second aspect of the present disclosure, the substrate of any one of the twentieth through twenty-first aspects, wherein (i) each of the elliptical perimeters comprises a longest dimension parallel to the base-plane; and (ii) the longest dimensions of the elliptical perimeters are not all parallel with each other.

According to a twenty-third aspect of the present disclosure, the substrate of any one of the twentieth through twenty-second aspects, wherein the higher mean elevation differs from the second elevation by a distance within a range of 0.02 μm to 0.70 μm.

According to a twenty-fourth aspect of the present disclosure, the substrate of any one of the twentieth through twenty-third aspects, wherein (a) the elliptical perimeters comprise larger elliptical perimeters and smaller elliptical perimeters, which are smaller than the first elliptical perimeters; and (b) the first portion of the textured region is bounded by (i) the smaller elliptical perimeters that do not overlap or intersect with the larger elliptical perimeters, (ii) portions of the smaller elliptical perimeters outside of the first elliptical perimeters that partially overlap with the larger elliptical perimeters, and (iii) portions of the larger elliptical perimeters that do not overlap with the smaller elliptical perimeters.

According to a twenty-fifth aspect of the present disclosure, the substrate of the twenty-fourth aspect, wherein at least some of the larger elliptical perimeters entirely encompass more than one of the smaller elliptical perimeters.

According to a twenty-sixth aspect of the present disclosure, the substrate of any one of the twenty-fourth through twenty-fifth aspects, wherein (i) a fill-fraction of the larger elliptical perimeters is within a range of 40% to 60%; and (ii) a fill-fraction of the smaller elliptical perimeters is within a range of 10% to 30%.

According to a twenty-seventh aspect of the present disclosure, the substrate of any one of the twentieth through twenty-sixth aspects, wherein the textured region further comprises one or more sections comprising secondary surface features imparting a surface roughness ($R_a$) within a range of 5 nm to 100 nm.

According to a twenty-eighth aspect of the present disclosure, the substrate of any one of the twentieth through twenty-seventh aspects, wherein (i) the textured region exhibits a transmission haze within a range of 0.3% to 8.0%; (ii) the textured region exhibits a pixel power deviation within a range of 0.7% to 3.5%; (iii) the textured region exhibits a distinctness-of-image within a range of 25% to 100%; (iv) the textured region exhibits a specular reflectance within a range of 5 GU to 30 GU; and (v) the textured region exhibits corrected color shifts $\Delta C_{x\_corrected}$ and $\Delta C_{y\_corrected}$ that are each respectively within a range of 0.00 to 0.50.

According to a twenty-ninth aspect of the present disclosure, the substrate of any one of the twentieth through twenty-eighth aspects, wherein the substrate comprises a glass or glass-ceramic.

According to a thirtieth aspect of the present disclosure, a method of forming a textured region of a substrate of a display article, the method comprising: (I) generating a random distribution of ellipses within an area; (II) preparing a lithography mask comprising (a) an area matching the area of the plane; (b) material throughout the matching area; and (c) voids through the material, wherein the random distribution of the ellipses define either (i) the material throughout the matching area or (ii) the voids through the material; (III) exposing a workpiece comprising a substrate, a lithography ink disposed on the substrate, and the lithography mask disposed on the lithography ink, to a curing agent that transmits through the voids through the material of the lithography mask to cure exposed portions of the lithography ink, wherein non-exposed portions of the lithography ink blocked from exposure to the curing agent are not cured and removed along with the lithography mask, and the exposed portions of the lithography ink remain on the substrate as an etching mask; and (IV) contacting the substrate with the etching mask with an etchant, thus forming the textured region.

According to a thirty-first aspect of the present disclosure, the method of the thirtieth aspect further comprises: (I) generating a random distribution of second ellipses within a second area; (II) preparing a second lithography mask comprising (a) a second area matching the area of the second plane; (b) material throughout the matching second area; and (c) voids through the material, wherein the random distribution of the second ellipses define either (i) the material throughout the matching second area or (ii) the voids through the material; (III) exposing a second workpiece comprising the substrate, new lithography ink disposed on the textured region of the substrate, and the second lithography mask disposed on the new lithography ink, to a curing agent that transmits through the voids through the material of the second lithography mask to cure exposed portions of the new lithography ink, wherein non-exposed portions of the new lithography ink blocked from exposure to the curing agent are not cured and removed along with the second lithography mask, and the exposed portions of the new lithography ink remain on the substrate as a second etching mask; and (IV) contacting the substrate with the second etching mask with an etchant.

According to a thirty-second aspect of the present disclosure, the method of any one of the thirtieth through thirty-first aspects, wherein generating the random distribution of the ellipses comprises: (i) distributing points randomly within an area; (ii) triangulating the points so that each point is made a vertex of a triangle thus forming a plurality of triangles, and none of the triangles overlap; (iii) drawing an ellipse inside each triangle of the plurality of triangles; and (iv) removing the points and the triangles so that only the ellipses that were drawn in the triangles remain on the area.

According to a thirty-third aspect of the present disclosure, the method of the thirty-second aspect, wherein the points randomly distributed within the area are separated by a minimum distance.

According to a thirty-fourth aspect of the present disclosure, the method of any one of the thirtieth through thirty-third aspects further comprises: forming secondary surface features into one or more sections of the textured region, thereby increasing the surface roughness ($R_a$) of at the one or more sections to within a range of 5 nm to 100 nm.

According to a thirty-fifth aspect of the present disclosure, a method of forming a textured region of a substrate of a display article, the method comprises: (I) generating a random distribution of first ellipses within a first area; (II) generating a random distribution of second ellipses within a second area, wherein the first ellipses comprise longest dimensions that are on average longer than longest dimensions of the second ellipses on average; (III) forming a new area that superimposes the first ellipses of the first area and the second ellipses of the second area, the new area comprising (a) free portions of the first ellipses and the second ellipses that do not overlap; (b) overlapping portions of the first ellipses and the second ellipses; and (c) empty portions where neither the first ellipses nor the second ellipses are present; (IV) preparing a lithography mask comprising (a) an area; (b) material within the area defined by either (i) the free portions or (ii) a combination of the overlapping portions and the empty portions; and (c) voids through the material defined by whichever of (i) the free portions and (ii) the combination of the overlapping portions and the empty portions do not define the material within the area; (V) exposing a workpiece comprising a substrate, a lithography ink disposed on the substrate, and the lithography mask disposed on the lithography ink, to a curing agent that transmits through the voids through the material of the lithography mask to cure exposed portions of the lithography ink, wherein non-exposed portions of the lithography ink blocked from exposure to the curing agent are not cured and removed along with the lithography mask, and the exposed portions of the lithography ink remain on the substrate as an etching mask; and (VI) contacting the substrate with the etching mask with an etchant.

According to a thirty-sixth aspect of the present disclosure, the method of the thirty-fifth aspect further comprises: before preparing the lithography mask, removing from the new area any of the second ellipses that the first ellipses partially but not fully overlap.

According to a thirty-seventh aspect of the present disclosure, the method of any one of the thirty-fifth through thirty-sixth aspects, wherein generating the random distribution of the first ellipses and generating the random distribution of the second ellipses both separately comprise: (i) distributing points randomly within an area, each of the points separated by a minimum distance; (ii) triangulating the points so that each point is made a vertex of a triangle thus forming a plurality of triangles, and none of the triangles overlap; (iii) drawing an ellipse inside each triangle of the plurality of triangles; and removing the points and the triangles so that only the ellipses that were drawn in the triangles remain on the area.

According to a thirty-eighth aspect of the present disclosure, the method of the thirty-seventh aspect, wherein (i) the minimum distance separating each of the points of the area for the random distribution of the first ellipses is within a range of 80 µm to 130 µm; and (ii) the minimum distance separating each of the points of the area for the random distribution of the second ellipses is within a range of 15 µm to 40 µm.

According to a thirty-ninth aspect of the present disclosure, the method of the thirty-seventh aspect, wherein (i) the minimum distance separating each of the points of the area for the random distribution of the first ellipses is less than or equal 20 µm; (ii) the minimum distance separating each of the points of the area for the random distribution of the second ellipses is less than or equal 18 µm; and the minimum distance separating each of the points of the area for the random distribution of the first ellipses differs from the minimum distance separating each of the points of the plane for the random distribution of the second ellipses by a value within a range of 1 µm to 3 µm.

According to a fortieth aspect of the present disclosure, the method of any one of the thirty-fifth through thirty-ninth aspects further comprises: forming secondary surface features into one or more sections of the textured region, thereby increasing the surface roughness ($R_a$) of at the one or more sections to within a range of 5 nm to 100 nm.

BRIEF DESCRIPTION OF THE DRAWINGS

In the figures:

FIGS. 10C and 10D are elevational views of a cross-section taken through line XC-XC of FIG. 10B, illustrating the first portion and the second portion residing at different elevations from the base-plane, either with the first portion projecting from the second portion (FIG. 10C) or with the first portion set into the second portion (FIG. 10D);

FIGS. 15A-15C, pertaining to a Comparative Example 1A, illustrate circular surface features producing color-separated reflected color artifacts;

FIGS. 16A-16C, pertaining to an Example 1B, illustrate an embodiment of the textured region of FIG. 1 incorporating elliptical surface features not producing color-separated reflected color artifacts;

DETAILED DESCRIPTION

Figure 1:
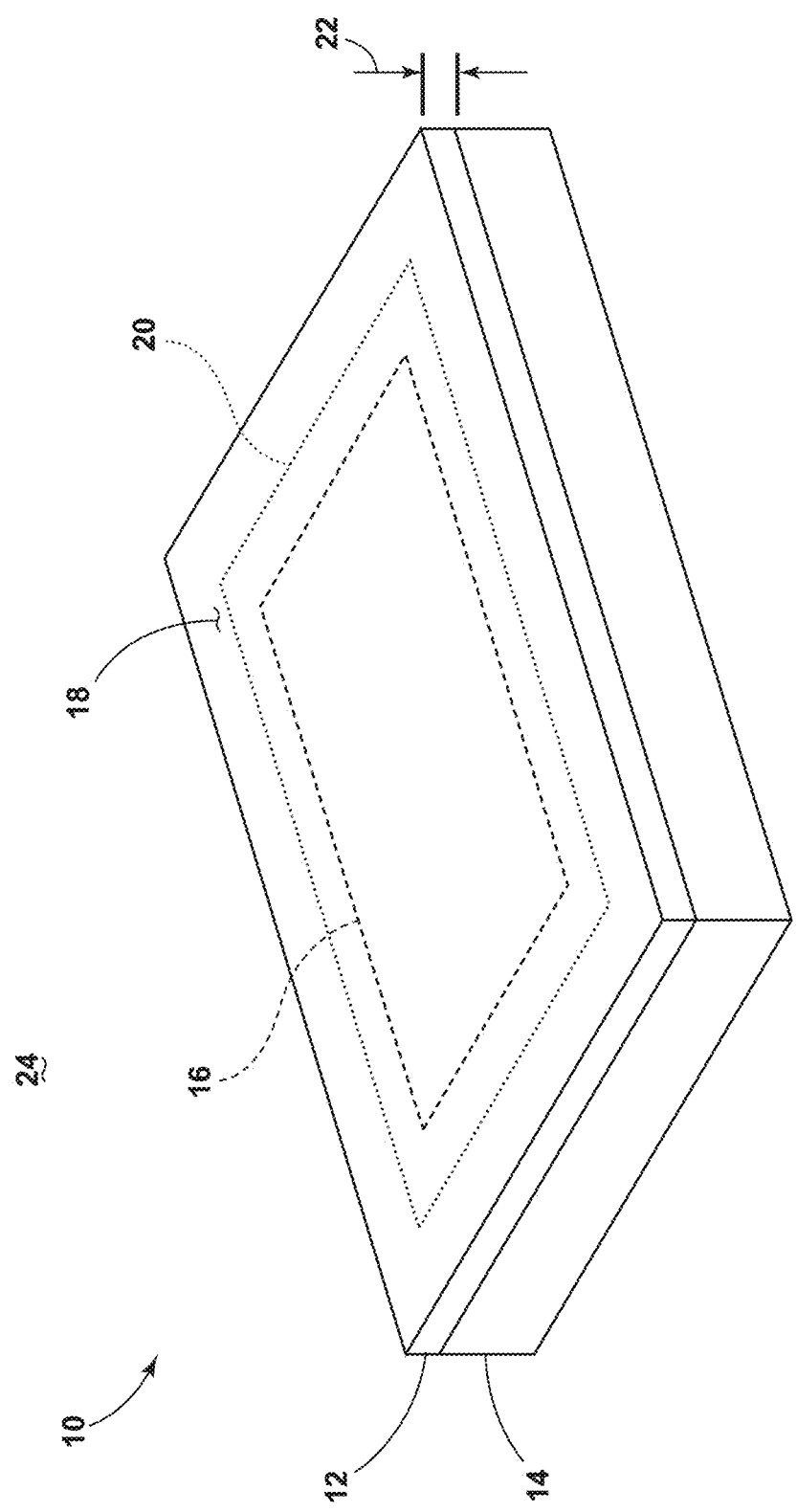
FIG. 1 is a perspective view of a display article, illustrating a substrate including a primary surface with a textured region.

Referring now to FIG. 1, a display article 10 includes a substrate 12. In embodiments, the display article 10 further includes a housing 14 to which the substrate 12 is coupled and a display 16 within the housing 14. In such embodiments, the substrate 12 at least partially covers the display 16 such that light that the display 16 emits can transmit through the substrate 12.

The substrate 12 includes a primary surface 18, a textured region 20 defined on the primary surface 18, and a thickness 22 that the primary surface 18 bounds in part. The primary surface 18 generally faces toward an external environment 24 surrounding the display article 10 and away from the display 16. The display 16 emits visible light that transmits through the thickness 22 of the substrate 12, out the primary surface 18, and into the external environment 24.

Referring now to FIGS. 2-5, in embodiments, the textured region 20 includes surface features 26. The surface features 26 are randomly distributed. Each of the surface features 26 has a perimeter 28. The perimeter 28 is parallel to a base-plane 30 extending through the thickness 22 of the substrate 12 below the textured region 20. The perimeter 28 is elliptical. The base-plane 30 provides a conceptual reference and not a structural component.

The textured region 20 further includes a surrounding portion 32. In embodiments, the surface features 26 are set into the surrounding portion 32. In those embodiments, the surface features 26 are elliptical blind holes that extend down into the thickness 22 of the substrate 12 toward the base-plane 30. In other embodiments, the surface features 26 project from the surrounding portion 32. In those embodiments, the surface features 26 are elliptical pillars that project from the surrounding portion 32 away from the base-plane 30 and toward the external environment 24. The surrounding portion 32 forms a contiguous surface from which the surface features 26 either project from or are set into.

As mentioned, the perimeter 28 of each of the surface features 26 is elliptical—that is, the shape of the perimeter 28 is an ellipsis. Each perimeter 28 thus has a longest dimension 34, which is twice a longest axis from a center 36 of the ellipse. In addition, each perimeter 28 has a width 38, which is twice a shortest axis from the center 36 of the ellipse. The incorporation of the surface features 26 having the perimeter 28 that is elliptical has a meaningful effect on anti-glare performance. Efforts leading to this disclosure also investigated surface features 26 having a circular perimeter 28. Substrates incorporating circular surface features as the textured region tended to produce observable reflection color artifacts upon reflecting ambient light. Comparative Example 1A below further elaborates that point. The surface features 26 with the perimeter 28 that is elliptical, or that incorporate elliptical segments, reflect light with reduced color artifacts, as well as provide beneficial transmission haze, pixel power deviation, and distinctiveness-of-image values.

As mentioned, the surface features 26 are randomly distributed. In other words, the surface features 26 are aligned with each other and the surface features 26 are not arranged in a pattern. For example, the longest dimensions 34 of the surface features 26 are not all parallel with each other (i.e., not all aligned to be extending in the same directions). In addition, no grouping of the surface features 26 is arranged geometrically the same as any other grouping of the surface features 26.

The textured region 20 further includes (i) one or more higher surfaces 40 that reside at a higher mean elevation 42 from the base-plane 30 and (ii) one or more lower surfaces 41 that reside at a lower mean elevation 44 from the base-plane 30. The lower mean elevation 44 is closer to the base-plane 30 than the higher mean elevation 42. The one or more higher surfaces 40 all reside at the same elevation within manufacturing tolerances. The one or more lower surfaces 41 all reside at the same elevation within manufacturing tolerances. In embodiments, the surface features 26 provide the one or more higher surfaces 40 and the surrounding portion 32 provides the one or more lower surfaces 41. In such circumstances, the surface features 26 project from the surrounding portion 32. In embodiments, the surface features 26 provide the one or more lower surfaces 41 and the surrounding portion 32 provides the one or more higher surfaces 42. In such circumstances, the surface features 26 are set into the surrounding portion 32.

In embodiments, the longest dimension 34 of each surface feature 26 is 5 μm, 10 μm, 15 μm, 20 μm, 25 μm, 30 μm, 40 μm, 50 μm, 60 μm, 70 μm, 80 μm, 90 μm, 100 μm, 110 μm, 120 μm, 130 μm, 140 μm, 150 μm, or within any range bounded by any two of those values (e.g., 100 μm to 110 μm, 15 μm to 40 μm, 5 μm to 15 μm, and so on). In embodiments, the longest dimension 34 of each surface features 26, on average, is about 100 μm.

In embodiments, the surface features 26 have a fill-fraction of the textured region 20 of 30%, 40%, 50%, 60%, 70%, or within any range defined by any two of those values (e.g., 40% to 60%, and so on). The perimeter 28 of each surface feature 26 encompasses an area of a planar cross-section of the textured region 20 parallel to the base-plane 30. The sum of the areas of all of the perimeters 28 of all of the surface features 26 divided by the total area of the planar cross-section of the textured region 20 is the "fill-fraction" of the surface features 26. It is believed that a fill-fraction of about 50% suppresses specular reflection. In other words, some the ambient light reflects off the surface features 26, and some of the light reflects off the surrounding portion 32. A fill-fraction of about 50% provides maximum destructive interference between the ambient light reflecting off the surface features 26 and the ambient light reflecting off the surrounding portion 32.

In embodiments, a distance 46 separates the center 36 of one surface feature 26 from the center 36 of the next nearest surface features 26. This document may refer to the distance 46 as "the pitch" of the surface features 26. In embodiments, the average of these distances 46 throughout the textured region 20 is 80 μm, 90 μm, 100 μm, 110 μm, 120 μm, 130 μm, 140 μm, 150 μm, or within any range bounded by any two of those values (e.g., 90 μm to 120 μm, 100 μm to 130 μm, and so on). It is believed that to cause the textured region 20 to reflect light where the peak intensity of reflected light is at a small angle (such as about 0.3 degrees), then the distance 46 separating the centers 36 of the surface features 26 should be within the range of about 90 μm to 120 μm. For example, considering the 550 nm wavelength portion of reflected ambient light, when the distance 46 is 105 μm, then the scattering angle providing the peak intensity of reflected light (at 550 nm wavelength) ought to be 0.3 degrees (because pitch≅wavelength/sin (ə)).

In embodiments, the lower mean elevation 44 provided by the one or more lower surfaces 41 differs from the higher mean elevation 42 provided by the one or more higher surfaces 40 by a distance 48 of 0.05 μm, 0.10 μm, 0.15 μm, 0.20 μm, 0.25 μm, 0.30 μm, 0.35 μm, 0.40 μm, 0.45 μm, 0.50 μm, 0.55 μm, 0.60 μm, 0.65 μm, 0.70 μm or within any range defined by any two of those values (e.g., 0.10 μm to 0.20 μm, 0.05 μm to 0.70 μm, 0.05 μm to 0.60 μm, and so on). When the surface features 26 project from the surrounding portion 32, the difference 48 is a height of the surface features 26 from the surrounding portion 32. When the surface features 26 are set into the surrounding portion 32, the difference 48 is a depth of the surface features 26 from the surrounding portion 32.

Referring now to FIGS. 6-8C, in embodiments of the textured region 20, the surface features 26 include or are separated into larger surface features 26L and smaller surface features 26S. "Larger" and "smaller" here are relative terms meaning that the larger surface features 26L are larger than the smaller surface features 26S. Each larger surface features 26L and each smaller surface feature 26S have a perimeter 28L, 28S, respectively, which is elliptical. Each perimeter 28L, 28S has a longest dimension 34L, 34S, respectively. The longest dimensions 34L of the larger surface features 26L fall within a range of longest dimensions 34L. The longest dimensions 34S of the larger surface features 26S fall within a range of longest dimensions 34S, that are exclusive of the range of longest dimensions 34L of the larger surface features 26L. The longest dimensions 34L of the range of longest dimensions 34L of the larger surface features 26L are longer than the longest dimensions 34S of the range of longest dimensions 34S of the smaller surface features 26S.

As mentioned above, in an attempt to force the intensity of reflected light off the textured region 20 to peak at about 0.3 degrees, the distance 46 between the centers 36 of the surface features 26 ought to be about 105 μm. As additionally mentioned above, to maximize specular reflection suppression via destruction interference, the fill-fraction of the surface features 26 ought to be about 50%. To accommodate both of those criteria, then the longest dimensions 34 of the surface features 26 ought to be 100 μm. However, surface features 26 having such a longest dimension 34 on the 100 μm scale have a tendency to generate relatively high pixel power deviation. The addition of the smaller surface features 26S mitigates that consequence and generally results in a more acceptable, lower, pixel power deviation. The incorporation of the smaller surface features 26S can improve the pixel power deviation compared to if only the larger surface features 26L were incorporated.

In embodiments, the perimeters 28L of the larger surface features 26L totally surround the perimeters 28S of some of the smaller surface features 26S. In embodiments, the perimeters 28S of some or all of the smaller surface features 26S reside entirely outside of the perimeters 28L of the larger surface features 26L. In embodiments, the perimeter 28S of any given smaller surface features 26S partially overlaps with the perimeter 28L of any given larger surface feature 28L, such that (i) part of the perimeter 28S of the smaller surface features 26S is inside the perimeter 28L of the larger surface feature 26L and (ii) part of the perimeter 28S of the smaller surface features 26S is outside the perimeter 28L of the larger surface feature 26L. Further, although not separately illustrated, the smaller surface features 26S, instead of having the perimeter 28S that is elliptical, have the perimeter 28S that can be circular.

As mentioned, in embodiments, the textured region includes the two elevations (see, e.g., FIG. 8C)—the higher mean elevation 42 and the lower mean elevation 44. In embodiments, the larger surface features 26L provide at least a portion of the one or more higher surfaces 40 residing at the higher mean elevation 42. For example, in embodiments, the larger surface features 26L project from the surrounding portion 32, some of the smaller surface features 26S project from the surrounding portion 32, and the remaining smaller surface features 26S, those that do not project from the surrounding portion 32, are set into the larger surface features 26L. In such embodiments, (i) the larger surface features 26L and (ii) the smaller surface features 26S that project from the surrounding portion 32 provide the one or more higher surfaces 40 residing at the higher mean elevation 42. The surrounding portion 32 and the smaller surface features 26S that are set into larger surface features 26L provide the one or more lower surfaces 41 residing at the lower mean elevation 44. Such a configuration can be the result of a one step-etching process. A single etching step etches away the substrate 12 to form all of (i) the larger surface features 26L projecting from the surrounding portion 32, (ii) the smaller surface features 26S projecting from the surrounding portion 32, and (iii) the smaller surface features 26S set into the larger surface features 26L.

In embodiments (not separately illustrated, but the inverse of FIG. 8C), the larger surface features 26L provide at least a portion of the one or more lower surfaces 41 residing at the lower mean elevation 44. For example, in embodiments, the larger surface features 26L are set into the surrounding portion 32, some of the smaller surface features 26S are set into the surrounding portion 32, and the remaining smaller surface features 26S, those that are not set into the surrounding portion 32, project from the larger surface features 26L. In such embodiments, (i) the larger surface features 26L and (ii) the smaller surface features 26S that are set into the surrounding portion 32 provide the one or more lower surfaces 41 residing at the lower mean elevation 44. The surrounding portion 32 and the smaller surface features 26S that project from the larger surface features 26L provide the one or more higher surfaces 40 residing at the higher mean elevation 42. Such a configuration can be the result of a one step-etching process.

In embodiments (see FIGS. 8A and 8B), the textured region 20 further includes one or more intermediate surfaces 43 (e.g., 43a, 43b) that reside at one or more intermediate mean elevations 45 (e.g., 45a, 45b) from the base-plane 30. The one or more intermediate mean elevations 45 (e.g., 45a, 45b) are between the higher mean elevation 42 and the lower mean elevation 44. These embodiments of the textured region 20 thus have surfaces at three or four distinct elevations from the base-plane 30.

For example (see FIG. 8A), in embodiments, the larger surface features 26L provide at least a portion of the one or more higher surfaces 40 residing at the higher mean elevation 42. In these embodiments, the larger surface features 26L project from the surrounding portion 32. The surrounding portion 32 provides the one or more intermediate surfaces 43b that reside at the intermediate elevation 45b. In addition, some of the smaller surface features 26S are set into the surrounding portion 32 and provide the one or more lower surfaces 41 that reside at the lower mean elevation 44. The remaining smaller surface features 26S, those that are not set into the surrounding portion 32, are set into the larger surface features 26L, and provide the one or more intermediate surfaces 43a residing at the intermediate mean elevation 45a. Such a configuration can be the result of a two-step etching process. A first etching step etches away the substrate 12 to form the surrounding portion 32 and the larger surface features 26L projecting therefrom. A second etching step etches away the substrate 12 to form the smaller surface features 26S set into the larger surface features 26L and the surrounding portion 32.

Note that, when the depth of substrate 12 removed during the second etching step is equal to the depth of substrate 12 that was removed during the first etching step, the textured region 20 would only include three distinct elevations—the higher mean elevation 42, the lower mean elevation 44, and a single intermediate mean elevation 45. As applied to the example of FIG. 8A, both the smaller surface features 26S set into the larger surface features 26L and the surrounding portion 32 would provide the one or more intermediate surfaces 43 residing at the single intermediate mean elevation 45.

As another example (see FIG. 8B), the larger surface features 26L provide at least a portion of the one or more lower surfaces 41 disposed at the lower mean elevation 44. In these embodiments, the larger surface features 26L are set into the surrounding portion 32. The surrounding portion 32 provides the one or more intermediate surfaces 43b disposed at the intermediate mean elevation 45b. In addition, some of the smaller surface features 26S project from the larger surface features 26L, and provide the one or more intermediate surfaces 43a disposed at the intermediate mean elevation 45a. The remaining smaller surface features 26S, those that do not project from the from the larger surface features 26L, project from the surrounding portion 32, and provide the one or more higher surfaces 40 residing at the higher mean elevation 42. Again, the textured region 20 includes four distinct elevations 42, 45a, 45b, and 44. Such a configuration can be the result again of a two-step etching process. A first etching step etches away the substrate 12 to form the larger surface features 26L set into the surrounding portion 32. A second etching step etches away the substrate 12 to form the smaller surface features 26S projecting from the larger surface features 26L and the surrounding portion 32. Note that, when the depth of substrate 12 removed during the second etching step is equal to the depth of substrate 12 that was removed during the first etching step, the textured region 20 would only include three distinct elevations—the higher mean elevation 42, the lower mean elevation 44, and a single intermediate mean elevation 45.

In embodiments, in additional reference to FIGS. 9A-10D, the textured region 20 includes a first portion 58 and a second portion 60. Either the first portion 58 or the second portion 60 provides the one or more higher surfaces 40 residing at the higher mean elevation 42. The other of the first portion 58 and the second portion 60 provides the one or more lower surfaces 41 residing at the lower mean elevation 44. The textured region 20 in these embodiments thus provide two distinct elevations 42, 44. The first portion 58 is everything colored white in the examples of FIGS. 9A-10B and the second portion 60 is everything colored black. The opposite scenario is just as valid—the first portion 58 could be everything that is black and the second portion 60 could be everything that is white.

Figure 9A:
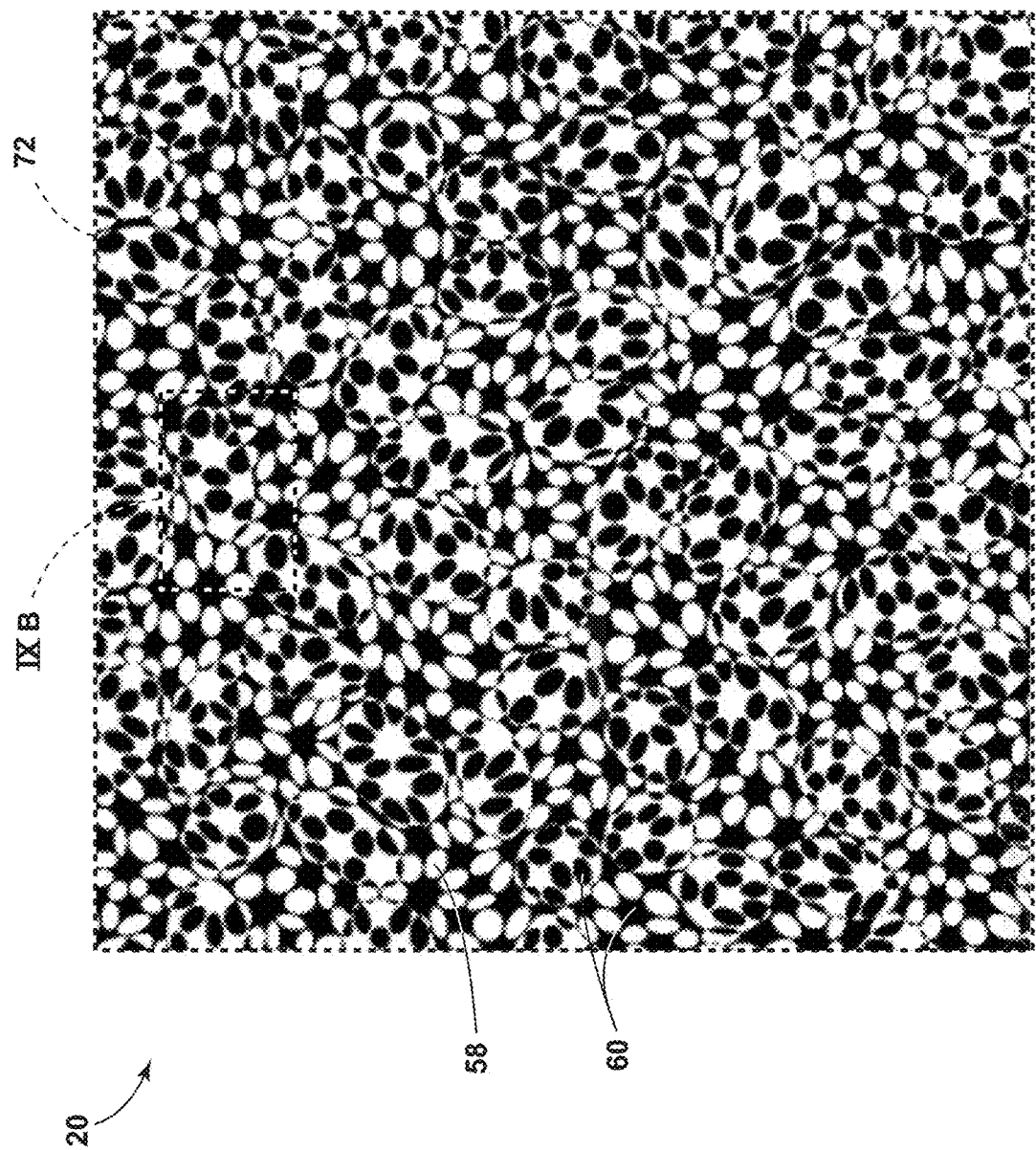
FIGS. 9A and 9B are magnified illustrations of a portion of an embodiment of the textured region of FIG. 1, illustrating a first portion at a first elevation from the base-plane and a second portion at a second elevation from the base-plane, both incorporating elliptical surface features or segments thereof, a consequence of superimposing a first random distribution of larger ellipses and a second random distribution of smaller ellipses.
Figure 9B:
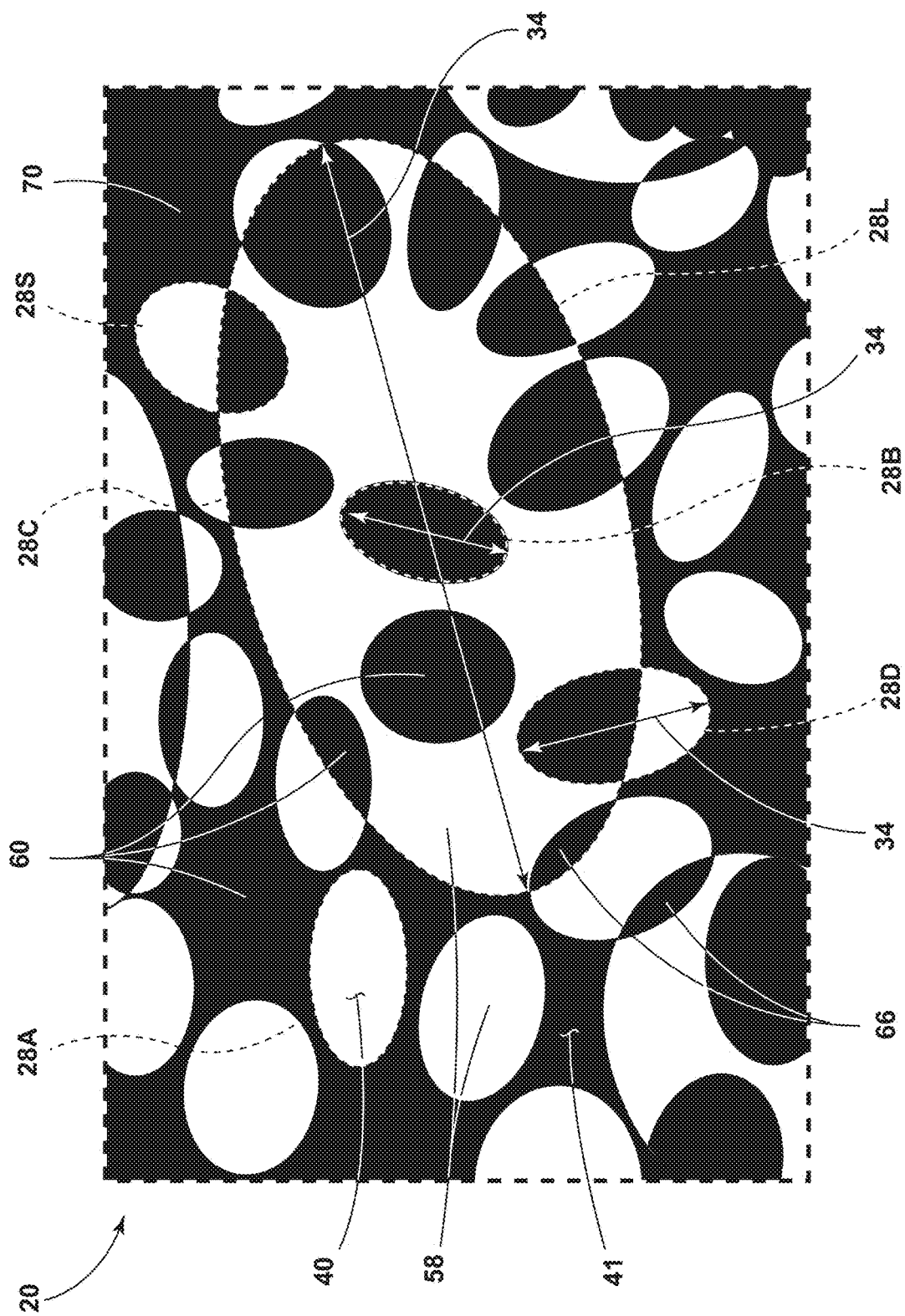
Figure 10A:
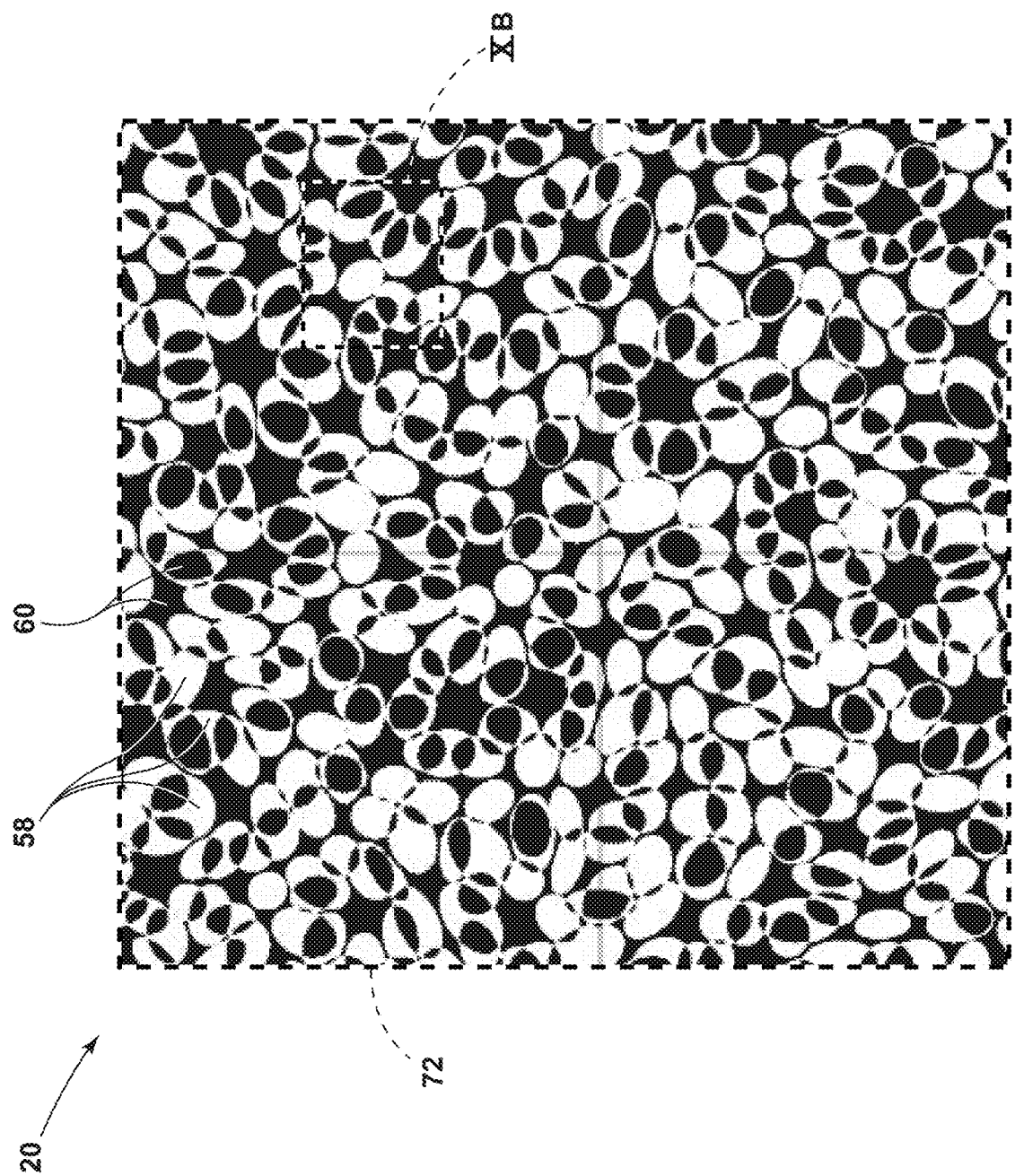
FIGS. 10A and 10B are like FIGS. 9A and 9B but are a consequence of superimposing larger ellipses that are closer in size to the smaller ellipses than at FIGS. 9A and 9B.
Figure 10B:
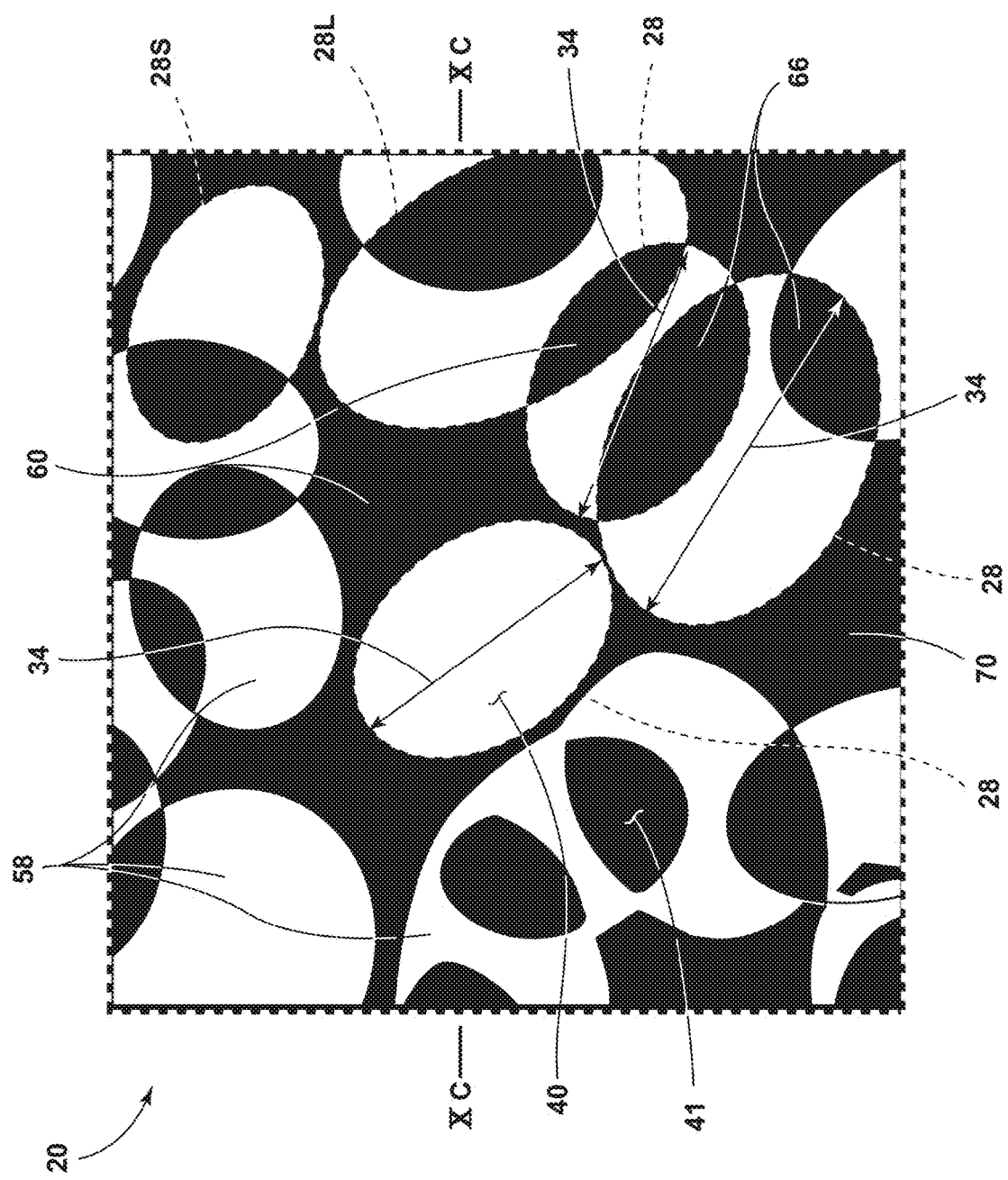

As perhaps best illustrated in FIGS. 9B and 10B, elliptical perimeters 28 define the first portion 58, except for overlapping portions 66 of the elliptical perimeters 28. Two ellipses 28 in a plane are said to overlap if their area intersection is non-empty. The overlapping portions 66 of the elliptical perimeters 28 define, in part, the second portion 60. For example, referring specifically to FIG. 9B, elliptical perimeter 28A does not overlap any other elliptical perimeter 28. Thus, everything that the elliptical perimeter 28A bounds is part of the first portion 58. Moving to perimeter 28B, perimeter 28B is entirely overlapped (i.e., surrounded) by perimeter 28C. Thus, everything that the elliptical perimeter 28B bounds is part of the second portion 60. Now considering perimeter 28D, perimeter 28D only partially overlaps with perimeter 28C—part of perimeter 28D is inside perimeter 28C and part of perimeter 28D is outside perimeter 28C. The part of perimeter 28D that is outside perimeter 28C is not an overlapping portion 66 and thus forms part of the first portion 58. However, the part of perimeter 28D that is inside perimeter 28C is an overlapping portion and thus forms part of the second portion 60. Finally, looking at perimeter 28C, perimeter 28C fully overlaps perimeter 28B, partially overlaps perimeter 28D, and fully or partially overlaps several other perimeters. Those portions of perimeter 28C, overlapping other perimeters 28, form part of the second portion 60. The remainder of perimeter 28C does not overlap any other perimeter 28 and thus forms part of the first portion 58.

In addition to the overlapping portions 66 of the elliptical perimeters 28, the second portion 60 of the textured region 20 further comprises any part of the textured region 20 that is not the first portion 58. More specifically, any parts 70 of the textured region 20 outside of any of the elliptical perimeters 28 form part of the second portion 60.

Like the embodiments previously discussed, each of the elliptical perimeters 28 of the textured region 20 is randomly distributed and randomly oriented. Each of the elliptical perimeters 28 comprises a longest dimension 34. The longest dimensions 34 of the elliptical perimeters 28 are not all parallel to each other. Thus, the longest dimensions 34 of the elliptical perimeters 28 are not all commonly aligned. The random distribution and orientation of the elliptical perimeters 28 and lack of pattern prevent or reduce the ability of the textured region 20 to generate Moiré interference fringes and other optical distortions upon reflecting ambient light.

As mentioned, referring to FIGS. 10C and 10D, either the first portion 58 or the second portion 60 provides the one or more higher surfaces 40 residing at the higher mean elevation 42, while the other of the first portion 58 and the second portion 60 provides the one or more lower surfaces 41 residing at the lower mean elevation 44. In embodiments, such as illustrated at FIG. 10C, the first portion 58 provides the one or more higher surfaces 40 residing at the higher mean elevation 42. The second portion 60 provides the one or more lower surfaces 41 residing at the lower mean elevation 44. Stated another way, in these embodiments, the first portion 58 projects out toward the external environment 24 from the second portion 60.

In other embodiments, such as illustrated at FIG. 10D, the first portion 58 provides the one or more lower surfaces 41 residing at the lower mean elevation 42. The second portion 60 provides the one or more higher surfaces 40 residing at the higher mean elevation 44. Stated another way, in these embodiments, the second portion 60 projects out toward the external environment 24 from the first portion 58.

The higher mean elevation 44 differs from the lower mean elevation 42, in these embodiments with the first portion 58 and the second portion 60, by the distance 48, which again is 0.05 µm, 0.10 µm, 0.15 µm, 0.20 µm, 0.25 µm, 0.30 µm, 0.35 µm, 0.40 µm, 0.45 µm, 0.50 µm, 0.55 µm, 0.60 µm, 0.65 µm, 0.70 µm or within any range defined by any two of those values (e.g., 0.10 µm to 0.20 µm, 0.05 µm to 0.70 µm, 0.05

μm to 0.60 μm, and so on). A one-step etching process can produce embodiments including the first portion 58 and the second portion 60 as described.

In embodiments, the elliptical perimeters 28 are divided by size into two different subsets—larger elliptical perimeters 28L and smaller elliptical perimeters 28S, which are smaller than the larger elliptical perimeters 28L. The larger elliptical perimeters 28L are larger than the smaller elliptical perimeters 28L in the sense that the longest dimensions 34 of the larger elliptical perimeters 28L are part of a range of longest dimensions 34 that is longer than a range of longest dimensions 34 of which the longest dimensions 34 of the smaller elliptical perimeters 28S are a part. For example, referring to FIG. 9B, the longest dimension 34 of perimeter 28C, belonging to the larger elliptical perimeters 28L, is longer than the longest dimensions 34 of perimeters 28A, 28B, and 28D, which all belong to the smaller elliptical perimeters 28S. The first portion 58 of the textured region 20 having the first elevation 62 from the base-plane 30 is bounded by (i) the smaller elliptical perimeters 28S that do not overlap or intersect with the larger elliptical perimeters 28L, (ii) portions of the smaller elliptical perimeters 28S outside of the first elliptical perimeters 28S that partially overlap with the larger elliptical perimeters 28L, and (iii) portions of the larger elliptical perimeters 28L that do not overlap with the smaller elliptical perimeters 28S. The second portion 60 of the textured region 20 residing at the second elevation 64 is everything else that is not the first portion 58 of the textured region 20.

As discussed above, incorporation of relatively large surface features 28 that are spaced relatively far apart but with a fill-factor of about 50% can force intensity of reflected light to peak at about 0.3 degrees while maximizing interferometric suppression of specular reflection. However, the same result can be achieved if relatively small surface features 26 of two size ranges are utilized and the difference between the two size ranges is relatively small.

In embodiments, as illustrated at FIGS. 9A and 9B, at least some of the larger elliptical perimeters 28L entirely encompass more than one of the smaller elliptical perimeters 28S. Note that in some embodiments, such as that illustrated at FIG. 6, at least some of the larger elliptical perimeters 28L encompass more than one of the smaller elliptical perimeters 28S but without any of the larger elliptical perimeters 28S only partially overlapping any of the smaller elliptical perimeters 28S. The elimination of smaller elliptical perimeters 28S that would only partially overlap the larger elliptical perimeter 28L is thought to reduce large angle scattering of reflected light. Large angle scattering can increase haze. In addition, the lithography masks that incorporate the designs that permit etching of such a textured region 20 have a resolution limit—too small a structure, such as where a small elliptical perimeter 28S only partially overlaps a larger elliptical perimeter 28L, can cause aliasing if sampled with insufficient resolution.

In embodiments, a fill-fraction of the larger elliptical perimeters 28L is within a range of 40% to 60%, while a fill-fraction of the smaller elliptical perimeters 28S is within a range of 10% to 30%. The textured region 20 occupies an area 72. The fill-fraction of the larger elliptical perimeters 28L here is the percentage of the area 72 encompassed by all of the larger elliptical perimeters 28L. The fill-fraction of the smaller elliptical perimeters 28S here is the percentage of the area 72 encompassed by all of smaller elliptical perimeters 28S. The smaller elliptical perimeters 28S having a lower fill-fraction limits the impact of the smaller elliptical perimeters 28S on the scattering spectrum of the overall design of the textured region 20.

In embodiments (see, e.g., FIG. 3), the textured region 20 further includes one or more sections 80 that have secondary surface features 82. The secondary surface features 82 impart a surface roughness to the one or more sections 80 of the textured region 20. The increased surface roughness imparts surface scattering to the textured region 20, which generally lowers pixel power deviation and distinctness of image. The surface roughness imparted is 5 nm, 10 nm, 15 nm, 20 nm, 25 nm, 30 nm, 35 nm, 40 nm, 45 nm, 50 nm, 55 nm, 60 nm, 65 nm, 70 nm, 80 nm, 90 nm, or 100 nm or within any range bounded by any two of those values (e.g., 5 nm to 100 nm, and so on). As used herein, surface roughness ($R_a$) is measured with an atomic force microscope, such as an atomic force microscope controlled by a NanoNavi control station distributed by Seiko Instruments Inc. (Chiba, Japan), with a scan size of 5 μm by 5 μm. Surface roughness ($R_a$), as opposed to other types of surface roughness values such as $R_q$, is the arithmetical mean of the absolute values of the deviations from a mean line of the measured roughness profile.

In embodiments, the one or more sections 80 that include the secondary surface features 50 include the one or more higher surfaces 40, the one or more lower surfaces 41, and if present, the one or more intermediate surfaces 43a, 43b. In embodiments, the secondary surface features 82 are disposed on the surface features 26 but not the surrounding portion 32. In embodiments, the secondary surface features 82 are disposed on the surrounding portion 32 but not the surface features 26. In embodiments, the secondary surface features 82 are disposed on both the surrounding portion 32 and the surface features 26. In embodiments, the secondary surface features 82 are disposed on the first portion 58 and not the second portion 60, or vise-versa. In embodiments, the secondary surface features 82 are disposed on the first portion 58 and the second portion 60. In embodiments, the one or more sections 80 that includes the secondary surface features 82 is coextensive with the textured region 20 meaning that the secondary surface features 82 are disposed throughout the entirety of the textured region 20. In embodiments, the surface roughness ($R_a$) imparted by the second surface features 82 at the surface features 26 is less than the surface roughness at the surrounding portion 32.

In embodiments, the substrate 12 includes a glass substrate or a glass-ceramic substrate. In embodiments, the substrate 12 is a multi-component glass composition having about 40 mol % to 80 mol % silica and a balance of one or more other constituents, e.g., alumina, calcium oxide, sodium oxide, boron oxide, etc. In some implementations, the bulk composition of the substrate 12 is selected from the group consisting of aluminosilicate glass, a borosilicate glass, and a phosphosilicate glass. In other implementations, the bulk composition of the substrate 12 is selected from the group consisting of aluminosilicate glass, a borosilicate glass, a phosphosilicate glass, a soda lime glass, an alkali aluminosilicate glass, and an alkali aluminoborosilicate glass. In further implementations, the substrate 12 is a glass-based substrate, including, but not limited to, glass-ceramic materials that comprise a glass component at about 90% or greater by weight and a ceramic component. In other implementations of the display article 10, the substrate 12 can be a polymer material, with durability and mechanical properties suitable for the development and retention of the textured region 20.

In embodiments, the substrate 12 has a bulk composition that comprises an alkali aluminosilicate glass that comprises alumina, at least one alkali metal and, in some embodiments, greater than 50 mol % $SiO_2$, in other embodiments, at least 58 mol % $SiO_2$, and in still other embodiments, at least 60 mol % $SiO_2$, wherein the ratio ($Al_2O_3$ (mol %) $B_2O_3$ (mol %))/Σ alkali metal modifiers (mol %)>1, where the modifiers are alkali metal oxides. This glass, in particular embodiments, comprises, consists essentially of, or consists of: about 58 mol % to about 72 mol % $SiO_2$; about 9 mol % to about 17 mol % $Al_2O_3$; about 2 mol % to about 12 mol % $B_2O_3$; about 8 mol % to about 16 mol % $Na_2O$; and 0 mol % to about 4 mol % $K_2O$, wherein the ratio ($Al_2O_3$ (mol %)+$B_2O_3$ (mol %))/Σ alkali metal modifiers (mol %)>1, where the modifiers are alkali metal oxides.

In embodiments, the substrate 12 has a bulk composition that comprises an alkali aluminosilicate glass comprising, consisting essentially of, or consisting of: about 61 mol % to about 75 mol % $SiO_2$; about 7 mol % to about 15 mol % $Al_2O_3$; 0 mol % to about 12 mol % $B_2O_3$; about 9 mol % to about 21 mol % $Na_2O$; 0 mol % to about 4 mol % $K_2O$; 0 mol % to about 7 mol % MgO; and 0 mol % to about 3 mol % CaO.

In embodiments, the substrate 12 has a bulk composition that comprises an alkali aluminosilicate glass comprising, consisting essentially of, or consisting of: about 60 mol % to about 70 mol % $SiO_2$; about 6 mol % to about 14 mol % $Al_2O_3$; 0 mol % to about 15 mol % $B_2O_3$; 0 mol % to about 15 mol % $Li_2O$; 0 mol % to about 20 mol % $Na_2O$; 0 mol % to about 10 mol % $K_2O$; 0 mol % to about 8 mol % MgO; 0 mol % to about 10 mol % CaO; 0 mol % to about 5 mol % $ZrO_2$; 0 mol % to about 1 mol % $SnO_2$; 0 mol % to about 1 mol % $CeO_2$; less than about 50 ppm $As_2O_3$; and less than about 50 ppm $Sb_2O_3$; wherein 12 mol %≤$Li_2O+Na_2O+K_2O$≤20 mol % and 0 mol %≤MgO+Ca≤10 mol %.

In embodiments, the substrate 12 has a bulk composition that comprises an alkali aluminosilicate glass comprising, consisting essentially of, or consisting of: about 64 mol % to about 68 mol % $SiO_2$; about 12 mol % to about 16 mol % $Na_2O$; about 8 mol % to about 12 mol % $Al_2O_3$; 0 mol % to about 3 mol % $B_2O_3$; about 2 mol % to about 5 mol % $K_2O$; about 4 mol % to about 6 mol % MgO; and 0 mol % to about 5 mol % CaO, wherein: 66 mol %≤$SiO_2+B_2O_3+CaO$≤69 mol %; $Na_2O+K_2O+B_2O_3+MgO+CaO+SrO$>10 mol %; 5 mol %≤$MgO+CaO+SrO$≤8 mol %; ($Na_2O+B_2O_3$)—$Al_2O_3$≤2 mol %; 2 mol %≤$Na_2O_3Al_2O_3$≤6 mol %; and 4 mol %≤($Na_2O+K_2O$)—$Al_2O_3$≤10 mol %.

In embodiments, the substrate 12 has a bulk composition that comprises $SiO_2$, $Al_2O_3$, $P_2O_5$, and at least one alkali metal oxide ($R_2O$), wherein 0.75>[($P_2O_5$ (mol %)+$R_2O$ (mol %))/$M_2O_3$ (mol %)]≤1.2, where $M_2O_3=Al_2O_3+B_2O_3$. In embodiments, [($P_2O_3$ (mol %)+$R_2O$ (mol %))/$M_2O_3$ (mol %)]=1 and, in embodiments, the glass does not include $B_2O_3$ and $M_2O_3=Al_2O_3$. The substrate 12 comprises, in embodiments: about 40 to about 70 mol % $SiO_2$; 0 to about 28 mol % $B_2O_3$; about 0 to about 28 mol % $Al_2O_3$; about 1 to about 14 mol % $P_2O_5$; and about 12 to about 16 mol % $R_2O$. In some embodiments, the glass substrate comprises: about 40 to about 64 mol % $SiO_2$; 0 to about 8 mol % $B_2O_3$; about 16 to about 28 mol % $Al_2O_3$; about 2 to about 12 mol % $P_2O_5$; and about 12 to about 16 mol % $R_2O$. The substrate 12 may further comprise at least one alkaline earth metal oxide such as, but not limited to, MgO or CaO.

In some embodiments, the substrate 12 has a bulk composition that is substantially free of lithium; i.e., the glass comprises less than 1 mol % $Li_2O$, in other embodiments, less than 0.1 mol % $Li_2O$ and, in other embodiments, 0.01 mol % $Li_2O$, and in still other embodiments, 0 mol % $Li_2O$. In some embodiments, such glasses are free of at least one of arsenic, antimony, and barium; i.e., the glass comprises less than 1 mol % and, in other embodiments, less than 0.1 mol %, and in still other embodiments, 0 mol % of $As_2O_3$, $Sb_2O_3$, and/or BaO.

In embodiments, the substrate 12 has a bulk composition that comprises, consists essentially of or consists of a glass composition, such as Corning® Eagle XG® glass, Corning® Gorilla® glass, Corning® Gorilla® Glass 2, Corning® Gorilla® Glass 3, Corning® Gorilla® Glass 4, or Corning® Gorilla® Glass 5.

In embodiments, the substrate 12 has an ion-exchangeable glass composition that is strengthened by either chemical or thermal means that are known in the art. In embodiments, the substrate 12 is chemically strengthened by ion exchange. In that process, metal ions at or near the primary surface 18 of the substrate 12 are exchanged for larger metal ions having the same valence as the metal ions in the substrate 12. The exchange is generally carried out by contacting the substrate 12 with an ion exchange medium, such as, for example, a molten salt bath that contains the larger metal ions. The metal ions are typically monovalent metal ions, such as, for example, alkali metal ions. In one non-limiting example, chemical strengthening of a substrate 12 that contains sodium ions by ion exchange is accomplished by immersing the substrate 12 in an ion exchange bath comprising a molten potassium salt, such as potassium nitrate ($KNO_3$) or the like. In one particular embodiment, the ions in the surface layer of the substrate 12 contiguous with the primary surface 18 and the larger ions are monovalent alkali metal cations, such as $Li^+$ (when present in the glass), $Na^+$, $K^+$, $Rb^+$, and $Cs^+$. Alternatively, monovalent cations in the surface layer of the substrate 12 may be replaced with monovalent cations other than alkali metal cations, such as $Ag^+$ or the like.

In such embodiments, the replacement of small metal ions by larger metal ions in the ion exchange process creates a compressive stress region in the substrate 12 that extends from the primary surface 18 to a depth (referred to as the "depth of layer") that is under compressive stress. This compressive stress of the substrate 12 is balanced by a tensile stress (also referred to as "central tension") within the interior of the substrate 12. In some embodiments, the primary surface 18 of the substrate 12 described herein, when strengthened by ion exchange, has a compressive stress of at least 350 MPa, and the region under compressive stress extends to a depth, i.e., depth of layer, of at least 15 μm below the primary surface 18 into the thickness 22.

Ion exchange processes are typically carried out by immersing the substrate 12 in a molten salt bath containing the larger ions to be exchanged with the smaller ions in the glass. It will be appreciated by those skilled in the art that parameters for the ion exchange process, including, but not limited to, bath composition and temperature, immersion time, the number of immersions of the glass in a salt bath (or baths), use of multiple salt baths, additional steps such as annealing, washing, and the like, are generally determined by the composition of the glass and the desired depth of layer and compressive stress of the glass as a result of the strengthening operation. By way of example, ion exchange of alkali metal-containing glasses may be achieved by immersion in at least one molten bath containing a salt, such as, but not limited to, nitrates, sulfates, and chlorides, of the larger alkali metal ion. The temperature of the molten salt bath typically is in a range from about 380° C. up to about 450° C., while immersion times range from about 15 minutes up to about 16 hours. However, temperatures and immersion times different from those described above may also be used. Such ion exchange treatments, when employed with a substrate 12 having an alkali aluminosilicate glass composition, result in a compressive stress region having a depth (depth of layer) ranging from about 10 µm up to at least 50 µm, with a compressive stress ranging from about 200 MPa up to about 800 MPa, and a central tension of less than about 100 MPa.

As the etching processes that can be employed to create the textured region 20 of the substrate 12 can remove alkali metal ions from the substrate 12 that would otherwise be replaced by a larger alkali metal ion during an ion exchange process, a preference exists for developing the compressive stress region in the display article 10 after the formation and development of the textured region 20.

In embodiments, the display article 10 exhibits a pixel power deviation ("PPD"). The details of a measurement system and image processing calculation used to obtain PPD values described in U.S. Pat. No. 9,411,180 entitled "Apparatus and Method for Determining Sparkle," and the salient portions of which are related to PPD measurements are incorporated by reference herein in their entirety. Further, unless otherwise noted, the SMS-1000 system (Display-Messtechnik & Systeme GmbH & Co. KG) is employed to generate and evaluate the PPD measurements of this disclosure. The PPD measurement system includes: a pixelated source comprising a plurality of pixels (e.g., a Lenovo Z50 140 ppi laptop), wherein each of the plurality of pixels has referenced indices i and j; and an imaging system optically disposed along an optical path originating from the pixelated source. The imaging system comprises: an imaging device disposed along the optical path and having a pixelated sensitive area comprising a second plurality of pixels, wherein each of the second plurality of pixels is referenced with indices m and n; and a diaphragm disposed on the optical path between the pixelated source and the imaging device, wherein the diaphragm has an adjustable collection angle for an image originating in the pixelated source. The image processing calculation includes: acquiring a pixelated image of the transparent sample, the pixelated image comprising a plurality of pixels; determining boundaries between adjacent pixels in the pixelated image; integrating within the boundaries to obtain an integrated energy for each source pixel in the pixelated image; and calculating a standard deviation of the integrated energy for each source pixel, wherein the standard deviation is the power per pixel dispersion. As used herein, all PPD values, attributes and limits are calculated and evaluated with a test set-up employing a display device having a pixel density of 140 pixels per inch (PPI). In embodiments, the display article 10 exhibits a PPD of 0.8%, 0.9%, 1.0%, 1.1%, 1.2%, 1.3%, 1.4%, 1.5%, 1.6%, 1.7%, 1.8%, 1.9%, 2.0%, 2.25%, 2.5%, 2.75%, 3.0%, 3.25%, 3.5%, 3.75%, 4.0%, 4.25%, 4.5%, 4.75%, 5.0%, 5.25%, 5.5%, 5.75%, 6.0%, or within any range bounded by any two of those values (e.g., 0.8% to 2.0%, 0.9% to 2.25%, 2.0% to 6.0%, and so on). In embodiments, the display article 10 exhibits a PPD of less than 2.0%.

In embodiments, the substrate 12 exhibits a distinctness-of-image ("DOI"). As used herein, "DOI" is equal to 100*$(R_S-R_{0.3°})/R_S$, where $R_S$ is the first surface specular reflectance flux measured from incident light (at 20° from normal) directed onto the textured region 20, and $R_{0.3}$ is the reflectance flux measured from the same incident light at 0.3° from the specular reflectance flux, $R_S$. The sample is optically coupled to flat black glass with index-matching oil on the back side to eliminate second-surface reflections. Unless otherwise noted, the DOI values and measurements reported in this disclosure are obtained according to the ASTM D5767-18, entitled "Standard Test Method for Instrumental Measurement of Distinctness-of-Image (DOI) Gloss of Coated Surfaces using a Rhopoint IQ Gloss Haze & DOI Meter" (Rhopoint Instruments Ltd.). In embodiments, the substrate 12 exhibits a distinctness-of-image ("DOI") of 15%, 20%, 25%, 30%, 35%, 40%, 45%, 50%, 55%, 60%, 65%, 70%, 75%, 80%, 85%, 90%, 95%, 96%, or within any range bounded by any two of those values (e.g., 20% to 40%, 10% to 96%, 35% to 60%, and so on).

In embodiments, the substrate 12 exhibits a transmission haze. As used herein, the term "transmission haze" refers to the percentage of transmitted light scattered outside an angular cone of about ±2.5° in accordance with ASTM D1003, entitled "Standard Test Method for Haze and Luminous Transmittance of Transparent Plastics," the contents of which are incorporated by reference herein in their entirety. Note that although the title of ASTM D1003 refers to plastics, the standard has been applied to substrates comprising a glass material as well. For an optically smooth surface, transmission haze is generally close to zero. In embodiments, the substrate 12 exhibits a transmission haze of 0.3%, 0.4%, 0.5%, 0.6%, 0.7%, 0.8%, 0.9%, 1.0%, 1.5%, 2%, 3%, 4%, 5%, 6%, 7%, 8%, 9%, 10%, 12.5%, 15%, or within any range bounded by any two of those values (e.g., 0.3% to 15%, 0.9% to 1.0%, and so on).

Figure 11:
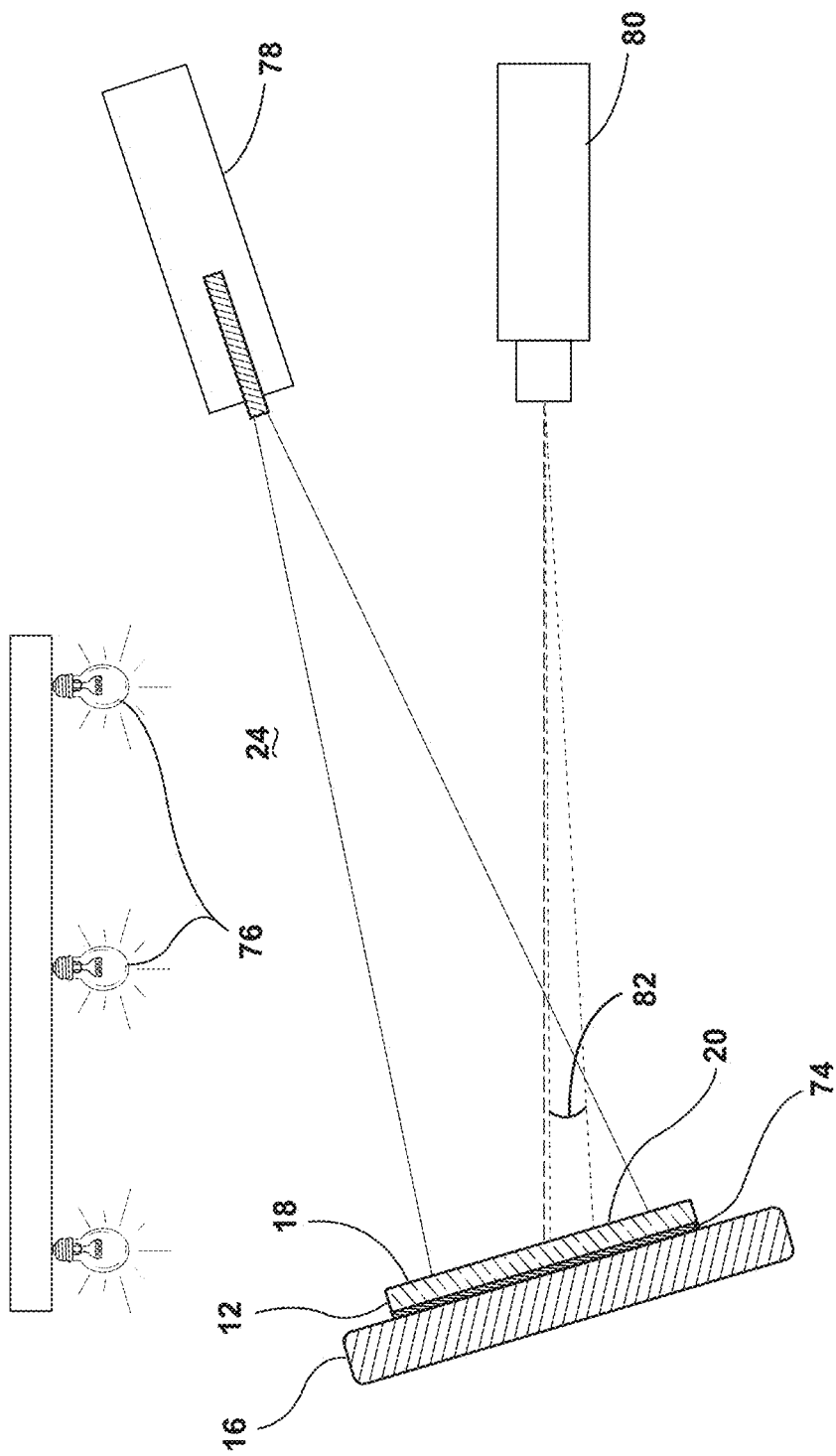
FIG. 11 is a schematic diagram of a set-up used to measure a color shift of ambient light reflecting off the textured region of FIG. 1.

As used herein, "corrected color shift" is a measure of the amount of reflection color artifacts that the substrate 12 generates while reflecting ambient light from the textured region 20. Referring now to FIG. 11, to determine the corrected color shift, the substrate 12 with the textured region 20 to be tested is placed over the display 16, with oil 74 disposed between the substrate 12 and the display 16 to suppress the light reflections of the surface of the substrate 12 facing the display 16 and the surface of the display 16. The oil 74 has a refractive index matching a refractive index of the substrate 12. Room lights 76 emit light as they normally would. A white light source 78 illuminates the substrate 12. The textured region 20 of the substrate 12 faces toward the white light source 78. Since the reflection color artifacts of the substrate 12 are much more easily observed and are more accurately measured when the display 16 is turned off, the display 16 is switched-off when color separation measurements are conducted. The textured region 20 reflects a portion of the light that the white light source 78 emits as a scatted light pattern. A color CCD camera 80 captures an image of the scattered light pattern. The image is then digitally processed, and chromaticity coefficients ($C_x$ and $C_y$) along a selected straight line through the locations with maximum $C_x$ (or $C_y$) and minimum $C_x$ (or $C_y$) are calculated. Here, chromaticity coefficients $C_x$ and $C_y$ are defined as $C_x=P_R/(P_R+P_G+P_B)$ and $C_y=P_G/(P_R+P_G+P_B)$ respectively, in which $P_R$, $P_G$, and $P_B$ are the powers (or intensities) of red, green, and blue light, respectively, at a location of the scattered light pattern detected by the color CCD camera 80. Chromaticity is an objective specification of the quality of a color regardless of its luminance. The color shifts along the selected line, $\Delta C_x$ and $\Delta C_y$, are calculated as the difference between the maximum $C_x$ and the minimum $C_x$ for $LC_x$, and the difference between the maximum $C_y$ and the minimum $C_y$ for $\Delta C_y$. The color shifts $\Delta C_x$ and $\Delta C_y$ are then corrected to account for the fact that the visibility of color change that human eyes see is relative to not only the color shifts ($\Delta C_x$ and $\Delta C_y$) but also an angle separation 82 between the locations of the maximum and minimum $C_x$ (for $\Delta C_x$) and the maximum and minimum $C_y$ (for $\Delta C_y$). These corrected colors shifts are defined as $$\Delta C_{x\_corrected} = \frac{d\theta_r}{d\theta_x}\Delta C_x$$

$$\Delta C_{y\_corrected} = \frac{d\theta_r}{d\theta_y}\Delta C_y$$

The $d\theta_r$ is reference angle separation arbitrarily set at $d\theta_r$=0.84 degrees. This reference angle is chosen from the angle between two adjacent measurement points of 455 point color and luminance measurement of a 300×110 mm display viewed at 500 mm distance. The $d\theta_x$ and $d\theta_y$ are the angle separations in degree between the locations of maximum and minimum for $C_x$ and $C_y$, respectively. When the corrected color shifts $\Delta C_{x\_corrected}$ and $\Delta C_{y\_corrected}$ are each less than 0.3, it is assumed that human eyes cannot perceive any reflection color artifacts that the substrate 12 is producing. In embodiments, the substrate 12 exhibits corrected color shifts $\Delta C_{x\_corrected}$ and $\Delta C_{y\_corrected}$ of 0.00, 0.01, 0.05, 0.1, 0.2, 0.3, 0.4, 0.5, 0.6, or within any range bounded by any two of those values (0.01 to 0.3, 0.05 to 1.0, and so on). In embodiments, the substrate 12 exhibits corrected color shifts $\Delta C_{x\_corrected}$ and $\Delta C_{y\_corrected}$ of less than 0.3, less than 0.2, less than 0.1, or even 0.0.

In embodiments, the substrate 12 exhibits a specular reflectance of 5%, 10%, 15%, 20%, 25%, 30%, 35%, 40, 45%, 50%, 55%, 60%, or 65%, or within any range bounded by any two of those values (e.g., 5% to 65%, 5% to 30%, and so on). In embodiments, the substrate 12 exhibits a specular reflectance that is less than 30%, less than 25%, less than 20%, or less than 10%. Specular reflectance here, noted as "c-Rspec" in the Examples that follow, refers to the value obtained using a Rhopoint IQ goniophotometer, and are reported in gloss units (GU). 100 gloss units is defined to be the specular reflection intensity from a highly polished piece of flat black glass with refractive index 1.567. The values are indicative of how much specular reflection is measured when the sample is optically coupled with oil to a black glass of matching index to remove second-surface reflections.

Figure 12:
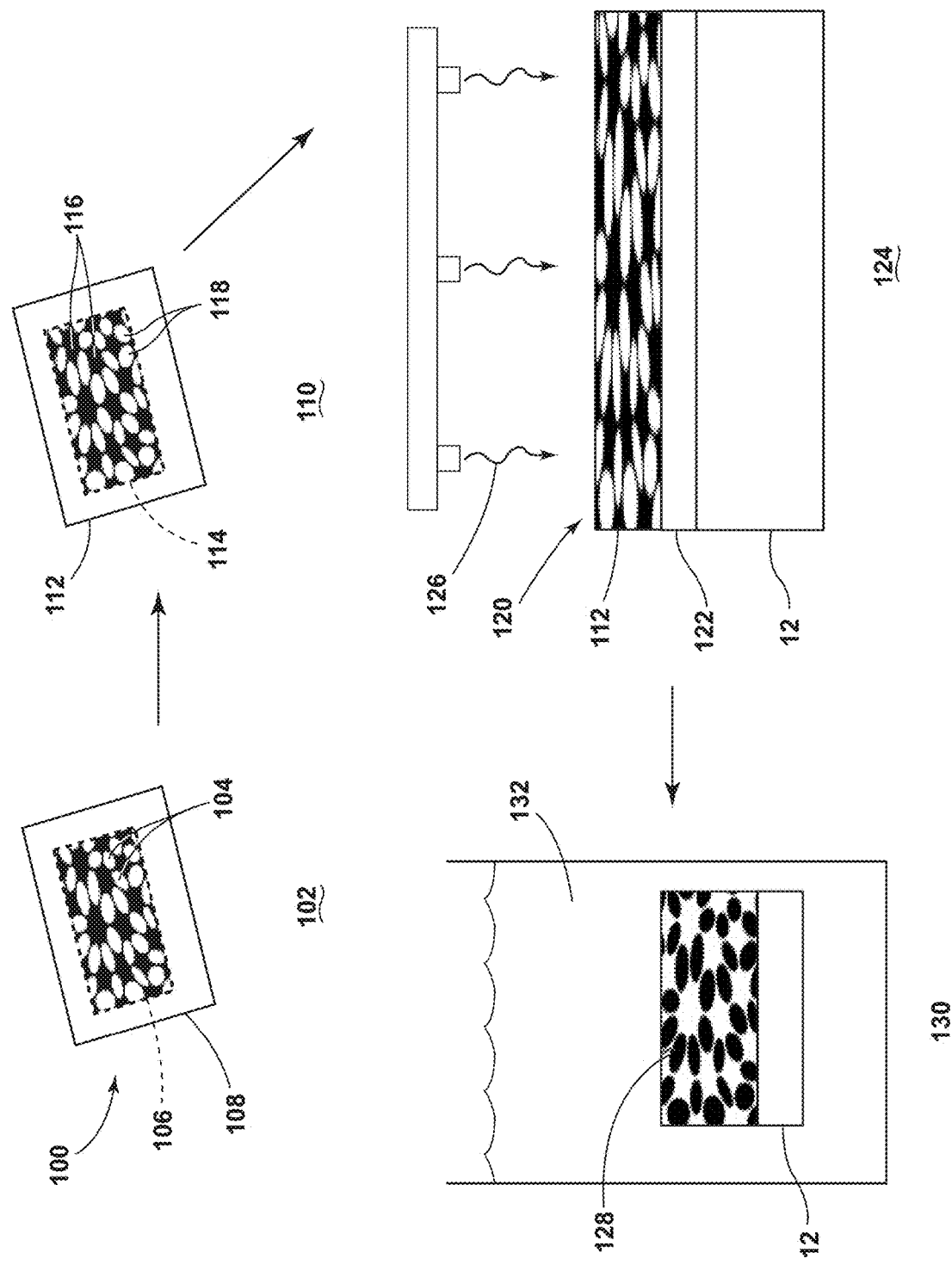
FIG. 12 is a schematic flow chart of a method of forming an embodiment of the textured region of FIG. 1, illustrating steps of randomly distributing ellipses within an area, forming a lithography mask that incorporates the design of the area as a positive or a negative, forming an etching mask that incorporates the design of the area as a positive or negative on the substrate by using the lithography mask to selectively cure lithography ink, and then etching the substrate with the etching mask to form the textured region as either a positive or a negative of the area with the randomly distributed ellipses.

Referring now to FIG. 12, a method 100 of forming the textured region 20 of the substrate 12 of the display article 10 is herein described. At a step 102, the method 100 includes generating a random distribution of ellipses 104 within an area 106 of a plane 108.

At a step 110, the method 100 further includes preparing a lithography mask 112. The design of the lithography mask 112 matches the random distribution of ellipses 104 generated at the step 102. The lithography mask 112 has an area 114. The area 114 matches the area 112 of the plane 108 within which the ellipses 104 were randomly distributed. The lithography mask 112 includes material 116 throughout the area 114. The lithography mask 112 further includes voids 118 through the material 116. The random distribution of the ellipses 104 generated at the step 102 define either (a) the material 116 throughout the area 114 or (b) the voids 118 through the material 116. In the illustration at FIG. 12, the black portions outside of the ellipses 104 represents the material 116 of the lithography mask 112, while the white portions inside of the ellipses 104 are the voids 118 through the material 116 of the lithography mask 112. The lithography mask 112 can be prepared to have the opposite relationship—the inside of the ellipses 104 (e.g., the white in FIG. 12) can represent the material 116 of the lithography mask 112, while outside of the ellipses 104 (e.g., the black in FIG. 12) can represent the voids 118 through the material 116 of the lithography mask 112.

A workpiece 120 is prepared that incorporates the lithography mask 112. The workpiece 120 includes the substrate 12, lithography ink 122 on the primary surface 18 of the substrate 12 at which the textured region 20 is desired to be formed, and the lithography mask 112 over the lithography ink 122.

At a step 124, the method 100 further includes exposing the workpiece 120 to a curing agent 126. The curing agent 126 can cure the lithography ink 122. The curing agent 126 can be ultraviolet light, among other things. The lithography mask 112 allows for selective curing of the lithography ink 122. The curing agent 126 transmits through the voids 118 in the material 116 of the lithography mask 112 to cure exposed portions of the lithography ink 122. However, the material 116 of the lithography mask 112 blocks non-exposed portions of the lithography ink 122 from exposure to the curing agent 126. Thus, the non-exposed portions of the lithography ink 122 are not cured. After curing, the lithography mask 112 and the non-exposed portions of the lithography ink 122 are removed from the substrate 12. The exposed portions of the lithography ink 122 remain on the substrate 12 in cured formed as an etching mask 128.

The random distribution of ellipses 104 generated at the step 102 defined the material 116 and the voids 118 through the material of the lithography mask 112, and thus, the etching mask 128 on the substrate 12. In other words, the etching mask 128 is either shaped to match the inside of the ellipses 104, or shaped to match the outside of the ellipses 104 generated at the step 102. The black inside the ellipses 104 of the illustration at FIG. 12 pertaining to a step 130 represents the etching mask 128. The white outside of the ellipses 104 is the primary surface 18 of the substrate 12. The opposite scenario would have existed if the lithography mask 112 was formed in the opposite manner.

At the step 130, the method 100 further includes contacting the substrate 12 with the etching mask 128 with an etchant 132. The etchant 132 selectively etches the etching mask 128 because the etching mask 128 allows the etchant 132 to contact some portions of the primary surface 18 of the substrate 12 and prevents the etchant 132 from contacting other portions of the primary surface 18 of the substrate 12. Depending on how the lithography mask 112 was formed, the etching mask 128 either (i) allows the etchant 132 to etch into the substrate 12 inside the ellipses 104 in accordance with the random generation thereof from the step 102 and prevents the etchant 132 from etching into the substrate 12 outside of the ellipses 104, or (ii) prevents the etchant 132 from etching into the substrate 12 inside the ellipses 104 in accordance with the random generation thereof from the step 102 and allows the etchant 132 to etch into the substrate 12 outside of the ellipses 104. Thereafter, the etching mask 128 is removed. The substrate 12 now has the textured region 20 on the primary surface 18 thereof, with the topography of the textured region 20 matching the random distribution of ellipses 104 generated at the step 102.

In embodiments, the method 100 further comprises repeating the steps 102, 110, 124, 130 so that the substrate 12 with the textured region 20 is etched again. To elaborate, a random distribution of second ellipses 104 (different than the random distribution of the ellipses 104 from the initial step 102) is generated within an area 106 of a second plane 108. These second ellipses 104 can have a range of longest dimensions 34 that are different (e.g., smaller) than a range of longest dimensions 34 of the ellipses 104 previously generated. A second lithography mask 112 is then prepared that incorporates the second ellipses 104 either as the material 116 or the voids 118 through the material 116. A second workpiece 120 is prepared that includes the substrate 12, new lithography ink 122 disposed on the textured region 20 of the substrate 12, and the second lithography mask 112 disposed on the new lithography ink 122. The second workpiece 120 is then exposed to a curing agent 126. The curing agent 126 transmits through the voids 118 through the material 116 of the second lithography mask 112 to cure exposed portions of the new lithography ink 122. The material 116 of the second lithography mask 112 blocks non-exposed portions of the new lithography ink 122 from exposure to the curing agent 126. Thus, the non-exposed portions of the new lithography ink 122 are not cured and are removed along with the second lithography mask 112. The exposed portions of the new lithography ink 122 remain on the substrate 12 as a second etching mask 128. The substrate 12 with the second etching mask 128 is then contacted with an etchant 132. Such two-step etching processes can form the textured region 20 with three or four elevations 50-56 from the base-plane 30 as explained in connection with FIGS. 8A-8C.

Figure 13:
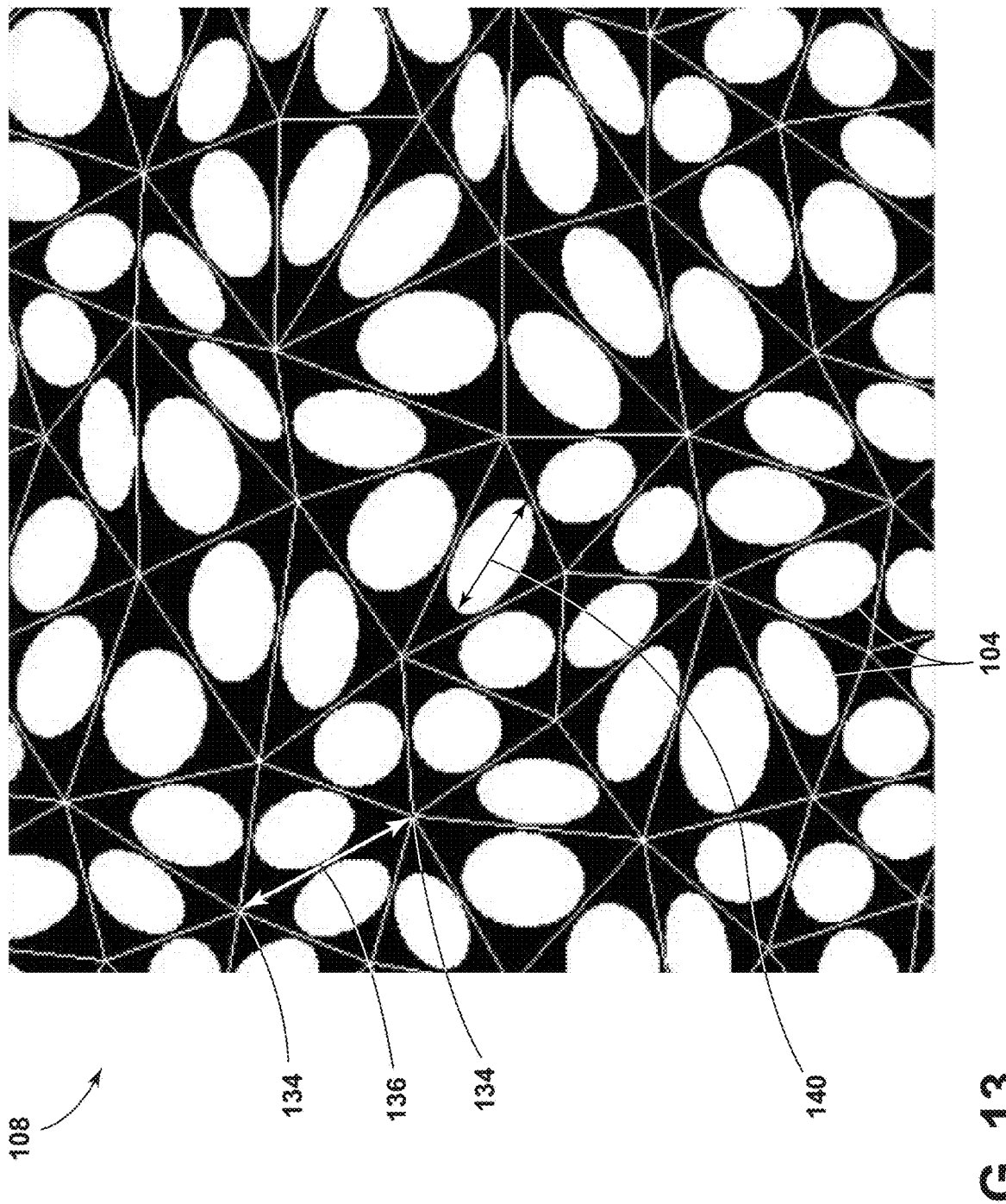
FIG. 13 is a schematic illustrating an example generation of a random distribution of ellipses, where points are randomly generated (such as by using a Poisson disk random distribution algorithm), the points are triangulated, and then Steiner inellipses are drawn within the triangles, which are then later scaled down to a desired fill fraction.

In embodiments, referring to FIG. 13, the step 102 of generating the random distribution of the ellipses 104 includes first distributing points 134 randomly within the area 106 of the plane 108. Each of the points 134 so randomly distributed is separated by a minimum distance 136. The points 134 can be randomly distributed pursuant to a random distribution algorithm, such as a Poisson disk distribution algorithm. Other algorithms such as maxi-min are possible as well. However, some distribution algorithms such as maxi-min tend to arrange the points 134 too hexagonally, which causes the resulting ellipses 104 to be very similar to one another in terms of major and minor axis lengths and eccentricities. This can lead to color artifacts. The Poisson disk distribution algorithm enforces the minimum distance 136 between the distributed points 134 but does not produce highly hexagonal arrangements.

More specifically, Poisson disk sampling inserts a first point 134 into the area 106. Then the algorithm inserts a second point 134 within the area 106, placing the center at a random point within the area 106. If the placement of the second point 134 satisfies the minimum distance 136 from the first point 134, then the second point 134 stays in the area 106. The algorithm then repeats this process until no more such points 134 can be placed within the area 106 that satisfies the minimum distance 136. The result is a random distribution, but specific placement, of the points 134.

The maxi-min spacing algorithm is so named because it attempts to maximize the minimum nearest-neighbor distance 136 of a point 134 distribution. Because it proceeds iteratively, moving each point 134 to another place where it is further from any neighbors, the algorithm usually does not achieve a perfect hexagonal lattice. It produces a random distribution with a relatively high degree of mean hexagonality, often exceeding 90%.

After the points 134 are randomly distributed within the area 106 of the plane 108, the points 134 are triangulated. By triangulating the points 134, each point 134 is made a vertex of a triangle 138. A plurality of triangles 138 are thus formed, none of which overlap. For example, the points 134 can be triangulated via a Delaunay triangulation. Other triangulation methods are possible. Some of those would likely produce a larger range of longest dimensions 34 for the surface features 26.

After the points 134 have been triangulated, an ellipse 104 is drawn inside each triangle 138 of the plurality of triangles 138, resulting in a plurality of triangles 138 in the area 106 of the plane 108. For example, each ellipse 104 can be a Steiner inellipse. An inellipse is an ellipse 104 that touches the three sides of the triangle 138 in which the ellipse 104 is drawn. A Steiner inellipse is an ellipse 104 that touches the triangle 138 at the midpoint of the sides of the triangle 138 and provides the maximum area for the ellipse 104 (a Steiner inellipse occupies $\pi\sqrt{3}/9$ or about 60.46% of the area of the triangle 138, regardless of the triangle dimensions). The center of Steiner inellipse is the centroid (i.e., the point where the three medians of the triangle coincide) of the triangle 138 within which it is drawn.

After the plurality of ellipses 104 have been drawn, the points 134 and the triangles 138 are removed from the area 106 of the plane 108. Only the ellipses 104 that were drawn in the triangles 138 remain on the area 106 of the plane 108. In embodiments, the sizes of the ellipses 104 are scaled down so that the fill-fraction of the ellipses 104 in the area 106 of the plane 108 is within a range of 45% to 55%. The fill-fraction here is the percentage of the area 106 of the plane 108 that the ellipses 104 occupy. As mentioned, if Steiner inellipses are drawn, then the fill-factor of the ellipses 104 before scaling down is about 60.46%. In embodiments, the sizes of the ellipses 104 are scaled down so that the fill-fraction of the ellipses 104 in the area 106 of the plane 108 is 50%. Each ellipse 104 has a longest dimension 140, and to scale down the ellipses 104, the longest dimension 140 of each of the ellipses 104 can be decreased by a percentage that is identical, with the centers of the ellipses 104 remaining in the same position.

Figure 14:
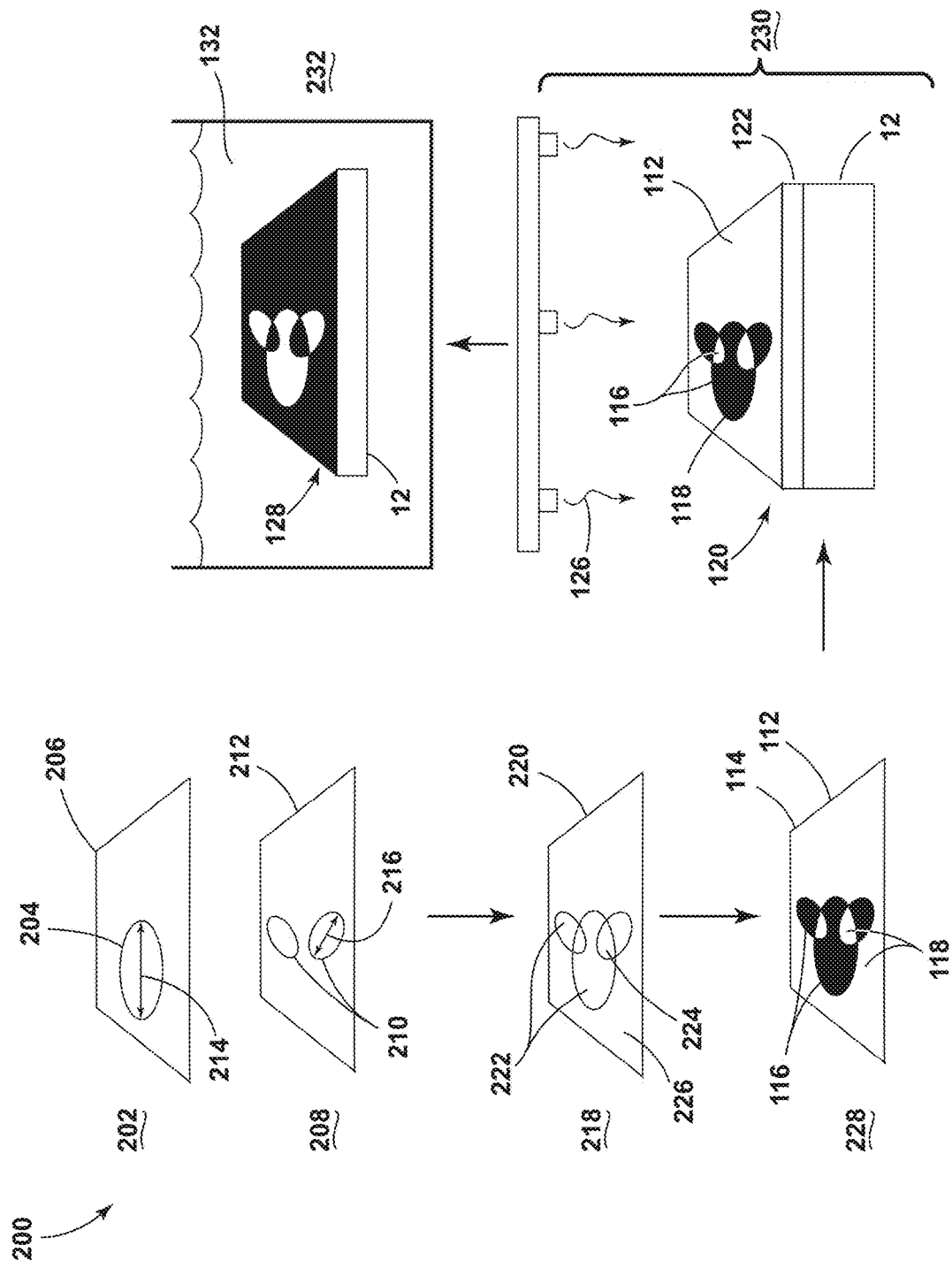
FIG. 14 is a schematic flow chart of another method of forming an embodiment of the textured region of FIG. 1, illustrating two different areas each including a random distribution of ellipses superimposed into one area, with overlapping portions of the ellipses differentiated from non-overlapping portions.
Figure 17A:
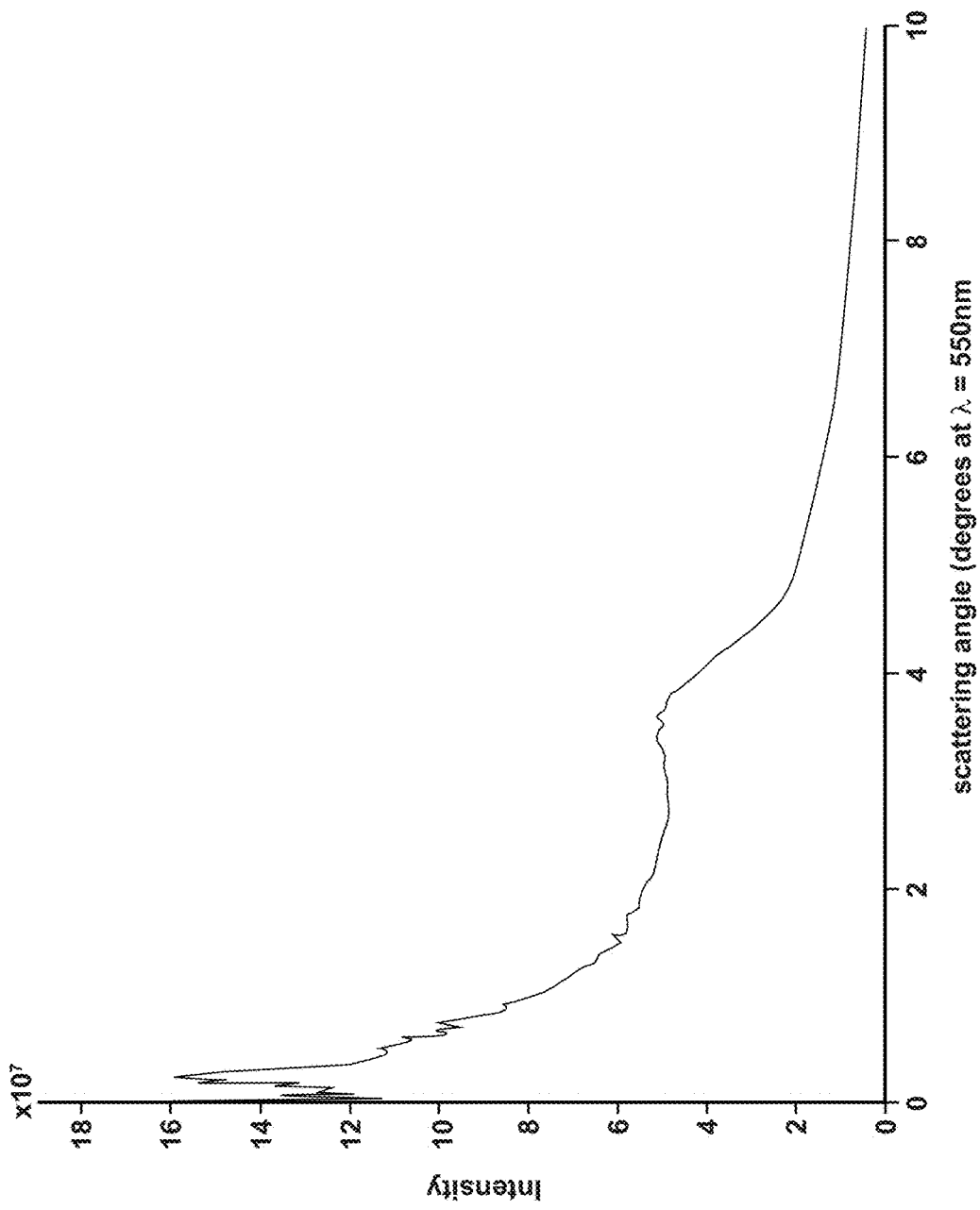
FIGS. 17A and 17B, pertaining to an Example 2A and a Comparative Example 2B, illustrate elliptical surface features again producing less reflected color artifacts than circular color features, a consequence of having peak intensity of reflected light at close to 0.3 degrees scattering angle and only a minor secondary peak at 3 degrees scattering angle where the scattered intensity is reduced.
Figure 17B:
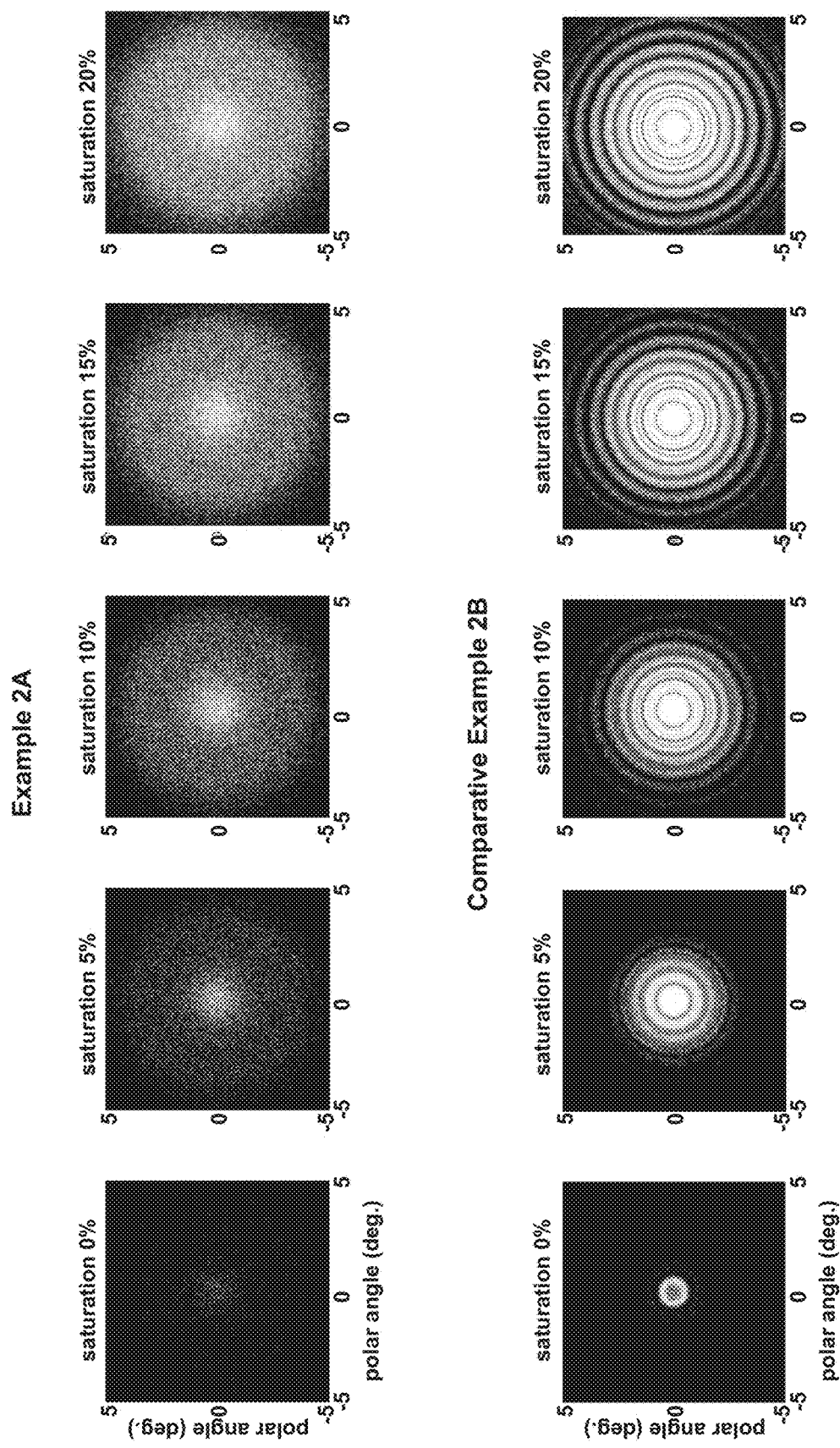
Figure 18A:
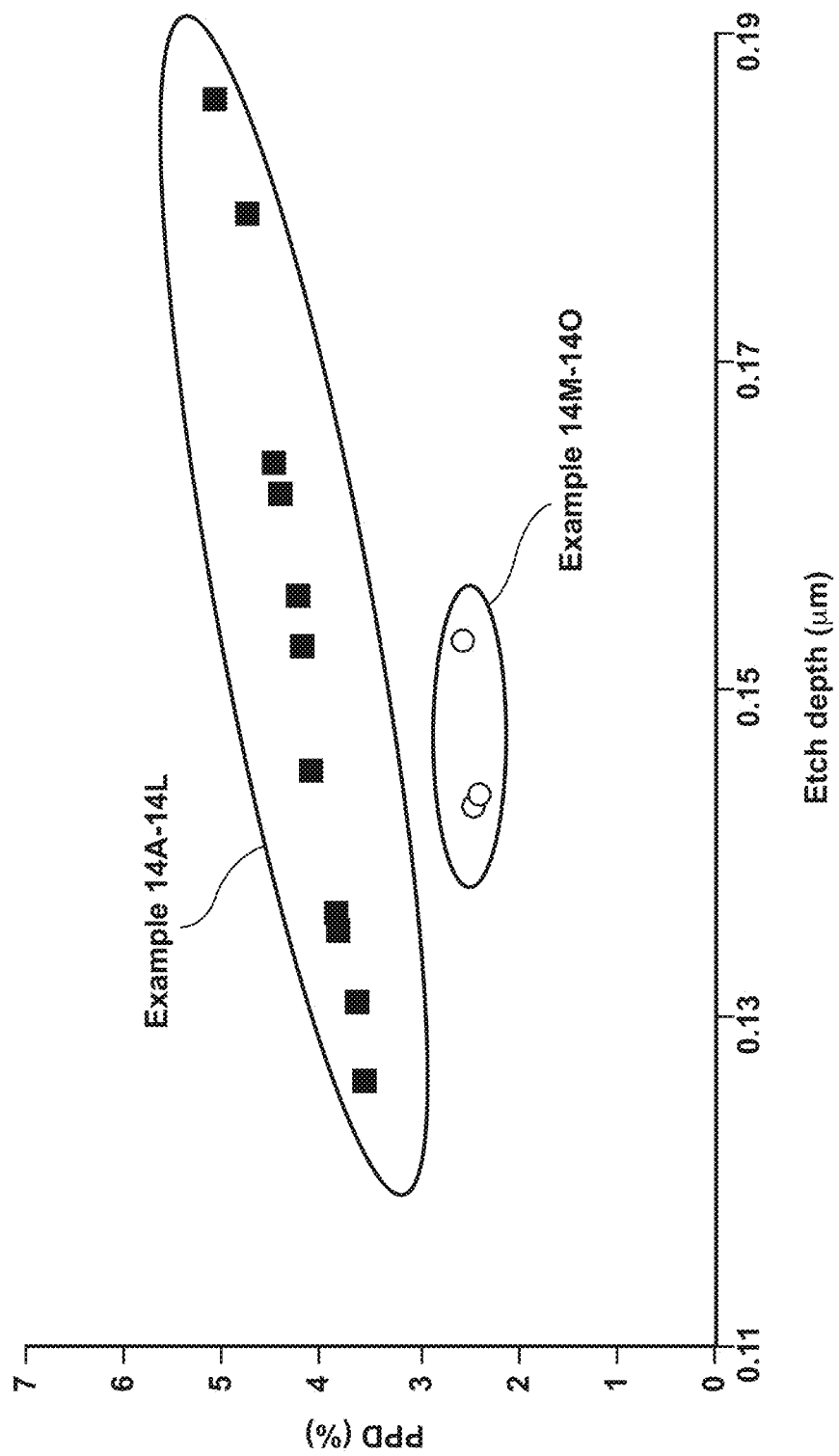
FIG. 18A, pertaining to Examples 14A-14O, is a graph that illustrates that the presence of secondary surface features (to impart surface roughness) results in a lower pixel power deviation compared to substrates that did not have the secondary surface features.
Figure 18B:
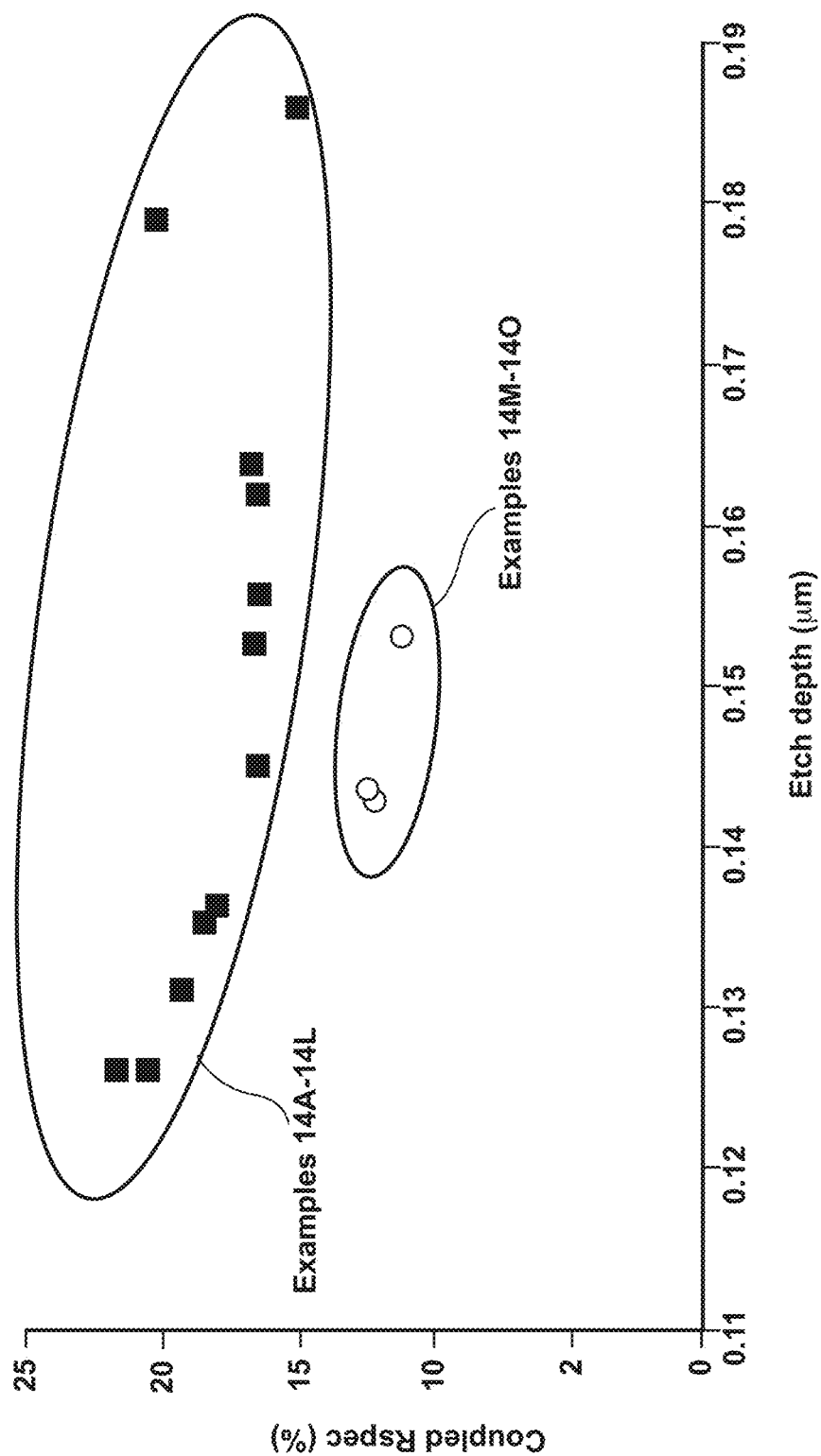
FIG. 18B, pertaining to Examples 14A-14O, is a graph that illustrates that the presence of secondary surface features results in a lower specular reflectance compared to substrates that did not have the secondary surface features.
Figure 18C:
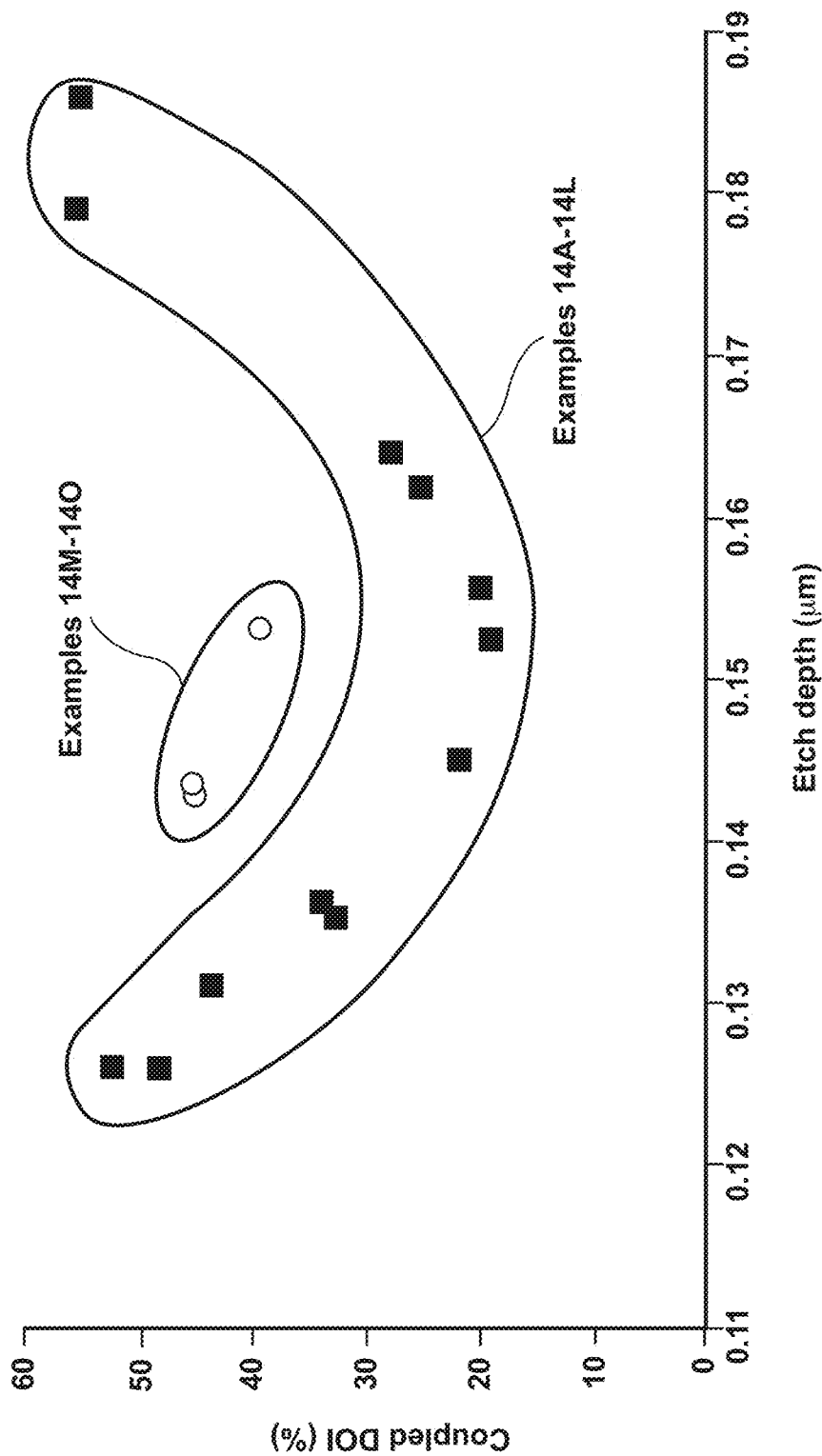
FIG. 18C, pertaining to Examples 14A-14O, is a graph that illustrates that the presence of secondary surface features resulted in a higher distinctness-of-image compared to substrates that did not have the secondary surface features.
Figure 18D:
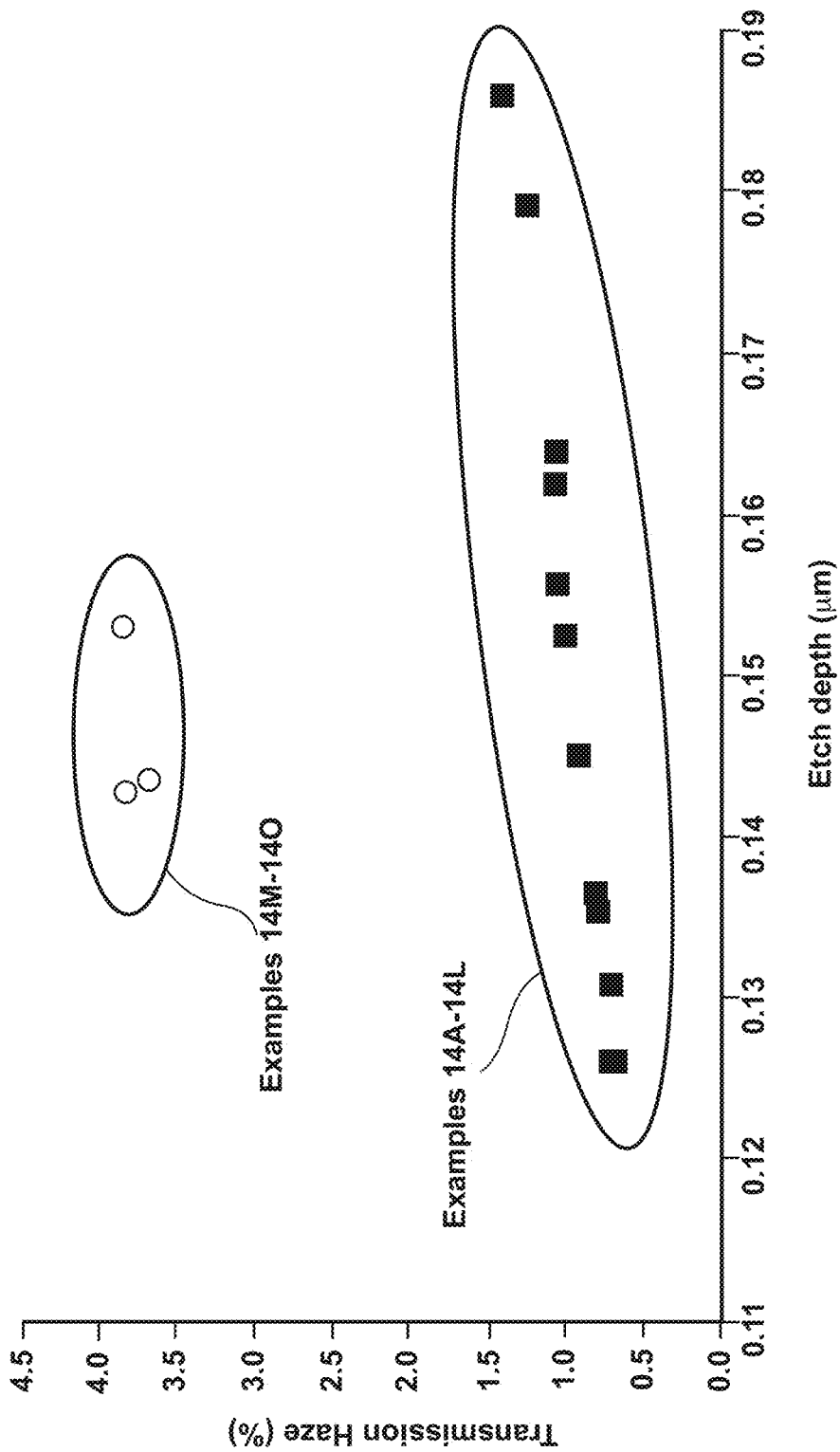
FIG. 18D, pertaining to Examples 14A-14O, is a graph that illustrates that the presence of secondary surface features resulted in a higher transmission haze compared to substrates that did not have the secondary surface features.

Referring now to FIG. 14, another method 200 of forming the textured region 20 of the substrate 12 of the display article 10 is herein disclosed. At a step 202, the method 200 includes generating a random distribution of first ellipses 204 within a first area 206. Similarly, at a step 208, the method 200 further includes generating a random distribution of second ellipses 210 within a second area 212. Longest dimensions 214 of first ellipses 204 are longer than longest dimensions 216 of the second ellipses 210.

The steps 202, 208 thus are generally the same as the step 102 of the method 100 and can be executed in the same manner. In other words, and referring back to FIG. 13, the steps 202, 208 of generating the random distribution of the first ellipses 204 and generating the random distribution of the second ellipses 210 both separately include (i) distributing points 134 randomly within an area 106 of a 108, each of the points 134 separated by a minimum distance 136; (ii) triangulating the points 134 so that each point is made a vertices of a triangle 138 thus forming a plurality of triangles 138, and none of the triangles 138 overlap; (iii) drawing an ellipse 104 inside each triangle 138 of the plurality of triangles 138; and removing the points 134 and the triangles 138 so that only the ellipses 104 that were drawn in the triangles 138 remain on the area 106 of the plane 108.

With the method 200, there is the further caveat that the minimum distance 136 separating each of the points 134 of the plane 108 for the random distribution of the first ellipses 204 is greater than the minimum distance 136 separating each of the points 134 of the plane 108 for the random distribution of the second ellipses 210. The longer minimum distance 136 for the points 134 from which the first ellipses 204 are generated results in the longest dimensions 140 of the first ellipses 204 being longer than the longest dimensions 140 of the second ellipses 210. In embodiments, the minimum distance separating each of the points 134 of the plane 108 for the random distribution of the first ellipses 204 is 15 µm, 16 µm, 17 µm, 18 µm, 19 µm, 20 µm, 30 µm, 40 µm, 50 µm, 60 µm, 70 µm, 80 µm, 90 µm, 100 µm, 110 µm, 120 µm, 130 µm, 140 µm, or within a range bounded by any two of those values (e.g., 100 μm to 120 μm, 80 μm to 130 μm, and so on). In embodiments, the minimum distance 136 separating each of the points 134 of the plane 108 for the random distribution of the second ellipses 210 is within 13 μm, 14 μm, 15 μm, 16 μm, 17 μm, 18 μm, 19 μm, 20 μm, 25 μm, 30 μm, 35 μm, 40 μm, or within any range bounded by any two of those values (e.g., 20 μm to 30 μm, 15 μm to 40 μm and so on).

In embodiments, the minimum distance 136 separating each of the points 134 of the plane 108 for the random distribution of the first ellipses 204 is less than or equal 20 μm. In these embodiments, the minimum distance 136 separating each of the points 134 of the plane 108 for the random distribution of the second ellipses 210 is less than or equal 18 μm. The minimum distance 136 separating each of the points 134 of the plane 108 for the random distribution of the first ellipses 204 differs from the minimum distance 136 separating each of the points 134 of the plane 108 for the random distribution of the second ellipses 210 by a value within a range of 1 μm to 3 μm.

At a step 218, the method 200 further includes forming a new area 220 that superimposes the first ellipses 204 of the first area 206 and the second ellipses 210 of the second area 212. The new area 220 is the combination of the first ellipses 204 and the second ellipses 210 within the same new area 220. The new area 220 includes free portions 222 of the first ellipses 204 and the second ellipses 210 that do not overlap. The free portions 222 would include any of the first ellipses 204 and the second ellipses 210 that do not overlap at all, and the portions of the first ellipses 204 and the second ellipses 210 that are not overlapped. The new area 220 further includes overlapping portions 224 of the first ellipses 204 and the second ellipses 210. The overlapping portions 224 are where the first ellipses 204 and the second ellipses 210 occupy the same space of the new area 220. Finally, the new area 220 further includes empty portions 226 where neither the first ellipses 204 nor the second ellipses 210 are present. The empty portions 226 are outside of the first ellipses 204 and outside of the second ellipses 210.

In embodiments, the method 200 further includes removing from the new area 220 any of the second ellipses 210 that the first ellipses 204 partially but not fully overlap. Such a new area 220 would appear like FIG. 6, where all of the smaller ellipses are either fully inside the larger ellipses or fully outside of the larger ellipses. None of the smaller ellipses are partially inside and partially outside of the larger ellipses. Those smaller ellipses are removed in these embodiments.

At a step 228, the method 200 further includes preparing a lithography mask 112. The lithography mask 112 includes an area 114, material 116 within the area 114, and voids 118 through the material 116. The material 116 within the area 114 is defined by (i.e., matches) the either (i) the free portions 222 of the first ellipses 204 and the second ellipses 210 that do not overlap or (ii) a combination of the overlapping portions 224 and the empty portions 226. The voids 118 through the material 116 are defined by (i.e., match) whichever of (i) and (ii) from the previous sentence does not define the material 116 within the 114. The lithography mask 112 is then incorporated into a workpiece 120 that includes the substrate 12, lithography ink 122 disposed on the substrate 12, and the lithography mask 112 disposed on the lithography ink 122.

At a step 230, the method 200 further includes exposing the workpiece 120 to a curing agent 126. The curing agent 126, such as ultraviolet light, transmits through the voids 118 through the material 116 of the lithography mask 112 to cure exposed portions of the lithography ink 122. The material 116 of the lithography mask 112 blocks non-exposed portions of the lithography ink 122 from exposure to the curing agent 126 and thus the non-exposed portions are not cured. The non-exposed portions are removed from the substrate 12 along with the lithography mask 112. The exposed portions of the lithography ink 122 remain on the substrate 12 as an etching mask 128.

At a step 232, the method 200 further includes contacting the substrate 12 with the etching mask 128 with an etchant 132. The etchant 132 selectively etches the etching mask 128. Depending on how the lithographic mask 112 was formed, the etching mask 128 could allow the etchant 132 to etch into the substrate 12 the free portions 222 of the first ellipses 204 and the second ellipses 210 that do not overlap, and prevent the etchant 132 from etching into the substrate 12 the combination of the overlapping portions 224 and the empty portions 226. Alternatively, the etching mask 128 could allow the etchant 132 to etch into the substrate 12 the combination of the overlapping portions 224 and the empty portions 226, and prevent the etchant 132 from etching into the substrate 12 the free portions 222 of the first ellipses 204 and the second ellipses 210 that do not overlap. In any event, after the etching step 232, the etching mask 128 is removed. The substrate 12 has the textured region 20 on the primary surface 18.

In embodiments, the method 100 and method 200 each include, after the aforementioned etching steps have been performed, forming the secondary surface features 82 into the one or more sections 80 of the textured region 20. This step increases the surface roughness ($R_a$) at the one or more sections 34 to within the range of 5 nm to 100 nm. In embodiments, the step of forming the secondary surface features 82 into one or more sections 80 of the textured region 20 comprises contacting the one or more sections 80 of the textured region 20 of the substrate 12 with another etchant. This etchant is different than the etchant 132. In embodiments, this etchant includes acetic acid and ammonium fluoride. In embodiments, the etchant includes (in wt %): 85 to 98 acetic acid, 0.5 to 7.5 ammonium fluoride, and 0 to 11 water. The water can be deionized water. In embodiments, the etchant contacts the one or more sections 80 for a time period within a range of 15 seconds to 5 minutes. In embodiments, the etchant contacts the one or more sections 80 while the etching mask 128 remains on the substrate 12. After the period of time has concluded the substrate 12 is rinsed with deionized water and dried. The etching steps 130, 232 and the etching step to form the secondary surface features 82 can be conducted at room temperature.

EXAMPLES

Comparative Example 1A and Example 1B—For Comparative Example 1A, a one-step etching process was utilized to generate a textured region of a substrate with surface features having a circular rather than elliptical perimeter. The surface features were still randomly distributed but had a constant diameter and the perimeters were circular. This is illustrated at FIG. 15A. The textured surface was illuminated. An image of the reflected light from the textured region was captured. The image is produced at FIG. 15B. The intensity of the light that the textured surface reflected as a function of scattering angle was measured by using the TSW CASI™ Scatterometer made by the Scatter Works Inc (for light having a wavelength of 550 nm). A graph of the measurements is reproduced at FIG. 15C.

As the image of FIG. 15B reveals, surface features having a circular perimeter, although randomly distributed, generate color artifacts when reflecting light. Color labels have been added to the FIG. 15B, in case the graph is reproduced in black and white. The reader should understand that the reflected light resembles circular rainbows that repeat moving outward from the center. The circular perimeter of the surface features causes the circular color rings.

The graph of FIG. 15C also illustrates that aspect. The graph is for the specific wavelength of 550 nm, which appears greenish yellow. Intensity of the reflected light at this wavelength is shown to peak several times as a function of scattering angle. The scattering angle at which peak intensity occurs is additionally a function of wavelength. Thus, the scattering angles at which intensity peaks occur for the wavelength of 550 nm will be different than the scattering angles at which intensity peaks occur for other wavelengths. The wavelength dependency increases as the scattering angle increases as well. This accounts for the color splitting being more obvious in the image of FIG. 15B moving away from the center of the image. Scattering angle increases as a function of increasing position away from the center of the image.

For Example 1B, a one-step etching process was utilized to generate a textured region of a substrate with surface features having an elliptical rather than a circular perimeter. The surface features were randomly distributed. This is illustrated at FIG. 16A. The textured surface was illuminated. An image of the reflected light from the textured region was captured. The image is produced at FIG. 16B. The intensity of the light that the textured surface reflected as a function of scattering angle was measured (for light having a wavelength of 550 nm). A graph of the measurements is reproduced at FIG. 16C.

As the image of FIG. 16B reveals, the elliptical surface features of Example 1A generate much less color artifacts upon reflecting ambient light than the circular surface features of Example 1B. The image of FIG. 16B lacks any noticeable color-separated rings.

As the graph of FIG. 16C reveals, the major peak of reflected light intensity occurs at a lower scattering angle (i.e., closer to the center of image of FIG. 16B) than compared to FIG. 15C, and the peak is narrower than the peak in FIG. 15C. Further, the graph of FIG. 16C lacks the second and third peaks as the scattering angle increases. Thus, the elliptical surface features of Example 1B do not generate the same color-separated rings moving outward from the center of the reflection as the circular surface features of Comparative Example 1A do. When the various wavelengths of visible light all produce an intensity peak at approximately the same scattering angle, the reflected light is white (the combination of all the wavelengths) and does not appear separated by color.

Example 2A and Comparative Example 2B—For Example 2A, and in reference to FIGS. 10A, 10B, 17A, and 17B, first random distribution of points in a first area was generated having a minimum point-to-point distance of 13 μm. The points were triangulated and ellipses drawn and scaled down according to the process discussed above. A second random distribution of points in a second area was generated, but this time having a minimum point-to-point distance of 15 μm. The points were again triangulated and ellipses drawn and scaled down. The two areas were superimposed into one area. Using a computer model, the superimposed area was assumed to be a textured region with two elevations. The first elevation, illustrated in white, is where the superimposed ellipses do not overlap. The second elevation, illustrated in black, is where no ellipses are present and where the superimposed ellipses overlap.

The intensity of light (having the 550 nm wavelength) reflecting off the textured region as a function of the angle at which the light is scattered was modeled. A graph of the modeled results is reproduced at FIG. 17A. The peak intensity was at 0.3 degrees, which is desirable to tightly pack the peak intensities of reflected wavelengths to avoid color separation. The graph additional shows a peak in intensity at about 3.5 degrees. The further away from center (i.e., the higher the number of degrees) these secondary peak intensities occur, the less visible the color separation is. In this instance, at higher saturations, the color separation might be visible. That aspect is illustrated in the computer-modeled images reproduced at FIG. 17B (top), which shows predicted reflection from the textured region as a function of saturation.

For Comparative Example 2B, the same process was used with the same parameters but, instead of ellipses, circles were utilized. Computer-modeled images of predicted reflection from the textured region as a function of saturation are reproduced at FIG. 17B (bottom). As the computer-modeled images show, the surface features generated from overlapping circular segments reflected light having easily distinguishable color bands even at 0% saturation. The color artifacts that the surface features generated from overlapping elliptical segments were not noticeable at saturations lower than 15%, and even at saturations of 15% and 20%, color banding is not readily evident.

Figure 2:
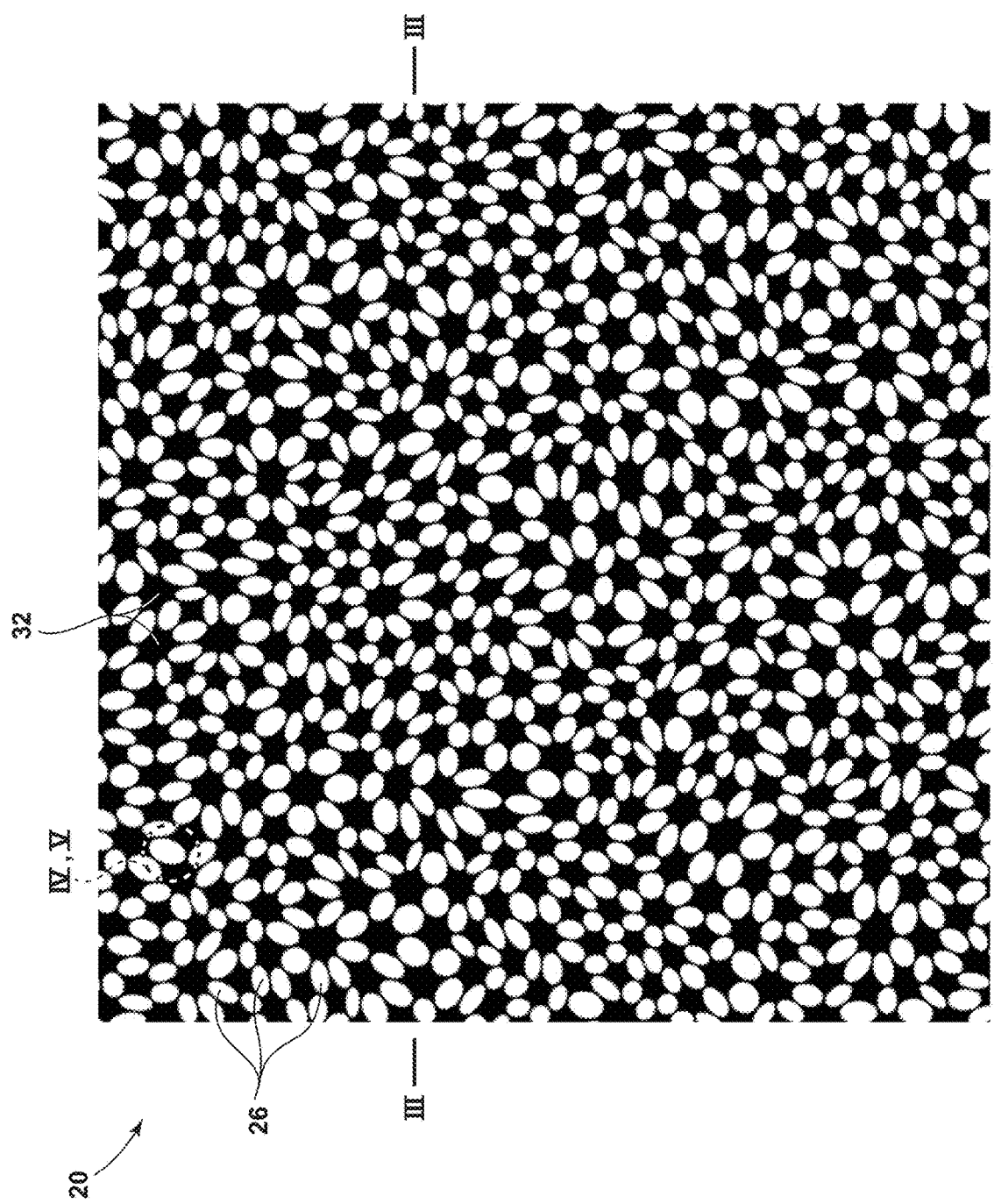
FIG. 2 is a magnified illustration of a portion of an embodiment of the textured region of FIG. 1, illustrating elliptical surface features projecting from a surrounding portion.
Figure 3:
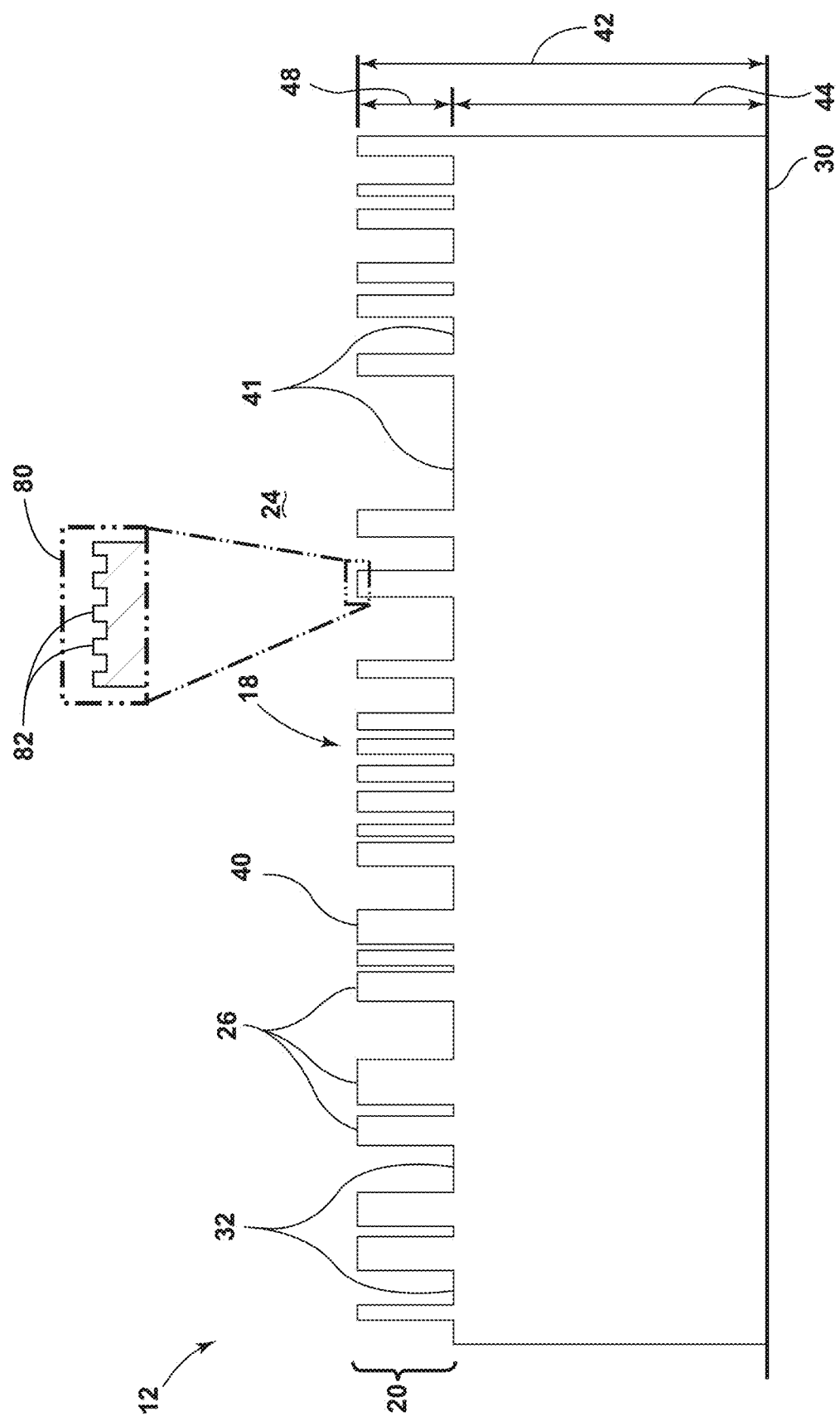
FIG. 3 is an elevation view of a cross-section taken through line III-III of FIG. 2, illustrating the elliptical surface features projecting from the surrounding portion, with the elliptical surface features providing higher surfaces that reside at a higher mean elevation from a base-plane extending through the substrate below the textured region, and with the surrounding portion providing a lower surface that resides at a lower mean elevation from the base-plane.
Figure 4:
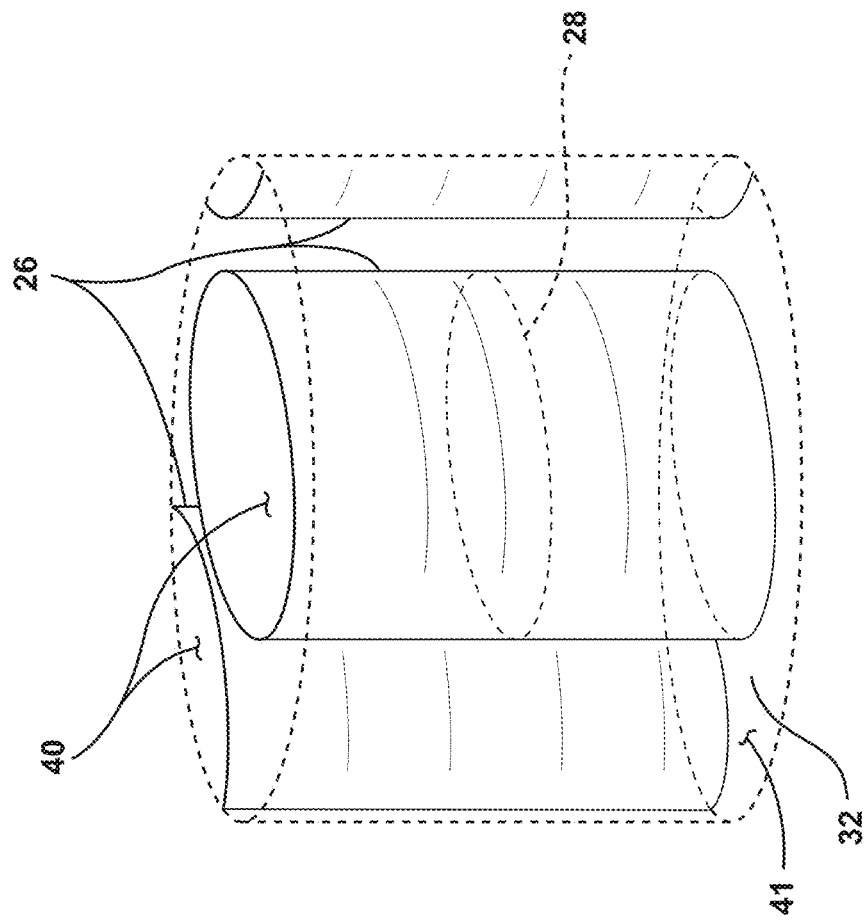
FIG. 4 is a close-up perspective view of area IV of FIG. 2, illustrating an elliptical surface feature projecting from the surrounding portion and providing a higher surface, which is relatively planar.
Figure 5:
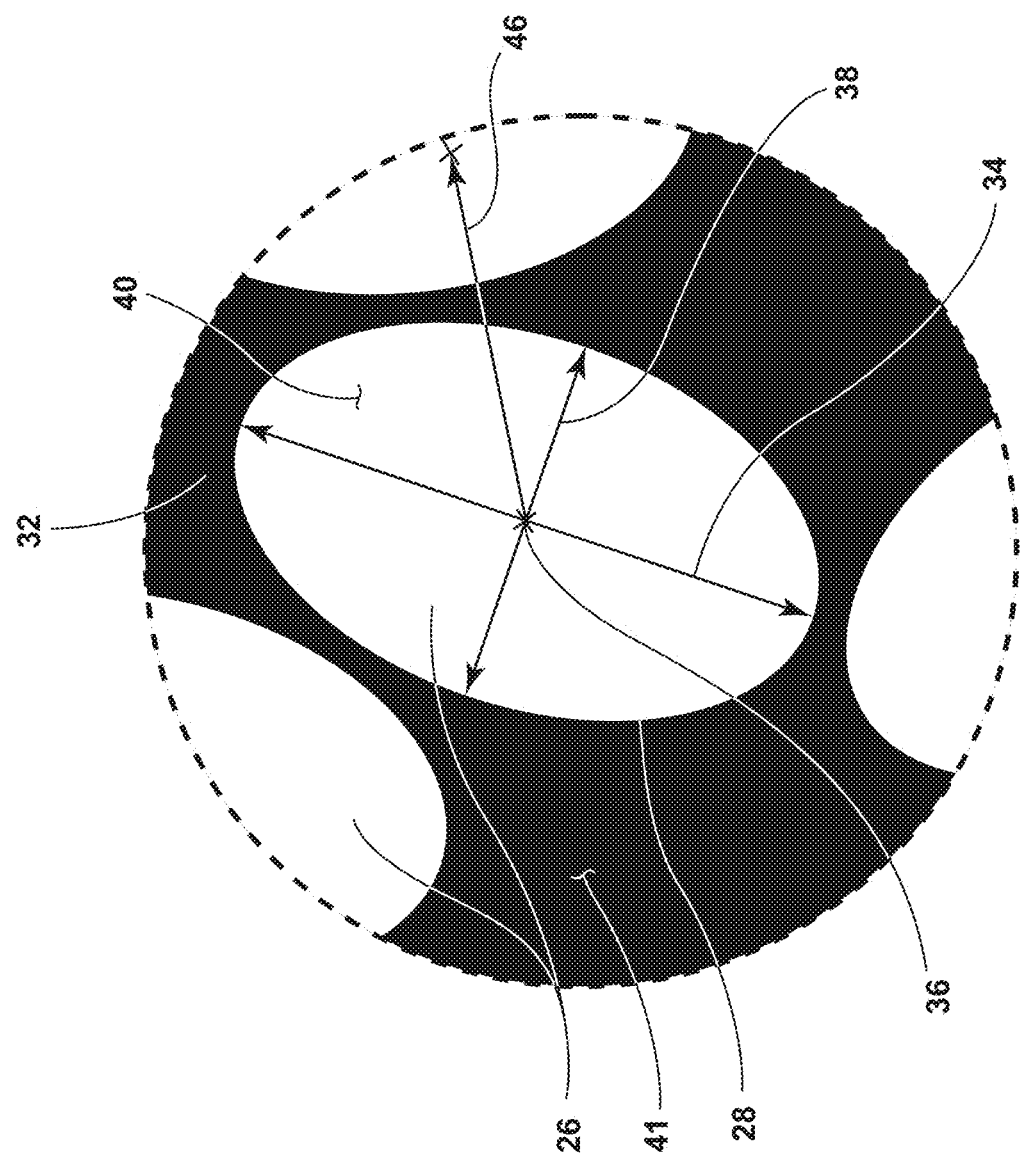
FIG. 5 is a close-up view of area V of FIG. 2, illustrating the elliptical surface features having a perimeter and a longest dimension, as well as the surface features being separated by a center-to-center distance.

Examples 3-5—Examples 3-5 are each a summary of samples where the textured region most resembles that of FIG. 2. The random but specific distribution of the surface features with an elliptical perimeter began with a random distribution of points having a minimum point-to-point distance of 110 μm for Example 3, 25 μm for Example 4, and 10 μm for Example 5. Triangulation was performed and ellipses drawn and scaled so that the ellipses had a fill-fraction of 50%. A one-step etching process produced surface features with an elliptical perimeter at one elevation and a surrounding portion at another elevation from a baseplane. The one-step etching process removed, depending on the sample, 0.11 μm to 0.16 μm of the thickness of the substrate for Example 3, 0.12 μm to 0.17 μm for Example 4, and 0.08 μm to 0.17 μm for Example 5. Various anti-glare performance metrics were measured for all samples. More specifically, the transmission haze ("haze"), the pixel-power deviation ("PPD"), the distinctiveness-of-image ("c-DOI"), specular reflectance ("c-Rspec"), and corrected color shifts $\Delta C_{x\_corrected}$ and $\Delta C_{y\_corrected}$ were measured and recorded. The results are set forth in Table 1 below. "Min Rspec(λ)" and "max Rspec(λ)" in the tables below refer to far field first surface specular reflectance spectra as measured with a camera with a 2 degree aperture illuminating the sample at a 6 degree angle of incidence. These values are different from the optically coupled Rspec (peak gloss) measurement made with a Rhopoint goniometer ("GU" means Gloss Units). The minimum and maximum are over the visible wavelength range, 400-700 nm.

TABLE 1

| Example | Haze (%) | PPD (%) | c-DOI (%) | c-Rpec (GU) |
|---------|----------|---------|-----------|-------------|
| 3 | 0.6-1.1 | 3.0-4.5 | 19-80 | 17-36 |
| 4 | 2.7-4.9 | 1.2-1.6 | 6-16 | 6-16 |
| 5 | 1.8-12 | 1.4-1.9 | 10-64 | 10-64 |

TABLE 1-continued

| Example | min Rspec($\lambda$) (%) | min Rspec($\lambda$) (%) | $\Delta C_{x\_corrected}$ | $\Delta C_{y\_corrected}$ |
|---|---|---|---|---|
| 3 | NA | NA | 0.10-0.15 | 0.04-0.5 |
| 4 | 1.63-2.75 | 1.93-3.47 | 0.51-0.55 | 0.49-0.55 |
| 5 | 1.14-1.70 | 1.88-3.35 | NA | NA |

As mentioned above, Example 3 with the larger surface features produced little measured reflected color artifacts and low transmission haze but had generated a relatively high pixel power deviation. The smaller surface features generated less pixel power deviation but at the expense of increased haze and reflected color artifacts.

Figure 6:
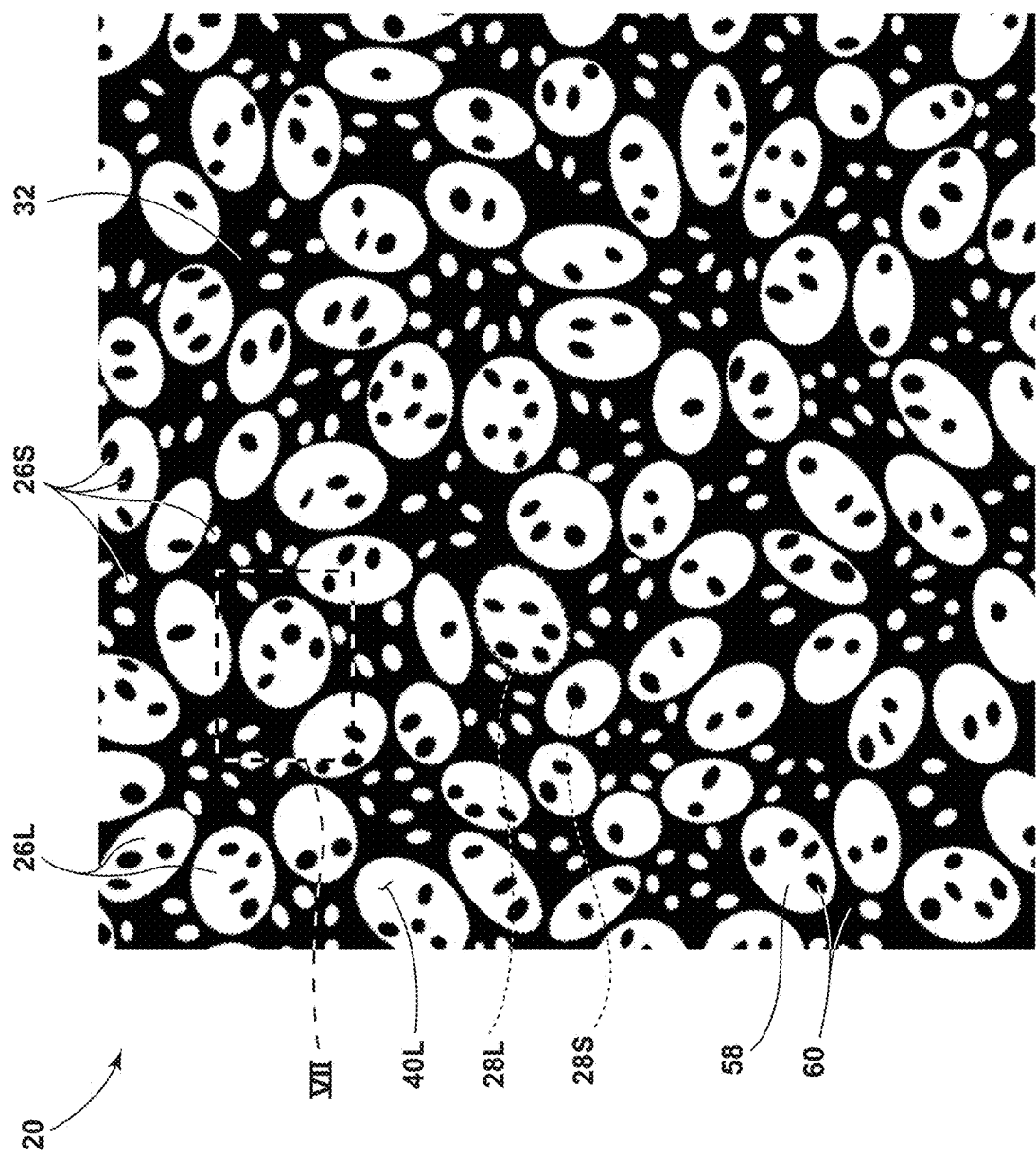
FIG. 6 is a magnified illustration of a portion of an embodiment of the textured region of FIG. 1, illustrating larger elliptical surface features projecting from or set into a surrounding portion and smaller elliptical surface features projecting from or set into the larger elliptical surface features and projecting from or set into the surrounding portion.
Figure 7:
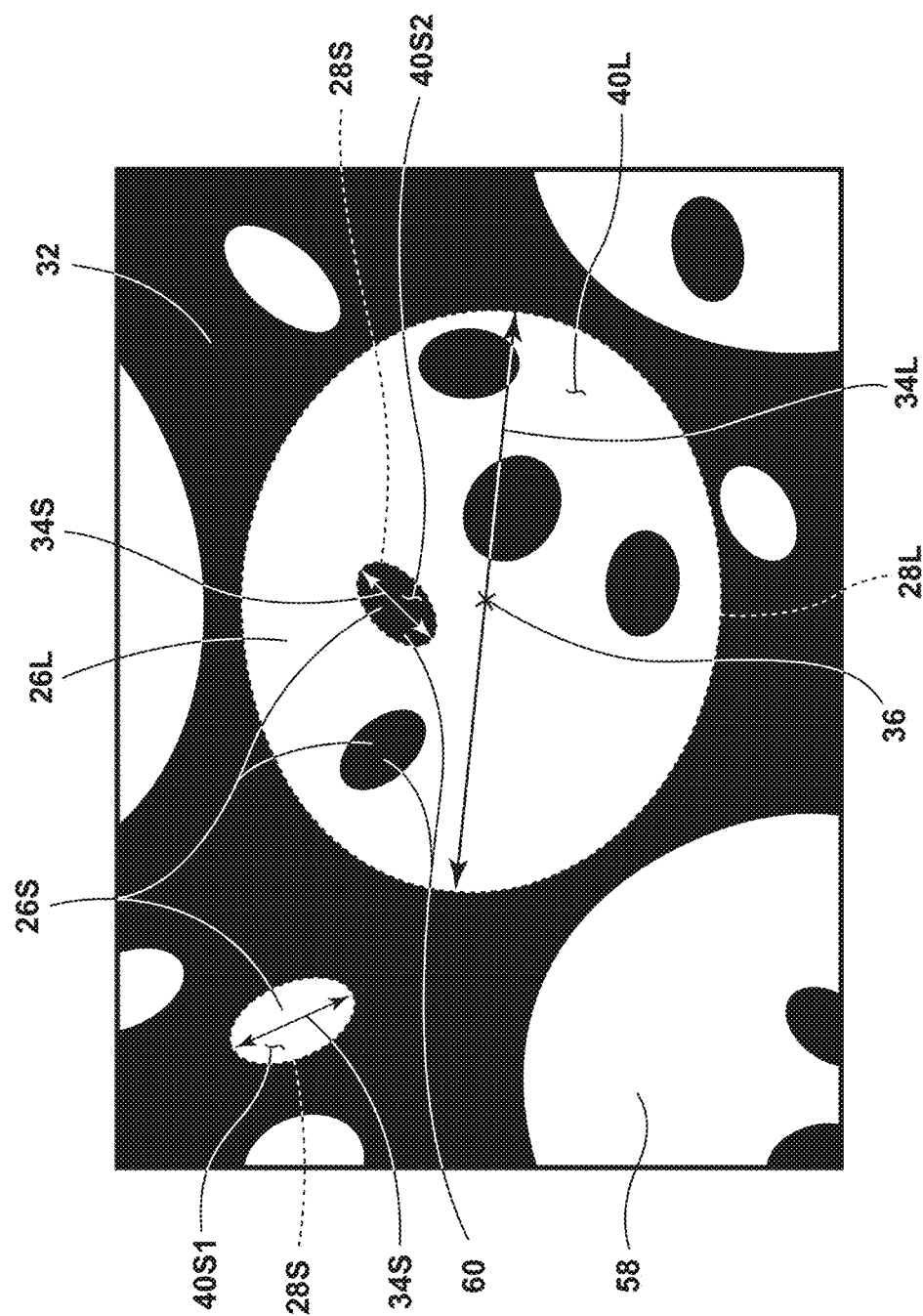
FIG. 7 is a close-up view of area VII of FIG. 6, illustrating the smaller elliptical surface features having a shorter longest dimension than the longest dimension of the larger elliptical surface features.
Figure 8A:
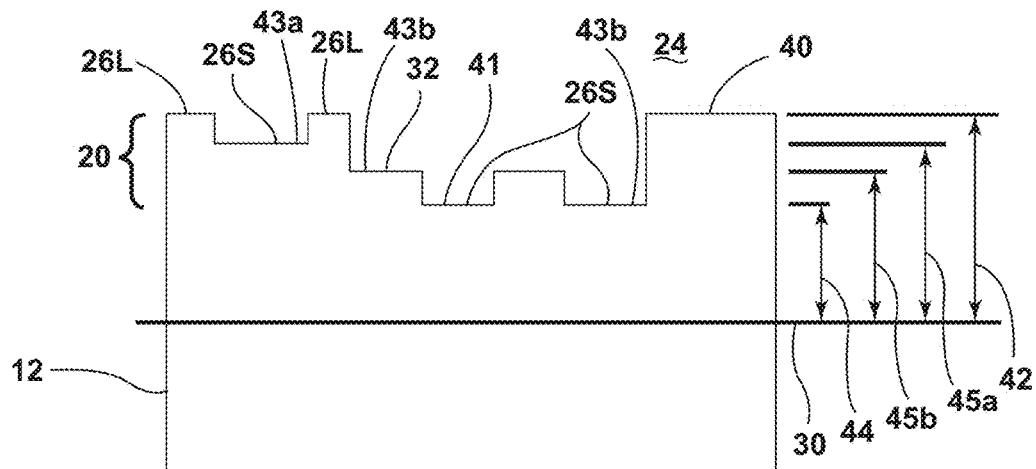
FIGS. 8A-8C are elevational views of a cross-section of FIG. 6, illustrating several possible variations for relative elevations of the larger elliptical surface features, the smaller elliptical surface features, and the surrounding portion from the base-plane, depending on whether a two-step or one-step etching process was utilized to form the textured region.
Figure 8B:
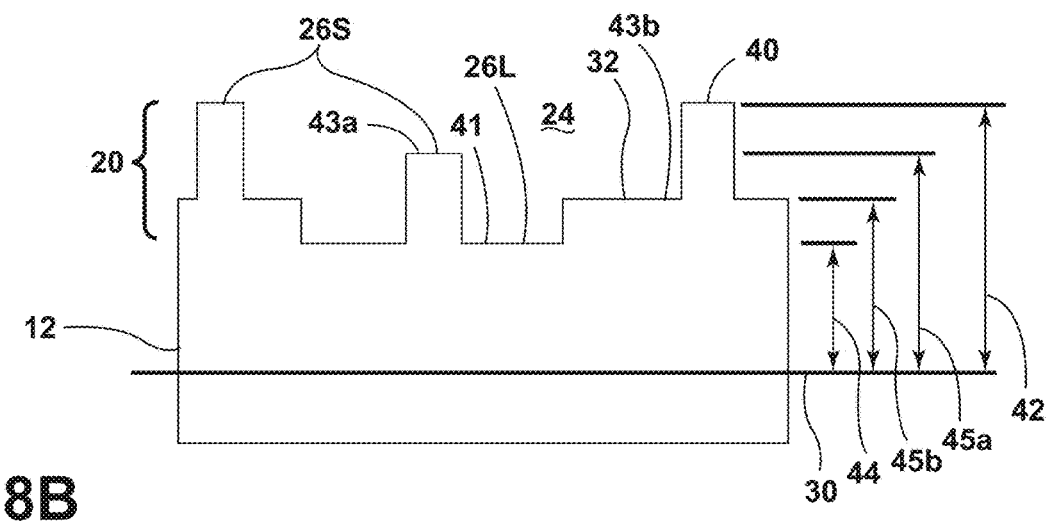
Figure 8C:
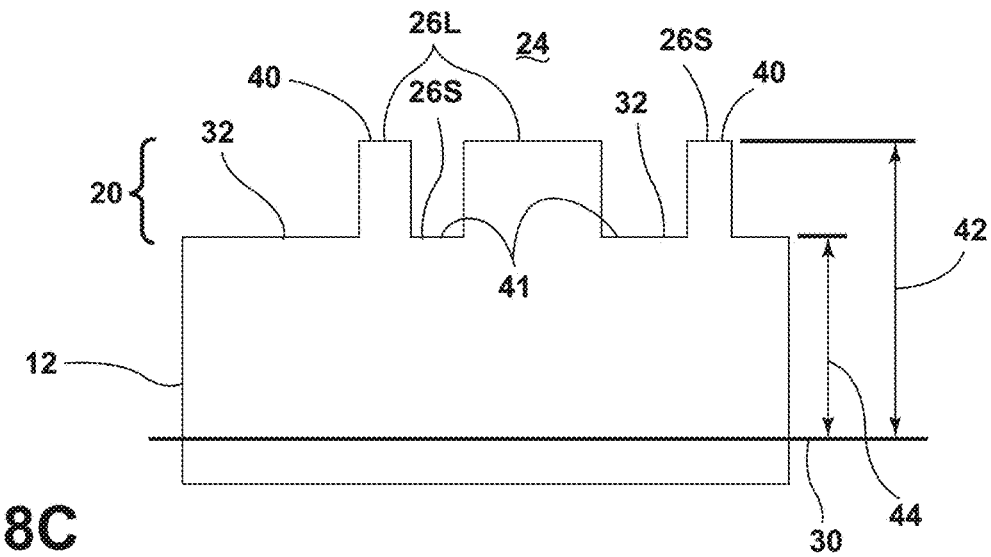

Examples 6-9—These examples are each a summary of samples where the textured region most resembles that of FIG. 6, with larger surface features having an elliptical perimeter introduced in a first etching step and then smaller surface features added in a second etching step. The larger surface features for each example began with a random distribution of points having a minimum point-to-point distance of 110 μm. Triangulation was performed and ellipses drawn and scaled so that the ellipses had a fill-fraction of 50. The first etching step removed, depending on the sample, 0.26 μm to 0.28 μm of the thickness of the substrate for Example 6, 0.13 μm to 0.21 μm for Example 7, 0.13 μm to 0.19 μm for Example 8, and 0.13 μm to 0.17 μm for Example 9. For Example 6, smaller surface features having an elliptical perimeter and a fill-fraction of 50%, generated from random distribution algorithm using a minimum point-to-point distance of 25 μm, were added to the textured region in a second etching step. For Example 7, smaller surface features having a circular perimeter, generated from random distribution algorithm using a minimum center-to-center distance of 15 μm to 25 μm, were added to the textured region in a second etching step. For Example 8, smaller surface features having a circular perimeter, generated from random distribution algorithm using a minimum center-to-center distance of 20 μm to 25 μm, were added to the textured region in a second etching step. For Example 9, secondary surface features to impart surface roughness ($R_a$) within a range of 5 nm to 100 nm were added to the textured region in an etching step. The same anti-glare performance metrics were measured for all samples, and the results are set forth in Table 2 below.

TABLE 2

| Example | Haze (%) | PPD (%) | c-DOI (%) | c-Rpec(GU) |
|---|---|---|---|---|
| 6 | 3-5 | 3.6-3.8 | 24-34 | 4.6-6.4 |
| 7 | 1.1-2.8 | 2.4-3.2 | 53-89 | 16-36 |
| 8 | 1.3-2.7 | 2.0-5.9 | 66-84 | 19-30 |
| 9 | 0.9-3.9 | 1.6-4.7 | 21-76 | 11-20 |

| Example | min Rspec($\lambda$) (%) | min Rspec($\lambda$) (%) | $\Delta C_{x\_corrected}$ | $\Delta C_{y\_corrected}$ |
|---|---|---|---|---|
| 6 | 1.51-1.63 | 2.94-3.18 | NA | NA |
| 7 | NA | NA | 0.28-0.46 | 0.11-0.16 |
| 8 | NA | NA | 0.24-0.28 | 0.09-0.11 |
| 9 | 1.46-1.56 | 1.76-2.14 | 0.16-0.19 | 0.11-0.15 |

The incorporation of the smaller surfaces generally resulted in very low reflected color artifacts values. Examples 8 and 9 in particular had measured reflected color artifact values of under 0.3, imperceptible by human eyes.

Examples 10-13—These examples are each a summary of samples where the textured region most resembles that of FIG. 9A, where a first area of larger elliptical perimeters was superimposed with a second area of smaller elliptical perimeters. Then a single etching step produced a textured region with a first elevation including the non-overlapping elliptical segments and a second elevation including the overlapping elliptical segments and areas outside of any elliptical perimeter. For Examples 11 and 12, the smaller elliptical perimeters that only partially overlapped the larger elliptical perimeters were removed from the design.

The larger elliptical perimeters for each example began with a random distribution of points having a minimum point-to-point distance of 105 μm, except for Example 13, where the minimum point-to-point distance was 15 μm. Triangulation was performed and ellipses drawn and scaled so that the ellipses had a fill-fraction of 50. The minimum point-to-point distances utilized to generate the smaller elliptical perimeters of Examples 10-12 were 25 μm and 13 μm for Example 13. Triangulation was performed and ellipses drawn and scaled so that the ellipses had fill-fractions of 20 for Examples 10-12 and 50 Example 13.

A single etching step formed the textured region, removing, depending on the sample, 0.12 μm to 0.17 μm of the thickness of the substrate for Example 10, 0.06 μm to 0.20 μm for Example 11, 0.16 μm for Example 12, and 0.14 μm to 0.16 μm for Example 13. With Example 12, secondary surface features to impart surface roughness ($R_a$) within a range of 5 nm to 100 nm were added to the textured region in an etching step. The same anti-glare performance metrics were measured for all samples, and the results are set forth in Table 3 below.

TABLE 3

| Example | Haze (%) | PPD (%) | c-DOI (%) | c-Rpec(GU) |
|---|---|---|---|---|
| 10 | 2.9-6.0 | 1.3-2.1 | 58-90 | 5.6-18 |
| 11 | 0.4-3.4 | 1.4-3.1 | 33-97 | 11-63 |
| 12 | 3.9-5.7 | 2.6-2.9 | 28-35 | 8-9 |
| 13 | 5.4-7.2 | 0.9-1.0 | 96-97 | 22-27 |

| Example | min Rspec($\lambda$) (%) | min Rspec($\lambda$) (%) | $\Delta C_{x\_corrected}$ | $\Delta C_{y\_corrected}$ |
|---|---|---|---|---|
| 10 | 1.84-2.55 | 2.06-3.73 | 0.13-0.17 | 0.08-0.10 |
| 11 | NA | NA | 0.16 | 0.16 |
| 12 | NA | NA | 0.20-0.48 | 0.05-0.13 |
| 13 | 0.85-0.98 | 1.46-3.01 | 0.00-0.14 | 0.00-0.16 |

Example 10 generated very good results, including acceptable haze values, a low pixel power deviation, very low specular reflectance, and reflected color artifacts well under 0.3 and considered to be imperceptible.

Examples 14A-14O—For Examples 14A-14O, a spacing distribution algorithm was utilized to randomly but specifically place points within an area. Each of the points were to be separated by a minimum distance of 105 μm. The points were then triangulated, an inellipse drawn in each triangle, and then the points and triangles were removed. The longest dimension of the ellipses now remaining in the area were scaled down so that the ellipses occupied 50 percent of the area. The placement of the ellipses was then transferred to a lithography mask. The lithography mask was used to form an etching mask on the primary surface of a glass substrate. Each substrate was then etched with the etching mask on the substrate. The etchant utilized had a composition of 0.15 wt % hydrofluoric acid and 1 wt % nitric acid. The etchant contacted the primary surface with the etching mask for a period of time set forth in Table 4 immediately below that varied among the samples. The etchant formed surface features having an elliptical perimeter set into a surrounding portion. The depth of the surface features varied, and the depth for each sample is set forth below.

TABLE 4

| Example | Etching Period of Time (seconds) | Depth of Elliptical Surface Features (μm) |
|---|---|---|
| 14A | 212 | 0.186 |
| 14B | 200 | 0.179 |
| 14C | 165 | 0.1451 |
| 14D | 150 | 0.1353 |
| 14E | 140 | 0.1311 |
| 14F | 178 | 0.1639 |
| 14G | 178 | 0.1619 |
| 14H | 167 | 0.1557 |
| 14I | 167 | 0.1526 |
| 14J | 133 | 0.1261 |
| 14K | 133 | 0.1261 |
| 14L | 150 | 0.1364 |
| 14M | 178 | 0.1531 |
| 14N | 167 | 0.1436 |
| 14O | 167 | 0.1429 |

After removal of the etching mask, the samples of 14M-14O were then subjected to a second etching step to form secondary surface features at the primary surface. The second etching step used an etchant with a composition of 92 wt % acetic acid, 2 wt % ammonium fluoride, and 6 wt % water (deionized). The etchant contacted the substrate for a time period of 120 seconds. The secondary surface features so formed imparted a surface roughness ($R_a$) of ~28 nm to the textured region at the primary surface.

The pixel power deviation, distinctness-of-image, specular reflection, and transmission haze were measured for the sample of each of Examples 14A-14O. The measured results are set forth in the graphs of FIGS. 18A-18D, which plot the measured value as a function of the depth of the surface features with the elliptical perimeter. Analysis of the graphs reveal that the secondary surface features to impart surface roughness of Examples 14M-14O resulted in a lower pixel power deviation and specular reflectance compared to when no such secondary surface features were included in Examples 14A-14L. However, the secondary surface features to impart surface roughness of Examples 14M-14O resulted in a higher distinctness-of-image and transmission haze compared to when no such secondary surface features were included in Examples 14A-14L. In general, the introducing of the secondary surface features to the surface features can be either increase or decrease the distinctness-of-image, which depends on the design of the surface features.

Example 15A-15C—Examples 15A and 15B are two different sets of samples, each with surface features having an elliptical perimeter, just as in Examples 14A-14O. The difference was that for the samples of Example 15A, the etching mask used while forming the surface features was kept on the substrate while the another etching step was performed to generate the secondary surface features. For the samples of Example 15B, the etching mask was removed before the etching step was performed to generate the secondary surface features. Thus, in the samples of Example 15A, the secondary surface features and the added surface roughness were formed only on surfaces provided by the elliptical surface features and not the surrounding portion. In contrast, with the samples of Example 15B, the secondary surface features and the added surface roughness were formed on the entire textured region including both the surrounding portion and the surfaces provided by the elliptical surface features.

Figure 19A:
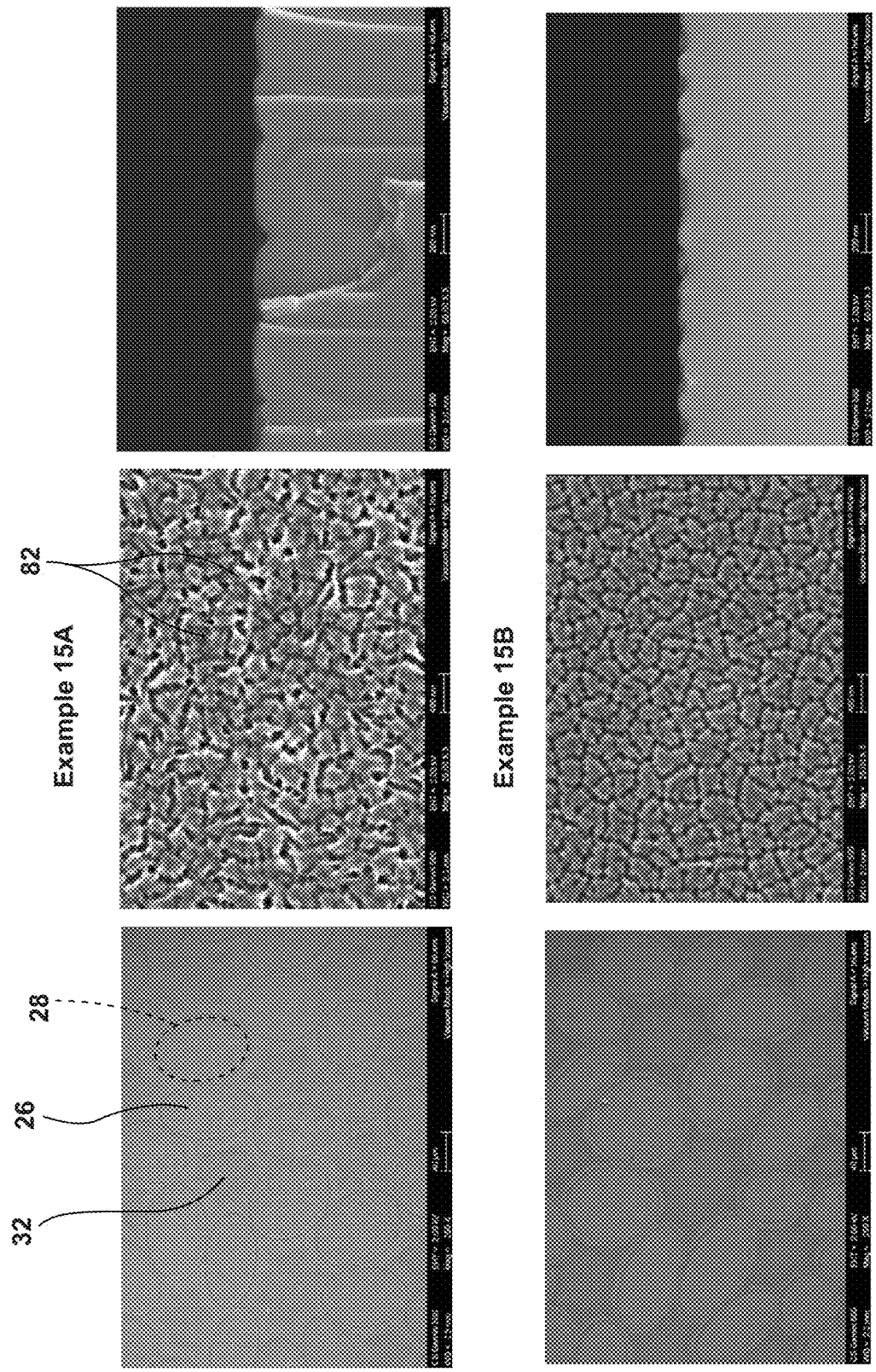
FIG. 19A, pertaining to Examples 15A-15B, are atomic force microscopy images of the elliptical surface features and the surrounding portion (left) and the secondary surface features (middle and right), for both when the secondary surface features were disposed only on the elliptical surface features (top) and when the secondary surface features were disposed over both the elliptical surface features and the surrounding portion (bottom)

A scanning electron microscope captured images of a sample from both Example 15A and Example 15B. The images are reproduced at FIG. 19A. The images on the left show the surface features with the elliptical perimeters set into the surrounding portion. The images in the middle show the secondary surface features. The images on the right show the etching depth of the secondary surface features.

Figure 19B:
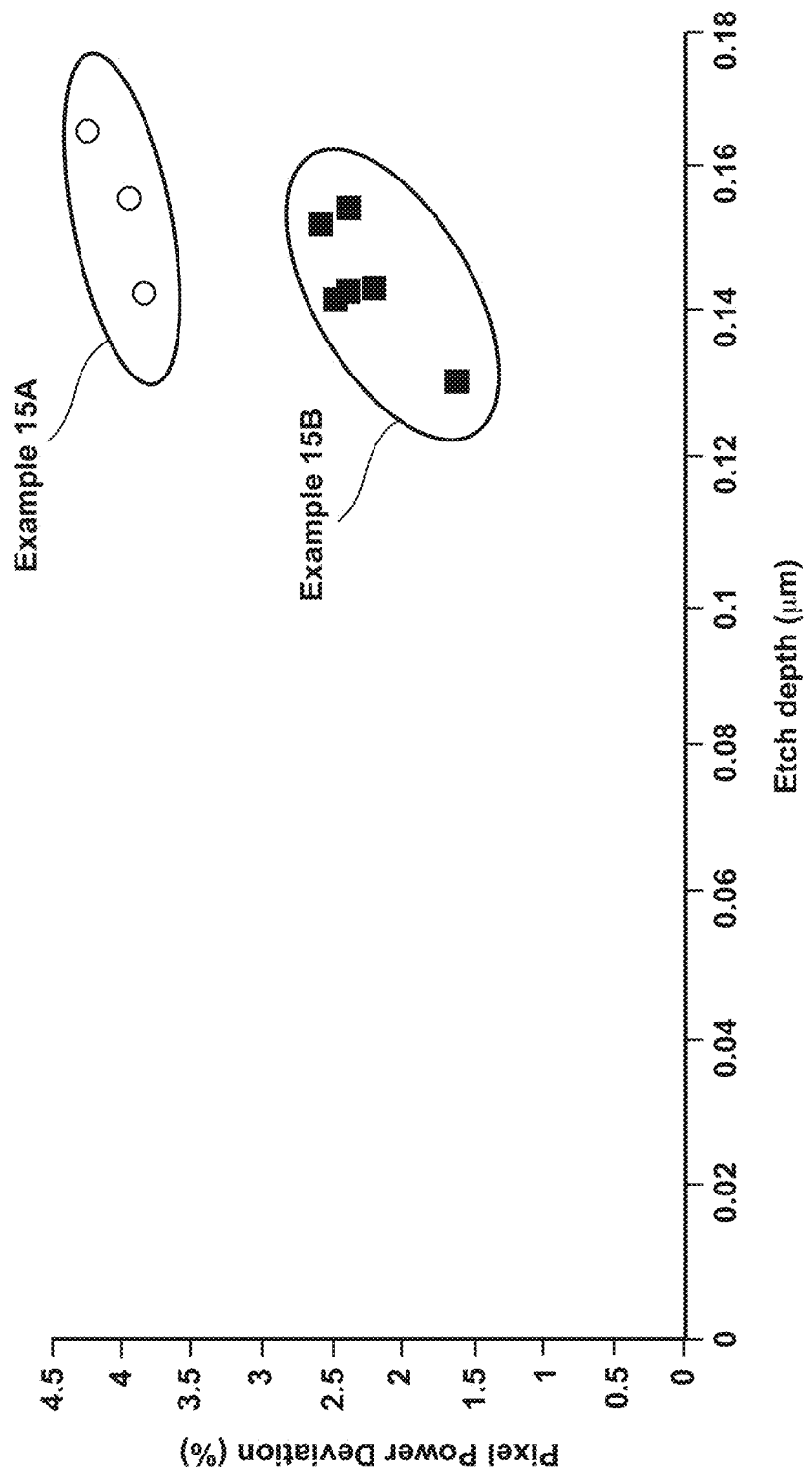
FIG. 19B, pertaining to Examples 15A-15B, is a graph illustrating that incorporating the secondary surface features over the entire textured region resulted in a lowed pixel power deviation compared to substrates where the secondary surface features were incorporated only on the elliptical surface features.
Figure 19C:
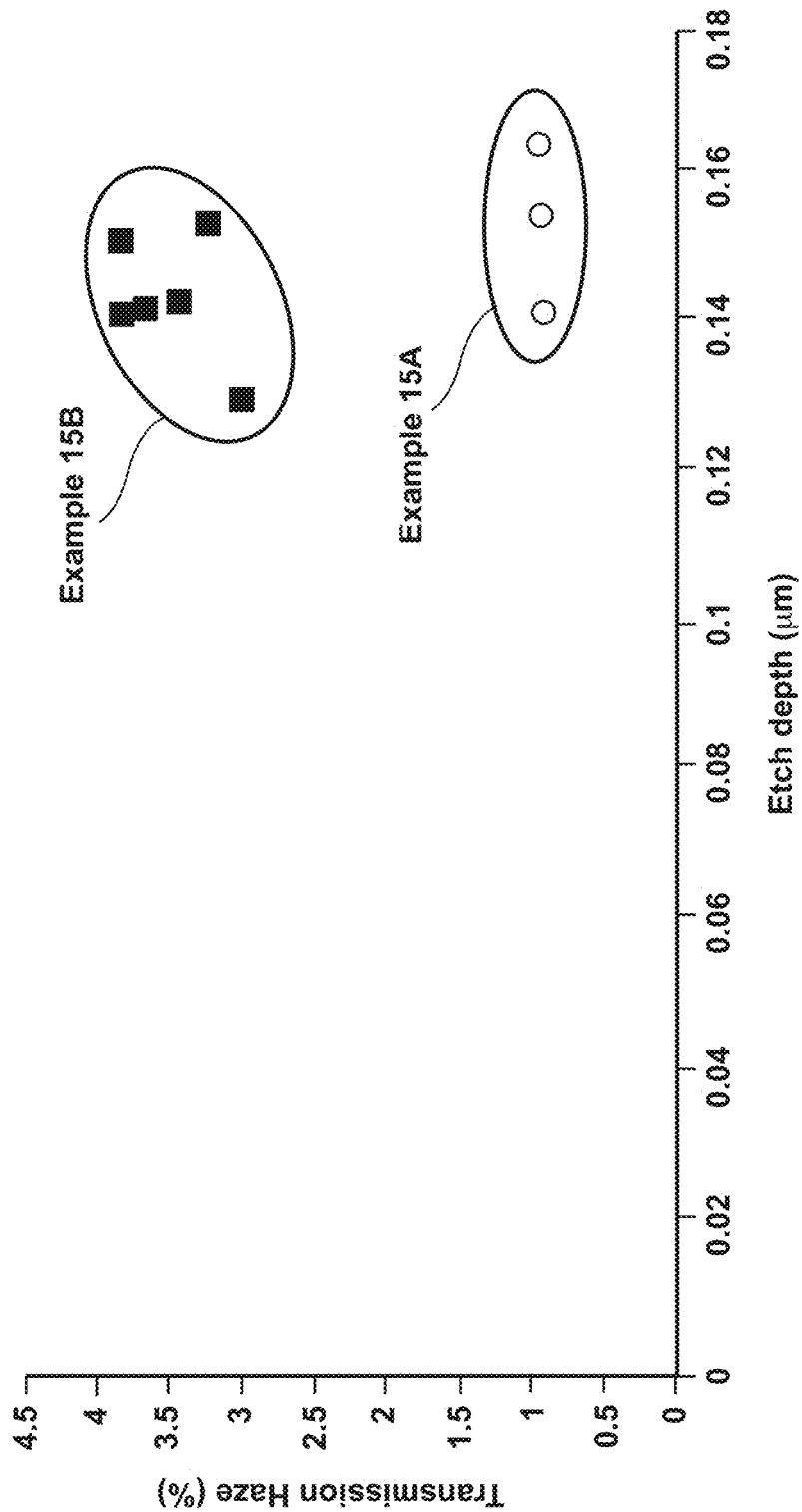
FIG. 19C, pertaining to Examples 15A-15B, is a graph illustrating that incorporating the secondary surface features over the entire textured region resulted in a higher transmission haze compared to substrates where the secondary surface features were incorporated only on the elliptical surface features.
Figure 19D:
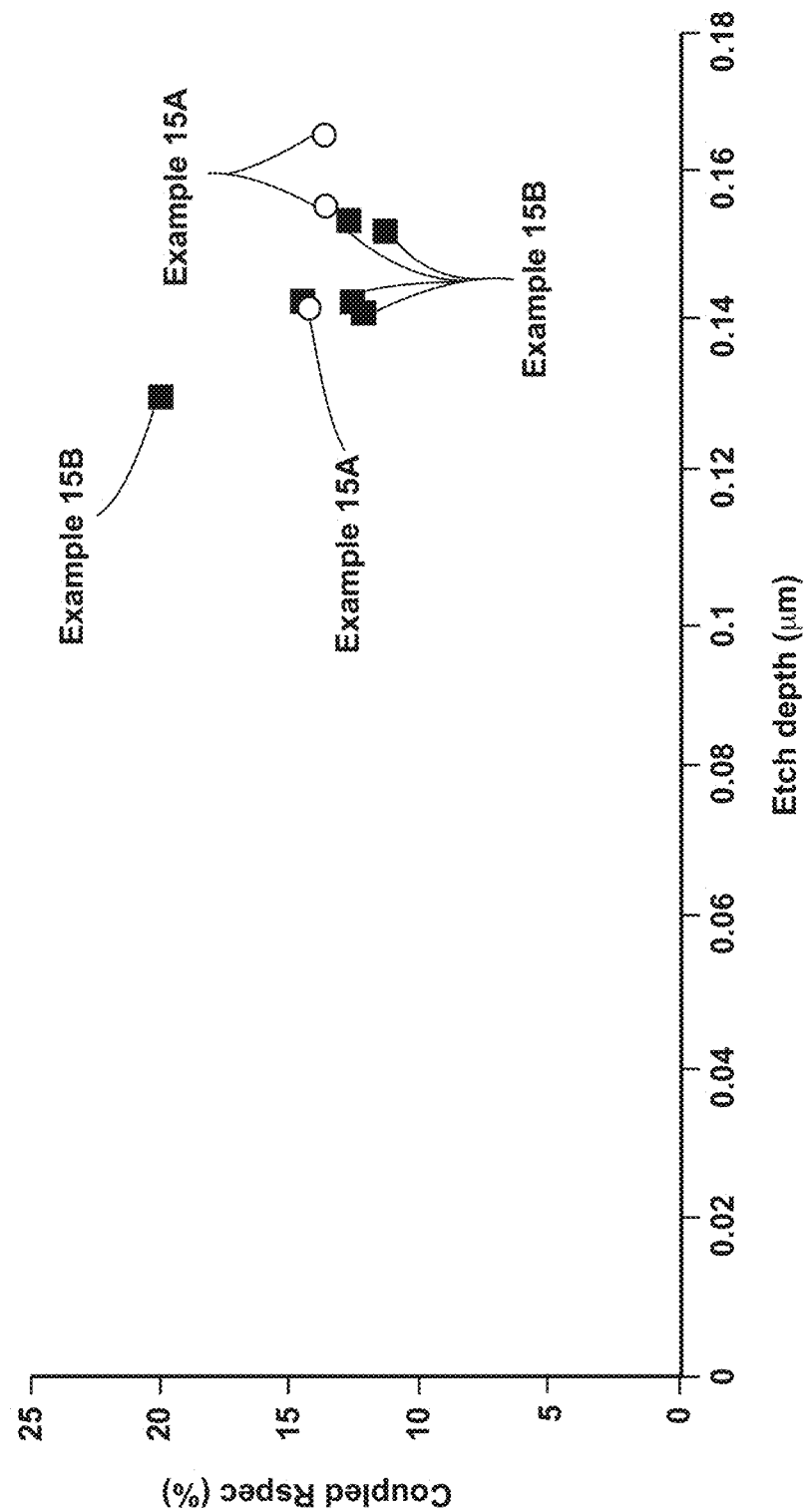
FIG. 19D, pertaining to Examples 15A-15B, is a graph illustrating that incorporating the secondary surface features over the entire textured region did not substantially affect specular reflectance compared to substrates where the secondary surface features were incorporated only on the elliptical surface features.

The pixel power deviation, transparency haze, and specular reflectance of samples from both Examples 15A and 15B were measured. A Rhopoint instrument was utilized to determine specular reflectance. The graphs reproduced at FIGS. 19B-19D set forth the measured data. Analysis of the graphs reveal that the samples of Example 15B, where the etching mask was removed before the second etching step to impart secondary surface features throughout the entire textured region, resulted in a lower pixel power deviation but higher transmission haze compared to the samples of Example 15A, where the etching mask was maintained during the second etching step and thus the secondary surface features were imparted only to the surfaces provided by the elliptical surface features.

Figure 19E:
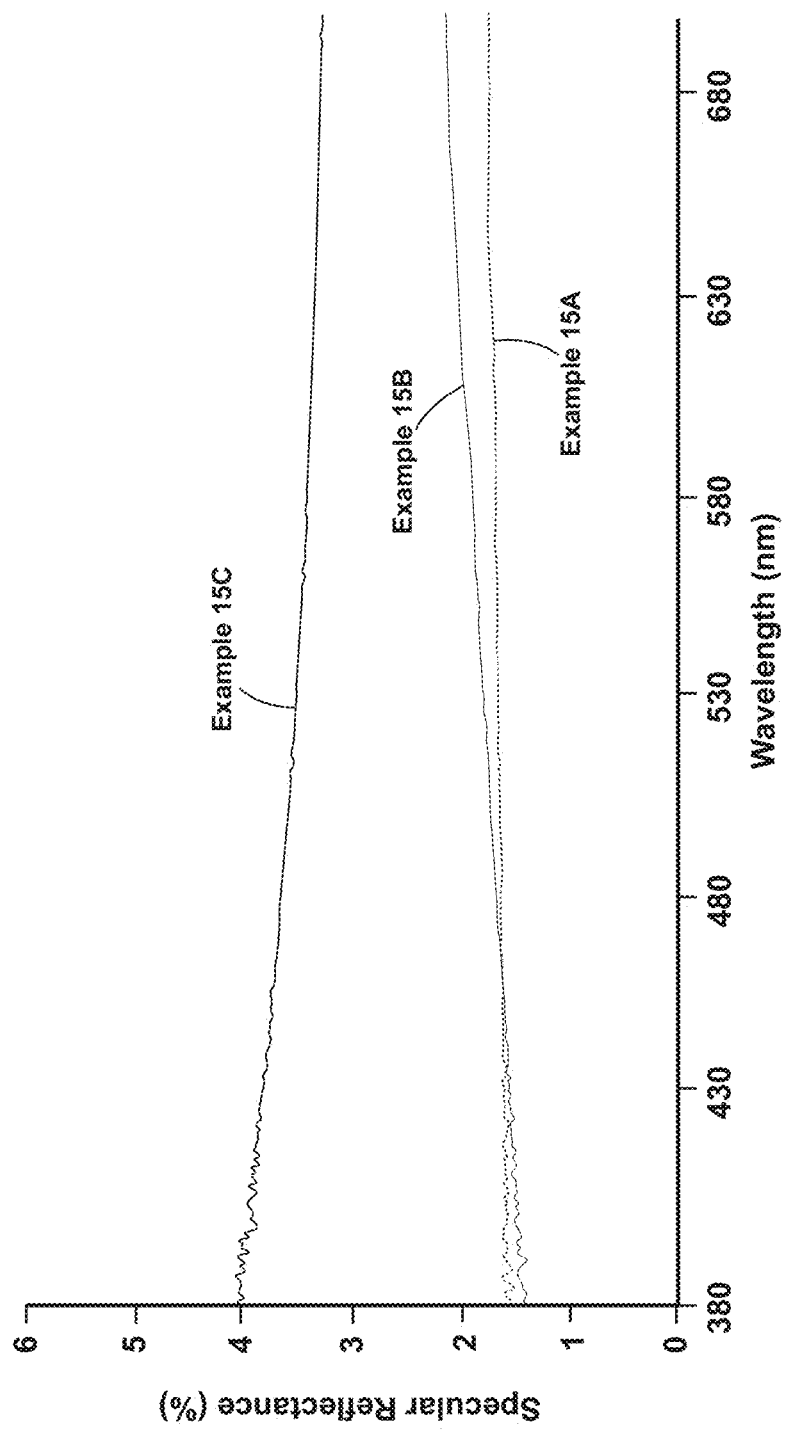
FIG. 19E, pertaining to Examples 15A-15B, is a graph illustrating that incorporating the secondary surface features over the entire textured region slightly affected specular reflectance compared to substrates where the secondary surface features were incorporated only on the elliptical surface features, and increasingly so as wavelength deviated from about 455 nm.

The Rhopoint instrument utilized to measure specular reflectance did not measure a difference between the samples of Examples 15A and 15B. However, the device could measure differences in specular reflectance when a 6 degree angle of incidence for the light to be reflected and a 2 degree aperture to measure the specular reflectance. The graph reproduced at FIG. 19E shows the measured data for samples of Examples 15A and 15B, as well as for a sample (Example 15C) where only the elliptical surface features were present and did not include the secondary surface features to impart surface roughness. Analysis of the graph of FIG. 19E reveals that the presence of the secondary surface features in Examples 15A and 15B reduced specular reflectance compared to when the secondary surface features were absent in Example 15C. The difference in specular reflectance between Examples 15A and 15B is wavelength dependent.

Figure 20A:
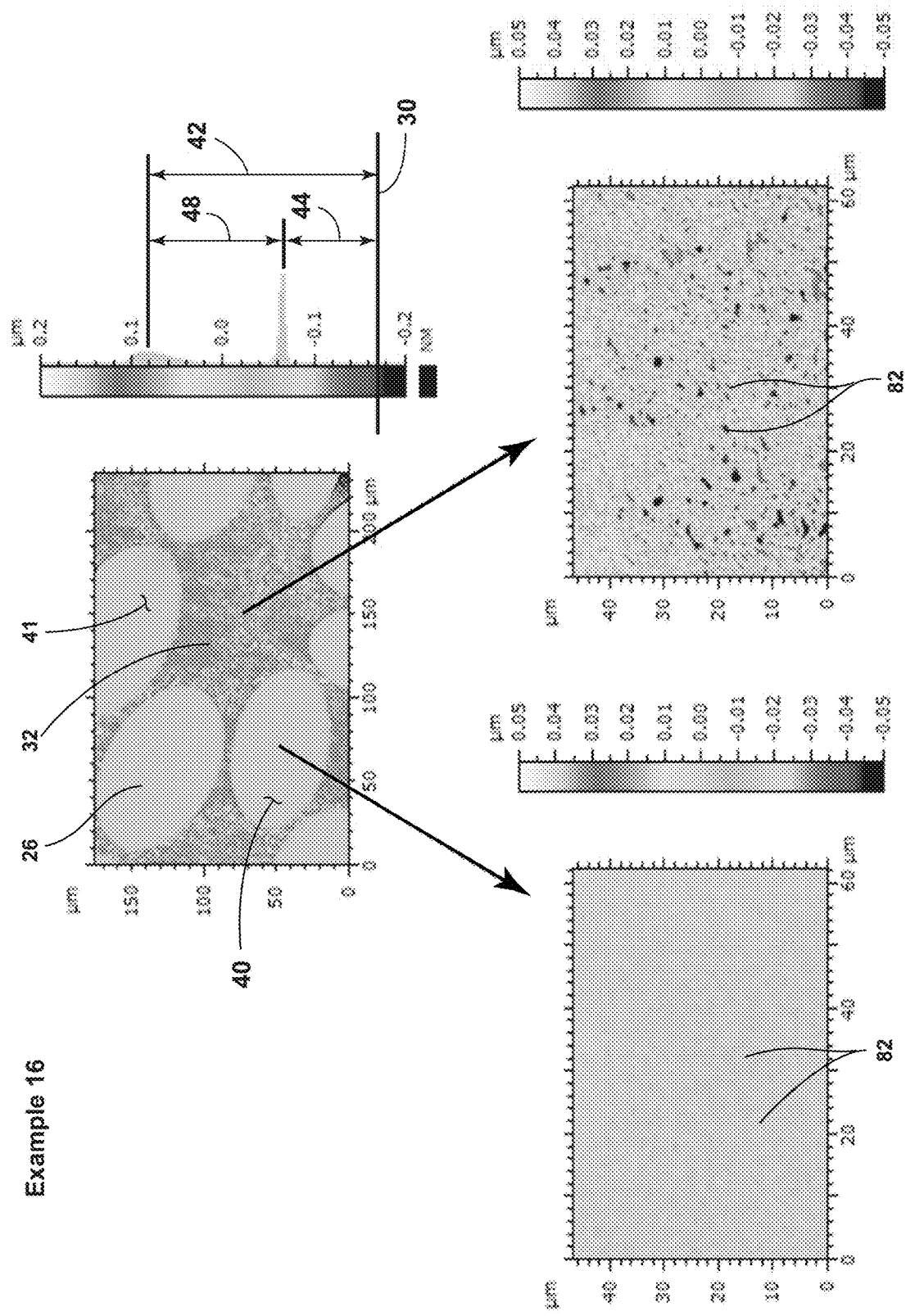
FIG. 20A, pertaining to Example 16, are white light interferometer graphs illustrating the topography of the elliptical surface features and the surrounding portion (top) and the secondary surface features (bottom) disposed at the elliptical surface features (left) and the surrounding portion (right)

Example 16—For Example 16, a sample was prepared similar to the samples Examples 14M-14O, where surface features with an elliptical perimeter are set into a surrounding portion in a first etching step forming textured region, and then secondary surface features are etched throughout the entire textured region to increase surface roughness. The sample so prepared was then analyzed with a white light interferometer to measure the three dimensional profile of the textured region. FIG. 20A illustrates the three dimensional profile that was measured. The top half illustrates relative elevation differences between elliptical surface features and the surrounding portion. The bottom half illustrates the topography of the secondary surface features, with the topography of the secondary surface features added to the surfaces that the elliptical surface features are provided illustrated at the left, and the topography of the secondary surface features added to the surrounding portion illustrated at the right. The three dimensional profile of the secondary features within the elliptical surface features is measurably different than the three dimensional profile of the secondary features at the surrounding portion—with the surrounding portion showing deeper secondary features.

Figure 20B:
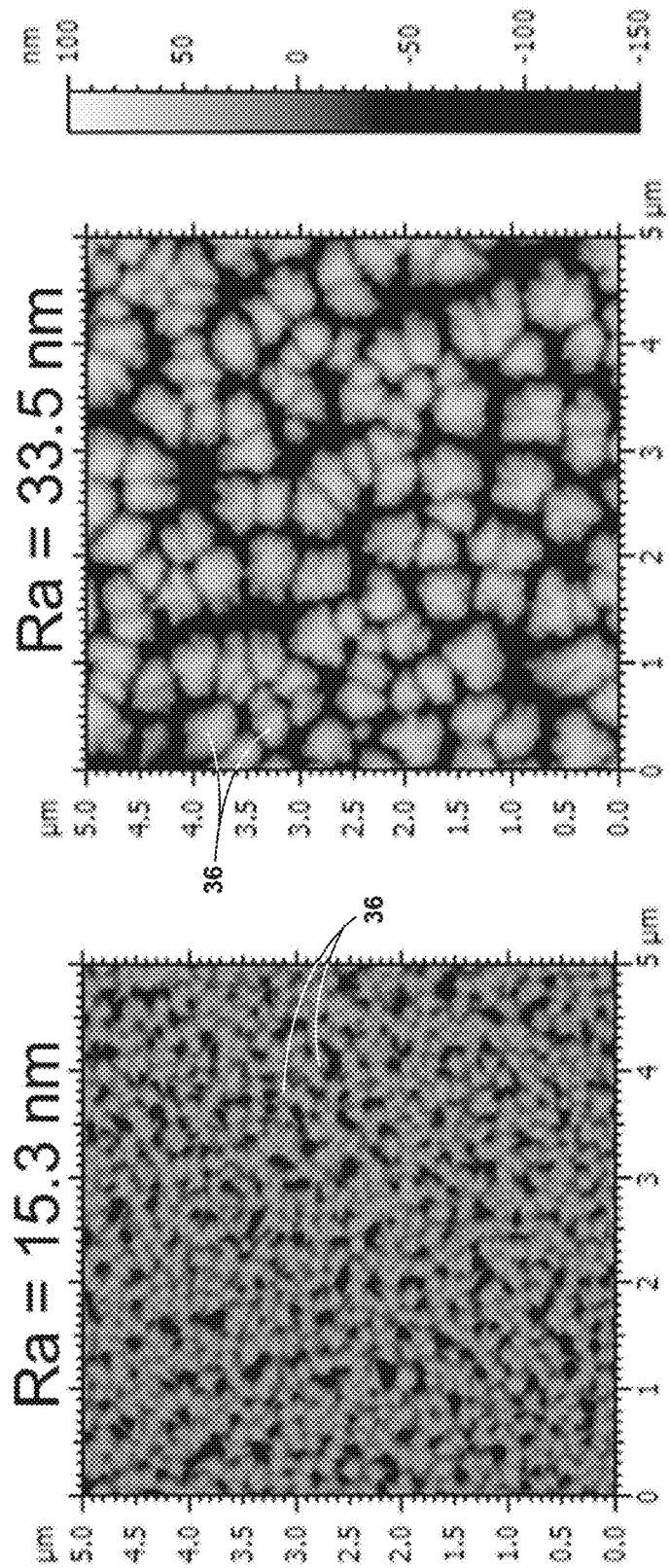
FIG. 20B, pertaining to Example 16, are atomic force microscopy images of the secondary surface features disposed at an elliptical surface feature (left) and the surrounding portion (right), illustrating that the secondary surface features at the surrounding portion imparted a higher surface roughness ($R_a$) than the at the elliptical surface feature (because the surrounding portion was not previously etched and thus more sensitive to the etching that imparted the secondary surface features).

An atomic force microscope was utilized to image and determine the surface roughness ($R_a$) imparted by the secondary surface features at both (i) a surface provided by an elliptical surface feature and (ii) at the surrounding portion. The images are reproduced at FIG. 20B. The image on the left is of the secondary surface features at the surface provided by the elliptical surface feature, and shows a surface roughness ($R_a$) of 15.3 nm. The image on the right is of the secondary surface features at the surrounding portion, and shows a surface roughness ($R_a$) of 33.5 nm. The image on the right and the higher surface roughness ($R_a$) value at the surrounding portion matches the topography data illustrated at FIG. 20A. The surrounding portion was covered by the etching mask during the formation of the elliptical surface features and thus had not been contacted with an etchant, unlike the elliptical surface features which were created by the first etching step. Thus, it is believed that the surrounding portion, previously untouched by an etchant, was more sensitive to the second etching step to impart the secondary surface features.

What is claimed is:

1. A substrate for a display article, the substrate comprising:
   a glass or glass-ceramic composition;
   a primary surface; and
   a textured region on at least a portion of the primary surface, the textured region comprising surface features, each of the surface features comprising a perimeter that is parallel to a base-plane extending through a thickness of the substrate below the textured region, wherein each of the surface features has a predetermined location relative to each other but collectively are arranged with so that no grouping of the surface features is arranged geometrically the same as any other grouping of the surface features.

2. The substrate of claim 1, wherein
   the textured region further comprises (i) one or more higher surfaces residing at a higher mean elevation from the base-plane and (ii) one or more lower surfaces residing at a lower mean elevation from the base-plane that is closer to the base-plane than the higher mean elevation.

3. The substrate of claim 2, wherein
   the textured region further comprises a surrounding portion, into which the surface features are set, or from which the surface features project;
   the surrounding portion provides either (i) the one or more higher surfaces or (ii) the one or more lower surfaces; and
   the surface features provide the other of (i) the one or more higher surfaces and (ii) the one or more lower surfaces, whichever the surrounding portion does not provide.

4. The substrate of claim 2, wherein
   the higher mean elevation differs from the lower mean elevation by a distance within a range of 0.05 µm to 0.70 µm.

5. The substrate of claim 1, wherein
   the perimeter of each of the surface features comprises a longest dimension parallel to the base-plane; and
   the longest dimensions of the perimeters of the surface features are not all parallel to each other.

6. The substrate of claim 5, wherein
   the longest dimension of the perimeter of each of the surface features is within a range of 5 µm to 150 µm.

7. The substrate of claim 1, wherein
   the surface features comprise a fill-fraction that is within a range of 40% to 60%.

8. The substrate of claim 1, wherein
   the surface features comprise larger surface features and smaller surface features;
   the perimeters of the larger surface features comprise a first range of longest dimensions parallel to the base-plane;
   the perimeters of the smaller surface features comprise a second range of longest dimensions parallel to the base-plane;
   the longest dimensions of the range of longest dimensions of the larger surface features are longer than the longest dimensions of the range of longest dimensions of the smaller surface features; and
   the first range and the second range are non-overlapping.

9. The substrate of claim 8, wherein
   the perimeters of the larger surface features totally surround the perimeters of some of the smaller surface features; and
   the perimeters of some the smaller surface features reside entirely outside of the perimeters.

10. The substrate of claim 8, wherein
    the perimeter of at least one of the smaller surface features partially overlaps with the perimeter of one of the larger surface features, such that (i) part of the perimeter of the smaller surface features is inside the perimeter of the larger surface feature and (ii) part of the perimeter of the smaller surface features is outside the perimeter of the larger surface feature.

11. The substrate of claim 8, wherein
    the textured region further comprises (i) one or more higher surfaces residing at a higher mean elevation from the base-plane, (ii) one or more lower surfaces residing at a lower mean elevation from the base-plane that is closer to the base-plane than the higher mean elevation, and (iii) a surrounding portion, into which the larger surface features are set, or from which the larger surface features project.

12. The substrate of claim 11, wherein
    the larger surface features project from the surrounding portion, some of the smaller surface features project from the surrounding portion, and the remaining smaller surface features, those that do not project from the surrounding portion, are set into the larger surface features;
    the larger surface features and smaller surface features that project from the surrounding portion provide the one or more higher surfaces residing at the higher mean elevation; and
    the surrounding portion and the smaller surface features that are set into larger surface features provide the one or more lower surfaces residing at the lower mean elevation.

13. The substrate of claim 11, wherein
    the larger surface features are set into the surrounding portion, some of the smaller surface features are set into the surrounding portion, and the remaining smaller surface features, those that are not set into the surrounding portion, project from the larger surface features;
    the larger surface features and the smaller surface features that are set into the surrounding portion provide the one or more lower surfaces residing at the lower mean elevation; and
    the surrounding portion and the smaller surface features that project from the larger surface features provide the one or more higher surfaces residing at the higher mean elevation.

14. The substrate of claim 8, wherein
the textured region further comprises (i) one or more higher surfaces residing at a higher mean elevation from the base-plane, (ii) one or more lower surfaces residing at a lower mean elevation from the base-plane that is closer to the base-plane than the higher mean elevation, (iii) one or more intermediate surfaces residing at one or two intermediate mean elevations from the base-plane, wherein the one or two intermediate mean elevations are disposed between the higher mean elevation and the lower mean elevation, and (iv) a surrounding portion, into which the larger surface features are set, or from which the larger surface features project.

15. The substrate of claim 14, wherein
the larger surface features provide at least a portion of the one or more higher surfaces residing at the higher mean elevation.

16. The substrate of claim 14, wherein
the larger surface features provide at least a portion of the one or more lower surfaces disposed at the lower mean elevation.

17. The substrate of claim 1, wherein
the textured region further comprises one or more sections comprising secondary surface features imparting a surface roughness ($R_a$) within a range of 5 nm to 100 nm.

18. The substrate of claim 1, wherein
the textured region exhibits a transmission haze within a range of 0.5% to 5.0%;
the textured region exhibits a pixel power deviation within a range of 1.0% to 3.0%;
the textured region exhibits a distinctness-of-image within a range of 5% to 70%;
the textured region exhibits a specular reflectance within a range of 4 GU to 40 GU; and
the textured region exhibits corrected color shifts $\Delta C_{x\_corrected}$ and $\Delta C_{y\_corrected}$ that are each respectively within a range of 0.03 to 0.6.

19. The substrate of claim 1, wherein
the substrate is a multi-component glass composition, and
the surface features have the multi-component glass composition.

20. A substrate for a display article, the substrate comprising:
a primary surface;
a base-plane extending through the substrate below the primary surface; and
a textured region at the primary surface, the textured region comprising (i) one or more higher surfaces residing at a higher mean elevation from the base-plane, (ii) one or more lower surfaces residing at a lower mean elevation from the base-plane, (iii) a first portion providing either the one or more higher surfaces or the one or more lower surfaces, and (iv) a second portion providing the other of the one or more higher surfaces and the one or more lower surfaces, whichever the first portion is not providing;
wherein, elliptical perimeters which lie in planes parallel to the base-plane, define the first portion except for overlapping portions of the elliptical perimeters, where the overlapping portions define in part the second portion.

21. The substrate of claim 20, wherein
in addition to the overlapping portions of the elliptical perimeters, the second portion of the textured region further comprises any part of the textured region that is not the first portion.

22. The substrate of claim 20, wherein
each of the elliptical perimeters comprises a longest dimension parallel to the base-plane; and
the longest dimensions of the elliptical perimeters are not all parallel with each other.

23. The substrate of claim 20, wherein
the higher mean elevation differs from the second elevation by a distance within a range of 0.02 μm to 0.70 μm.

24. The substrate of claim 20, wherein
the elliptical perimeters comprise larger elliptical perimeters and smaller elliptical perimeters, which are smaller than the larger elliptical perimeters; and
the first portion of the textured region is bounded by (i) the elliptical perimeters that do not overlap or intersect with the larger elliptical perimeters, (ii) portions of the smaller elliptical perimeters outside of the larger elliptical perimeters that partially overlap with the larger elliptical perimeters, and (iii) portions of the larger elliptical perimeters that do not overlap with the smaller elliptical perimeters.

25. The substrate of claim 24, wherein
at least some of the larger elliptical perimeters entirely encompass more than one of the smaller elliptical perimeters.

26. The substrate of claim 24, wherein
a fill-fraction of the larger elliptical perimeters is within a range of 40% to 60%; and
a fill-fraction of the smaller elliptical perimeters is within a range of 10% to 30%.

27. The substrate of claim 20, wherein
the textured region further comprises one or more sections comprising secondary surface features imparting a surface roughness ($R_a$) within a range of 5 nm to 100 nm.

28. The substrate of claim 20, wherein
the textured region exhibits a transmission haze within a range of 0.3% to 8.0%;
the textured region exhibits a pixel power deviation within a range of 0.7% to 3.5%;
the textured region exhibits a distinctness-of-image within a range of 25% to 100%;
the textured region exhibits a specular reflectance within a range of 5 GU to 30 GU; and
the textured region exhibits corrected color shifts $\Delta C_{x\_corrected}$ and $\Delta C_{y\_corrected}$ that are each respectively within a range of 0.00 to 0.50.

29. The substrate of claim 20, wherein
the substrate comprises a glass or glass-ceramic.

30. The substrate of claim 29, wherein
the substrate is a multi-component glass composition, and
the surface features have the multi-component glass composition.

31. A substrate for a display article, the substrate comprising:
a primary surface; and
a textured region on at least a portion of the primary surface, the textured region comprising surface features, each of the surface features comprising a perimeter that is parallel to a base-plane extending through a thickness of the substrate below the textured region, wherein each of the surface features has a predetermined location relative to each other but collectively are arranged so that no grouping of the surface features is arranged geometrically the same as any other grouping of the surface features, wherein, the perimeter of each of the surface features comprises a longest dimension parallel to the base-plane, and wherein, the longest dimensions of the perimeters of the surface features are not all parallel to each other.

* * * * *